United States Patent
Naito et al.

(10) Patent No.: US 7,928,452 B2
(45) Date of Patent: Apr. 19, 2011

(54) GAN-BASED SEMICONDUCTOR LIGHT-EMITTING ELEMENT, LIGHT-EMITTING ELEMENT ASSEMBLY, LIGHT-EMITTING APPARATUS, METHOD OF MANUFACTURING GAN-BASED SEMICONDUCTOR LIGHT-EMITTING ELEMENT, METHOD OF DRIVING GAN-BASED SEMICONDUCTOR LIGHT-EMITTING ELEMENT, AND IMAGE DISPLAY APPARATUS

(75) Inventors: Hiroki Naito, Kanagawa (JP); Hiroyuki Okuyama, Kanagawa (JP); Goshi Biwa, Kanagawa (JP); Ippei Nishinaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 216 days.

(21) Appl. No.: 12/402,160

(22) Filed: Mar. 11, 2009

(65) Prior Publication Data
US 2009/0230878 A1  Sep. 17, 2009

(30) Foreign Application Priority Data
Mar. 14, 2008 (JP) ................... 2008-066595

(51) Int. Cl.
*H01L 33/00* (2010.01)
(52) U.S. Cl. ........... 257/94; 257/E33.023; 257/E21.158; 438/47
(58) Field of Classification Search ............ 438/47; 257/79, 94, E33.023, E21.158
See application file for complete search history.

(56) References Cited

U.S. PATENT DOCUMENTS

| 2006/0249736 A1 * | 11/2006 | Lee et al. .................. 257/79 |
| 2009/0166606 A1 | 7/2009 | Lee |

FOREIGN PATENT DOCUMENTS

| JP | 09-129926 | 5/1997 |
| JP | 11-054796 | 2/1999 |
| JP | 2002-270971 | 9/2002 |
| JP | 2002-344015 | 11/2002 |
| JP | 2004-112002 | 4/2004 |
| JP | 2003-204078 | 7/2004 |
| JP | 2004-343147 | 12/2004 |
| JP | 2007-080996 | 3/2007 |

(Continued)

OTHER PUBLICATIONS

Japanese Office Action (JP 2008-066595) dated Dec. 22, 2009.

(Continued)

*Primary Examiner* — Davienne Monbleau
*Assistant Examiner* — Monica D Harrison
(74) *Attorney, Agent, or Firm* — K&L Gates LLP

(57) ABSTRACT

A GaN-based semiconductor light-emitting element includes a first GaN-based compound semiconductor layer of n-conductivity type, an active layer, a second GaN-based compound semiconductor layer of p-conductivity type, a first electrode electrically connected to the first GaN-based compound semiconductor layer, a second electrode electrically connected to the second GaN-based compound semiconductor layer, an impurity diffusion-preventing layer composed of an undoped GaN-based compound semiconductor, the impurity diffusion-preventing layer preventing a p-type impurity from diffusing into the active layer, and a laminated structure or a third GaN-based compound semiconductor layer of p-conductivity type. The impurity diffusion-preventing layer and the laminated structure or the third GaN-based compound semiconductor layer of p-conductivity type are disposed, between the active layer and the second GaN-based compound semiconductor layer, in that order from the active layer side.

35 Claims, 26 Drawing Sheets

FOREIGN PATENT DOCUMENTS

| | | |
|---|---|---|
| JP | 2008-526014 | 7/2008 |
| WO | 2006-068376 | 6/2006 |

OTHER PUBLICATIONS

Kumakura, K. et al., "Increased Electrical Activity of Mg-Acceptors in AlxGa1-xN/GaN Superlattices," Jpn. J. Appl. Phys., vol. 38, pp. L1012-L1014, 1999.

Kozodoy, P. et al., "Enhanced Mg Doping efficiency in Al0.2Ga0.8N/GaN superlattices," Applied Physics Letters, vol. 74, pp. 3681-3683, 1999.

Kozodoy, P. et al., "Polarization-enhanced Mg doping of AlGaN/GaN superlattices," Applied Physics Letters, vol. 75, pp. 2444-2446, 1999.

* cited by examiner

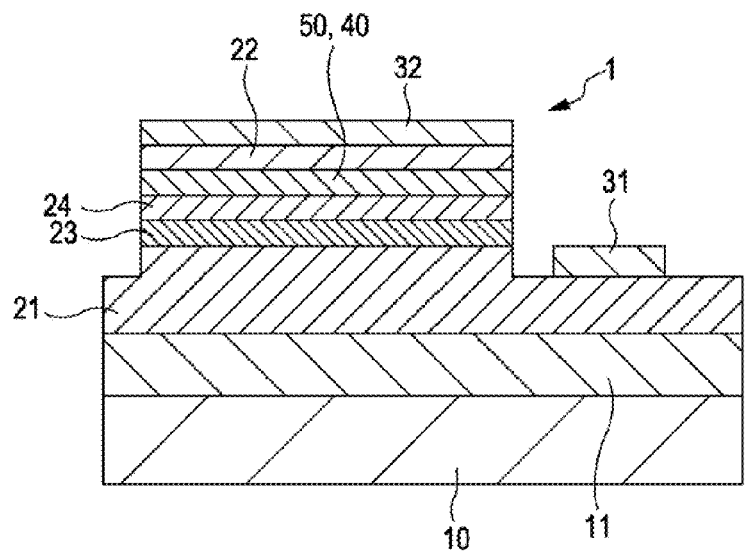

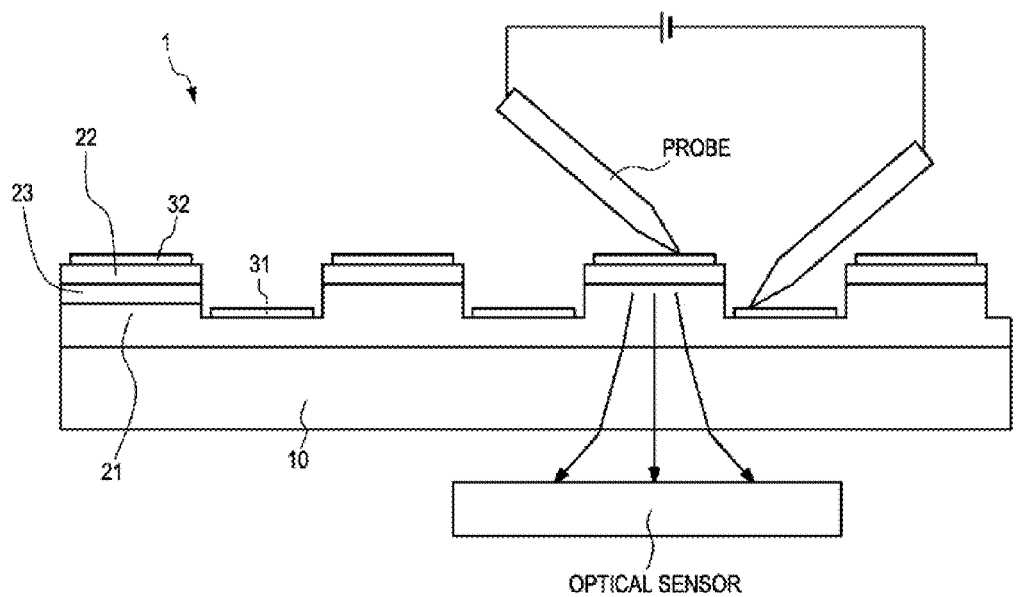

FIG. 3

| | | | |
|---|---|---|---|
| 22 | SECOND GaN-BASED COMPOUND SEMICONDUCTOR LAYER | | |
| 140 | LAMINATED STRUCTURE | UNDOPED GaN-BASED COMPOUND SEMICONDUCTOR LAYER | 153 |
| 141 | LAMINATE UNIT | | |
| 143 | UNDOPED GaN-BASED COMPOUND SEMICONDUCTOR LAYER | | |
| 143C | THIRD LAYER HAVING THE SAME COMPOSITION AS THAT OF GaN-BASED COMPOUND SEMICONDUCTOR LAYER 42 OF p-CONDUCTIVITY TYPE | THIRD LAYER HAVING THE SAME COMPOSITION AS THAT OF GaN-BASED COMPOUND SEMICONDUCTOR LAYER 150 OF p-CONDUCTIVITY TYPE | 153C |
| 143B | SECOND LAYER HAVING THE SAME COMPOSITION AS THAT OF GaN-BASED COMPOUND SEMICONDUCTOR LAYER 42 OF p-CONDUCTIVITY TYPE, FURTHER CONTAINING In | SECOND LAYER HAVING THE SAME COMPOSITION AS THAT OF GaN-BASED COMPOUND SEMICONDUCTOR LAYER 150 OF p-CONDUCTIVITY TYPE, FURTHER CONTAINING In | 153B |
| 143A | FIRST LAYER HAVING THE SAME COMPOSITION AS THAT OF GaN-BASED COMPOUND SEMICONDUCTOR LAYER 42 OF p-CONDUCTIVITY TYPE | FIRST LAYER HAVING THE SAME COMPOSITION AS THAT OF GaN-BASED COMPOUND SEMICONDUCTOR LAYER 150 OF p-CONDUCTIVITY TYPE | 153A |
| 42 | GaN-BASED COMPOUND SEMICONDUCTOR LAYER OF p-CONDUCTIVITY TYPE | THIRD GaN-BASED COMPOUND SEMICONDUCTOR LAYER | 150 |
| 143 | UNDOPED GaN-BASED COMPOUND SEMICONDUCTOR LAYER | UNDOPED GaN-BASED COMPOUND SEMICONDUCTOR LAYER | 153 |
| 143C | THIRD LAYER HAVING THE SAME COMPOSITION AS THAT OF GaN-BASED COMPOUND SEMICONDUCTOR LAYER 42 OF p-CONDUCTIVITY TYPE | THIRD LAYER HAVING THE SAME COMPOSITION AS THAT OF GaN-BASED COMPOUND SEMICONDUCTOR LAYER 150 OF p-CONDUCTIVITY TYPE | 153C |
| 143B | SECOND LAYER HAVING THE SAME COMPOSITION AS THAT OF GaN-BASED COMPOUND SEMICONDUCTOR LAYER 42 OF p-CONDUCTIVITY TYPE, FURTHER CONTAINING In | SECOND LAYER HAVING THE SAME COMPOSITION AS THAT OF GaN-BASED COMPOUND SEMICONDUCTOR LAYER 150 OF p-CONDUCTIVITY TYPE, FURTHER CONTAINING In | 153B |
| 143A | FIRST LAYER HAVING THE SAME COMPOSITION AS THAT OF GaN-BASED COMPOUND SEMICONDUCTOR LAYER 42 OF p-CONDUCTIVITY TYPE | FIRST LAYER HAVING THE SAME COMPOSITION AS THAT OF GaN-BASED COMPOUND SEMICONDUCTOR LAYER 150 OF p-CONDUCTIVITY TYPE | 153A |
| 42 | GaN-BASED COMPOUND SEMICONDUCTOR LAYER OF p-CONDUCTIVITY TYPE | THIRD GaN-BASED COMPOUND SEMICONDUCTOR LAYER | 150 |
| 24 | IMPURITY DIFFUSION-PREVENTING LAYER | | |
| 23 | ACTIVE LAYER | | |
| 21 | FIRST GaN-BASED COMPOUND SEMICONDUCTOR LAYER | | |

EMITTED LIGHT

LIGHT-EMITTING ELEMENT ASSEMBLY

GAN-BASED SEMICONDUCTOR LIGHT-EMITTING ELEMENT, LIGHT-EMITTING ELEMENT ASSEMBLY, LIGHT-EMITTING APPARATUS, METHOD OF MANUFACTURING GAN-BASED SEMICONDUCTOR LIGHT-EMITTING ELEMENT, METHOD OF DRIVING GAN-BASED SEMICONDUCTOR LIGHT-EMITTING ELEMENT, AND IMAGE DISPLAY APPARATUS

CROSS REFERENCES TO RELATED APPLICATIONS

The present application claims priority to Japanese Patent Application JP 2008-066595 filed in the Japanese Patent Office on Mar. 14, 2008, the entire contents of which are incorporated herein by reference.

BACKGROUND

The present application relates to a GaN-based semiconductor light-emitting element, a light-emitting element assembly and a light-emitting apparatus each having such a GaN-based semiconductor light-emitting element, a method of manufacturing such a GaN-based semiconductor light-emitting element according to an embodiment, a method of driving such a GaN-based semiconductor light-emitting element, and an image display apparatus having such a GaN-based semiconductor light-emitting element.

In a light-emitting element (GaN-based semiconductor light-emitting element) having an active layer composed of a gallium nitride (GaN)-based compound semiconductor, the band-gap energy can be controlled by changing the compound crystal composition or thickness of the active layer, and thus it is possible to realize a light emission wavelength in a wide range from ultraviolet to infrared. GaN-based semiconductor light-emitting elements emitting light of various colors have already been commercially available and used in a variety of applications, such as image display apparatuses, illumination apparatuses, testing apparatuses, and sterilizing light sources. Furthermore, blue-violet semiconductor lasers and light-emitting diodes (LEDs) have also been developed and used as writing/reading pickups of large-capacity optical disks.

In general, a GaN-based semiconductor light-emitting element has a structure in which a first GaN-based compound semiconductor layer of n-conductivity type, an active layer, and a second GaN-based compound semiconductor layer of p-conductivity type are sequentially stacked.

In the related art, for example, a second GaN-based compound semiconductor layer having a superlattice structure including a Mg-doped AlGaN layer and a Mg-doped GaN layer is formed above an active layer, the superlattice structure being subjected to uniform doping or modulation doping. Formation of such a second GaN-based compound semiconductor layer having a superlattice structure has been reported to have an effect of increasing the hole concentration (for example, refer to K. Kumakura and N. Kobayashi, Jpn. J. Appl. Phys. vol. 38 (1999) pp. L1012; P. Kozodoy et al., Appl. Phys. Lett. 75, 2444 (1999); and P. Kozodoy et al., Appl. Phys. Lett. 74, 3681 (1999)). In this technique, high hole concentrations are obtained two-dimensionally by the piezoelectric effect due to strain, and it has been reported that by optimizing the period of the superlattice structure, the same effect (i.e., decrease in series resistance) can also be obtained with respect to the conduction in the thickness direction of the second GaN-based compound semiconductor layer.

SUMMARY

However, in the superlattice structure described above, the effect of increasing the hole concentration in the active layer is not sufficient, and a technique for achieving higher light emission efficiency is strongly desired.

It is desirable to provide a GaN-based semiconductor light-emitting element having a structure capable of increasing light emission efficiency, a light-emitting element assembly and a light-emitting apparatus each having such a GaN-based semiconductor light-emitting element, a method of manufacturing such a GaN-based semiconductor light-emitting element according to an embodiment, a method of driving such a GaN-based semiconductor light-emitting element, and an image display apparatus having such a GaN-based semiconductor light-emitting element.

A GaN-based semiconductor light-emitting element according to a first embodiment or a second embodiment of the present application includes (A) a first GaN-based compound semiconductor layer of n-conductivity type, (B) an active layer, (C) a second GaN-based compound semiconductor layer of p-conductivity type, (D) a first electrode electrically connected to the first GaN-based compound semiconductor layer, and (E) a second electrode electrically connected to the second GaN-based compound semiconductor layer, and the GaN-based semiconductor light-emitting element includes, between the active layer and the second GaN-based compound semiconductor layer, disposed in that order from the active layer side, (F) an impurity diffusion-preventing layer composed of an undoped GaN-based compound semiconductor, the impurity diffusion-preventing layer preventing a p-type impurity from diffusing into the active layer, and, according to the first embodiment, (G) a laminated structure, or according to the second embodiment (G) a third GaN-based compound semiconductor layer of p-conductivity type.

In the GaN-based semiconductor light-emitting element according to the first embodiment, the laminated structure includes at least one laminate unit in which a GaN-based compound semiconductor layer of p-conductivity type and an undoped GaN-based compound semiconductor layer are stacked in that order from the active layer side.

In the GaN-based semiconductor light-emitting element according to the second embodiment, at least one undoped GaN-based compound semiconductor layer is disposed on a side, closer to the second GaN-based compound semiconductor layer, of the third GaN-based compound semiconductor layer.

A light-emitting element assembly according to a first embodiment includes the GaN-based semiconductor light-emitting element according to the first embodiment, the GaN-based semiconductor light-emitting element being disposed on a supporting member. Furthermore, a light-emitting element assembly according to a second embodiment includes the GaN-based semiconductor light-emitting element according to the second embodiment, the GaN-based semiconductor light-emitting element being disposed on a supporting member.

A light-emitting apparatus according to a first embodiment or a second embodiment includes (a) a GaN-based semiconductor light-emitting element and (b) a color conversion material which is excited by emitted light from the GaN-based semiconductor light-emitting element to emit light with a different wavelength from that of the emitted light. In the light-emitting apparatus according to the first embodiment, the GaN-based semiconductor light-emitting element is constituted by the GaN-based semiconductor light-emitting element according to the first embodiment, In the light-emitting apparatus according to the second embodiment, the GaN-based semiconductor light-emitting element is constituted by the GaN-based semiconductor light-emitting element according to the second embodiment.

An image display apparatus according to a first embodiment includes a GaN-based semiconductor light-emitting element for displaying an image, and the GaN-based semiconductor light-emitting element is constituted by the GaN-based semiconductor light-emitting element according to the first embodiment. Furthermore, an image display apparatus according to a second embodiment a GaN-based semiconductor light-emitting element for displaying an image, and the GaN-based semiconductor light-emitting element is constituted by the GaN-based semiconductor light-emitting element according to the second embodiment.

When the image display apparatus according to the first embodiment or the second embodiment is a color image display apparatus, the image display apparatus includes at least a first light-emitting element which emits blue light, a second light-emitting element which emits green light, and a third light-emitting element which emits red light. The GaN-based semiconductor light-emitting element according to the first embodiment or the second embodiment should constitute at least one (one type) of the first light-emitting element, the second light-emitting element, and the third light-emitting element.

In the GaN-based semiconductor light-emitting element according to the first embodiment, the GaN-based semiconductor light-emitting element in the light-emitting element assembly according to the first embodiment, the GaN-based semiconductor light-emitting element in the light-emitting apparatus according to the first embodiment, or the GaN-based semiconductor light-emitting element in the image display apparatus according to the first embodiment (hereinafter generically referred to as the "first GaN-based semiconductor light-emitting element"), the GaN-based compound semiconductor layer of p-conductivity type and the undoped GaN-based compound semiconductor layer constituting the laminate unit may have the same composition. Furthermore, in the GaN-based semiconductor light-emitting element according to the second embodiment, the GaN-based semiconductor light-emitting element in the light-emitting element assembly according to the second embodiment, the GaN-based semiconductor light-emitting element in the light-emitting apparatus according to the second embodiment, or the GaN-based semiconductor light-emitting element in the image display apparatus according to the second embodiment (hereinafter generically referred to as the "second GaN-based semiconductor light-emitting element"), the third GaN-based compound semiconductor layer of p-conductivity type and the undoped GaN-based compound semiconductor layer disposed on the third GaN-based compound semiconductor layer may have the same composition.

In the first GaN-based semiconductor light-emitting element, the undoped GaN-based compound semiconductor layer constituting the laminate unit may include a GaN-based compound semiconductor layer, the composition of which contains indium. Furthermore, in the second GaN-based semiconductor light-emitting element, the undoped GaN-based compound semiconductor layer disposed on the third GaN-based compound semiconductor layer may include a GaN-based compound semiconductor layer, the composition of which contains indium.

In the first GaN-based semiconductor light-emitting element, the undoped GaN-based compound semiconductor layer constituting the laminate unit may have a three-layer structure including a first layer having the same composition as the GaN-based compound semiconductor layer of p-conductivity type constituting the laminate unit, a second layer having the composition which is the same as the first layer and which further contains indium, and a third layer having the same composition as the first layer. In such a case, the undoped GaN-based compound semiconductor layer constituting the laminate unit may have a three-layer structure including the first layer composed of undoped GaN, the second layer composed of undoped $In_xGa_{(1-x)}N$ (wherein $0<x\leq0.3$), and the third layer composed of undoped GaN. Furthermore, the active layer may include an $In_yGa_{(1-y)}N$ layer, wherein $x\leq y$.

In the second GaN-based semiconductor light-emitting element, the undoped GaN-based compound semiconductor layer disposed on the third GaN-based compound semiconductor layer may have a three-layer structure including a first layer having the same composition as the third GaN-based compound semiconductor layer of p-conductivity type, a second layer having the composition which is the same as the first layer and which further contains indium, and a third layer having the same composition as the first layer. In such a case, the undoped GaN-based compound semiconductor layer disposed on the third GaN-based compound semiconductor layer may have a three-layer structure including the first layer composed of undoped GaN, the second layer composed of undoped $In_xGa_{(1-x)}N$ (wherein $0<x\leq0.3$), and the third layer composed of undoped GaN. Furthermore, the active layer may include an $In_yGa_{(1-y)}N$ layer, wherein $x\leq y$.

In each of the first GaN-based semiconductor light-emitting elements including the preferred embodiments and structures described above, preferably, the laminated structure includes one to ten laminate units. In each of the second GaN-based semiconductor light-emitting elements including the preferred embodiments and structures described above, preferably, one to ten undoped GaN-based compound semiconductor layers are disposed on the third GaN-based compound semiconductor layer.

In each of the first GaN-based semiconductor light-emitting elements including the preferred embodiments and structures described above, preferably, the GaN-based compound semiconductor layer of p-conductivity type constituting the laminate unit has a p-type impurity concentration of preferably $1 \times 10^{18}/cm^3$ to $4 \times 10^{20}/cm^3$, and more preferably $1 \times 10^{19}/cm^3$ to $2 \times 10^{20}/cm^3$. In each of the second GaN-based semiconductor light-emitting elements including the preferred embodiments and structures described above, the third GaN-based compound semiconductor layer has a p-type impurity concentration of preferably $1 \times 10^{18}/cm^3$ to $4 \times 10^{20}/cm^3$, and more preferably $1 \times 10^{19}/cm^3$ to $2 \times 10^{20}/cm^3$.

Furthermore, in each of the first GaN-based semiconductor light-emitting elements including the preferred embodiments and structures described above, the thickness of the GaN-based compound semiconductor layer of p-conductivity type constituting the laminate unit may be in the range of two-atomic-layer thickness to 50 nm, the thickness of the undoped GaN-based compound semiconductor layer constituting the laminate unit may be in the range of two-atomic-layer thickness to 50 nm, and the thickness of the laminated structure may be in the range of 5 nm to 200 nm. In each of the second GaN-based semiconductor light-emitting elements including the preferred embodiments and structures described above, the thickness of the undoped GaN-based compound semiconductor layer disposed on the third GaN-based compound semiconductor layer may be in the range of two-atomic-layer thickness to 50 nm, and the thickness of the third GaN-based compound semiconductor layer may be in the range of 5 nm to 200 nm.

Furthermore, in each of the first GaN-based semiconductor light-emitting elements or the second GaN-based semiconductor light-emitting elements including the preferred embodiments and structures described above (hereinafter may be generically referred to as the "GaN-based semiconductor light-emitting element or the like"), the density of a current applied to the active layer (operating current density) is preferably 50 amperes/cm$^2$ or more, more preferably 100 amperes/cm$^2$ or more, and still more preferably 200 amperes/cm$^2$ or more.

In the GaN-based semiconductor light-emitting element or the like including the preferred embodiments and structures described above, the area of the active layer is preferably $1\times10^{-12}$ m$^2$ to $1\times10^{-8}$ m$^2$, and more preferably $1\times10^{-11}$ m$^2$ to $1\times10^{-9}$ m$^2$.

In the GaN-based semiconductor light-emitting element or the like including the preferred embodiments and structures described above, the thickness of the GaN-based semiconductor light-emitting element is preferably $1\times10^{-7}$ m to $1\times10^{-5}$ m, and more preferably $1\times10^{-6}$ m to $1\times10^{-5}$ m.

There is provided a method of manufacturing a GaN-based semiconductor light-emitting element according to a first embodiment, the method being a method of manufacturing any of the GaN-based semiconductor light-emitting elements including the preferred embodiments or structures described above according to the first embodiment, in which the undoped GaN-based compound semiconductor layer constituting the laminate unit includes a GaN-based compound semiconductor layer, the composition of which contains indium, and the active layer includes a GaN-based compound semiconductor layer, the composition of which contains indium, the method including sequentially forming the first GaN-based compound semiconductor layer, the active layer, the impurity diffusion-preventing layer, the laminated structure, and the second GaN-based compound semiconductor layer, in which the GaN-based compound semiconductor layer, the composition of which contains indium, in the undoped GaN-based compound semiconductor layer constituting the laminate unit is formed at a higher temperature than the temperature at which the GaN-based compound semiconductor layer, the composition of which contains indium, in the active layer is formed.

There is provided a method of manufacturing a GaN-based semiconductor light-emitting element according to a second embodiment, the method being a method of manufacturing any of the GaN-based semiconductor light-emitting elements including the preferred embodiments or structures described above according to the second embodiment, in which the undoped GaN-based compound semiconductor layer disposed on the third GaN-based compound semiconductor layer includes a GaN-based compound semiconductor layer, the composition of which contains indium, and the active layer includes a GaN-based compound semiconductor layer, the composition of which contains indium, the method including sequentially forming the first GaN-based compound semiconductor layer, the active layer, the impurity diffusion-preventing layer, the third GaN-based compound semiconductor layer, and the second GaN-based compound semiconductor layer, in which the GaN-based compound semiconductor layer, the composition of which contains indium, in the undoped GaN-based compound semiconductor layer disposed on the third GaN-based compound semiconductor layer is formed at a higher temperature than the temperature at which the GaN-based compound semiconductor layer, the composition of which contains indium, in the active layer is formed.

There is provided a method of driving a GaN-based semiconductor light-emitting element according to a first embodiment, the method being a method of driving any of the GaN-based semiconductor light-emitting elements including the preferred embodiments or structures described above according to the first embodiment, the method including applying a current with a current density (operating current density) of 50 amperes/cm$^2$ or more, preferably 100 amperes/cm$^2$ or more, more preferably 200 amperes/cm$^2$ or more to the active layer.

There is provided a method of driving a GaN-based semiconductor light-emitting element according to a second embodiment, the method being a method of driving any of the GaN-based semiconductor light-emitting elements including the preferred embodiments or structures described above according to the second embodiment, the method including applying a current with a current density (operating current density) of 50 amperes/cm$^2$ or more, preferably 100 amperes/cm$^2$ or more, more preferably 200 amperes/cm$^2$ or more to the active layer.

Note that the operating current density of the GaN-based semiconductor light-emitting element is defined as the value obtained by dividing the operating current value by the area (area of junction region) of the active layer. That is, commercially available GaN-based semiconductor light-emitting elements have various package forms, and also the size of the GaN-based semiconductor light-emitting elements varies depending on the application or the amount of light. Furthermore, the standard driving current (operating current) varies depending on the size of the GaN-based semiconductor light-emitting elements. Thus, it is difficult to directly compare current dependency of properties between elements. In the present application, for generalization purposes, instead of the driving current value itself, the operating current density (unit of measure: ampere/cm$^2$), which is obtained by dividing the driving current value by the area (area of junction region) of the active layer, is expressed.

In each of the GaN-based semiconductor light-emitting element, the light-emitting element assembly, the light-emitting apparatus, the method of manufacturing the GaN-based semiconductor light-emitting element, the method of driving the GaN-based semiconductor light-emitting element, and the image display apparatus including the preferred embodiments or structures according to the first embodiment or the second embodiment, examples of the first GaN-based compound semiconductor layer, the second GaN-based compound, semiconductor layer, and the impurity diffusion-preventing layer include a GaN layer, an AlGaN layer, an InGaN layer, and an AlInGaN layer. Furthermore, as desired, these compound semiconductor layers may contain boron (B) atoms, thallium (Tl) atoms, arsenic (As) atoms, phosphors (P) atoms, and antimony (Sb) atoms. The active layer may have, for example, an InGaN/GaN single quantum well (QW) structure or an InGaN/GaN multiple quantum well (MQW) structure.

In the method of manufacturing the GaN-based semiconductor light-emitting element according to the first embodiment or the second embodiment, the first GaN-based compound semiconductor layer, etc. are sequentially formed on a light-emitting element-forming substrate. Examples of the light-emitting element-forming substrate that can be used include a sapphire substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and these substrates having an underlying layer or a buffer layer on the surface (principal surface) thereof. In the GaN-based semiconductor light-emitting element according to the first embodiment or the second embodiment, the GaN-based semiconductor light-emitting element in the light-emitting apparatus according to the first embodiment or the second embodiment, and the GaN-based semiconductor light-emitting element in the image display apparatus according to the first embodiment or the second embodiment, there are a case where the light-emitting element-forming substrate is allowed to remain and a case where the light-emitting element-forming substrate is removed finally. Note that in the latter case, the GaN-based semiconductor light-emitting element is provided on the supporting member.

Examples of the supporting member in the light-emitting element assembly according to the first embodiment or the second embodiment include, in addition to the examples of the light-emitting element-forming substrate described above, a glass substrate, a metal substrate, a metal sheet, an alloy substrate, an alloy sheet, a ceramic substrate, a ceramic sheet, a semiconductor substrate, a plastic substrate, a plastic sheet, and a plastic film. Examples of the plastic film include a polyethersulfone (PES) film, a polyethylene naphthalate (PEN) film, a polyimide (PI) film, and a polyethylene terephthalate (PET) film. Other examples of the supporting member include a glass substrate to which any of the various films described above is bonded, and a glass substrate having a polyimide resin layer, an acrylic resin layer, a polystyrene resin layer, or a silicone rubber layer thereon. Furthermore, the glass substrate may be replaced with a metal substrate or a plastic substrate. Alternatively, an insulating film may be formed on the surface of these substrates. Examples of the material constituting the insulating film include inorganic insulating materials, such as silicon oxide-based materials, silicon nitrides (SiN$_Y$), and metal oxide high dielectric insulating films; and organic insulating materials, such as polymethyl methacrylate (PMMA), polyvinylphenol (PVP), and polyvinyl alcohol (PVA). These materials may be used in combination. Examples of the silicon oxide-based materials include silicon oxides (SiO$_X$), silicon oxynitride (SiON), spin on glass (SOG), and low dielectric constant SiO$_X$-based materials (such as polyaryl ethers, cycloperfluorocarbon polymers, benzocyclobutene, cyclic fluorocarbon resins, polytetrafluoroethylene, fluorinated aryl ethers, fluorinated polyimides, amorphous carbon, and organic SOG). Examples of a method of forming the insulating film include PVD methods, CVD methods, a spin coating method, printing methods, coating methods, an immersion method, a casting method, and a spray method.

In the light-emitting apparatuses including the preferred embodiments or structures described above according to the first embodiment or the second embodiment (hereinafter may be generically referred to as the "light-emitting apparatus"), examples of emitted light from the GaN-based semiconductor light-emitting element include visible light, ultraviolet light, and a combination of visible light and ultraviolet light.

In the light-emitting apparatus, a structure may be employed in which the light emitted from the GaN-based semiconductor light-emitting element is blue light, and the light emitted from the color conversion material is at least one type of light selected from the group consisting of yellow light, green light, and red light, and a structure may be employed in which the light emitted from the GaN-based semiconductor light-emitting element and the light emitted from the color conversion material (e.g., yellow; red and green; yellow and red; or green, yellow, and red) are mixed to emit white light. Specific examples of the color conversion material which is excited by the blue light emitted from the GaN-based semiconductor light-emitting element to emit red light include red light-emitting fluorescent particles, and, more specifically, (ME:Eu)S [wherein ME represents at least one atom selected from the group consisting of Ca, Sr, and Ba; hereinafter the same], (M:Sm)$_x$(Si,Al)$_{12}$(O,N)$_{16}$ [wherein M represents at least one atom selected from the group consisting of Li, Mg, and Ca; hereinafter the same], ME$_2$Si$_5$N$_8$:Eu, (Ca:Eu)SiN$_2$, and (Ca:Eu)AlSiN$_3$. Specific examples of the color conversion material which is excited by the blue light emitted from the GaN-based semiconductor light-emitting element to emit green light include green light-emitting fluorescent particles, and, more specifically, (ME:Eu)Ga$_2$S$_4$, (M:RE)$_x$(Si,Al)$_{12}$(O,N)$_{16}$ [wherein RE represents Tb and Yb], (M:Tb)$_x$(Si,Al)$_{12}$(O,N)$_{16}$, (M:Yb)$_x$(Si,Al)$_{12}$(O,N)$_{16}$, and Si$_{6-Z}$Al$_Z$O$_Z$N$_{8-Z}$:Eu. Specific examples of the color conversion material which is excited by the blue light emitted from the GaN-based semiconductor light-emitting element to emit yellow light include yellow light-emitting fluorescent particles, and, more specifically, YAG (yttrium-aluminum-garnet)-based fluorescent particles. These color conversion materials may be used alone or as a mixture of two or more. When a mixture of two or more color conversion materials is used, light of a color other than yellow, green, and red can be emitted from the color conversion material mixture. Specifically, a structure may be employed in which cyan light is emitted. In such a case, a mixture of green light-emitting fluorescent particles (e.g., LaPO$_4$:Ce,Tb, BaMgAl$_{10}$O$_{17}$:Eu, Mn, Zn$_2$SiO$_4$:Mn, MgAl$_{11}$O$_{19}$:Ce,Tb, Y$_2$SiO$_5$:Ce,Tb, or MgAl$_{11}$O$_{19}$:CE,Tb,Mn) and blue light-emitting fluorescent particles (e.g., BaMgAl$_{10}$O$_{17}$:Eu, BaMg$_2$Al$_{16}$O$_{27}$:Eu, Sr$_2$P$_2$O$_7$:Eu, Sr$_5$(PO$_4$)$_3$Cl:Eu, (Sr,Ca,Ba,Mg)$_5$(PO$_4$)$_3$Cl:Eu, or CaWO$_4$, CaWO$_4$:Pb) may be used.

Furthermore, specific examples of the color conversion material which is excited by the ultraviolet light emitted from the GaN-based semiconductor light-emitting element to emit red light include red light-emitting fluorescent particles, and, more specifically, Y$_2$O$_3$:Eu, YVO$_4$:Eu, Y(P,V)O$_4$:Eu, 3.5MgO.0.5MgF$_2$.Ge$_2$:Mn, CaSiO$_3$:Pb,Mn, Mg$_6$AsO$_{11}$:Mn, (Sr,Mg)$_3$(PO$_4$)$_3$:Sn, La$_2$O$_2$S:Eu, and Y$_2$O$_2$S:Eu. Specific examples of the color conversion material which is excited by the ultraviolet light emitted from the GaN-based semiconductor light-emitting element to emit green light include green light-emitting fluorescent particles, and, more specifically, LaPO$_4$:Ce,Tb, BaMgAl$_{10}$O$_{17}$:Eu,Mn, Zn$_2$SiO$_4$:Mn, MgAl$_{11}$O$_{19}$:Ce,Tb, Y$_2$SiO$_5$:Ce,Tb, MgAl$_{11}$O$_{19}$:CE,Tb,Mn, and Si$_{6-Z}$Al$_Z$O$_Z$N$_{8-Z}$:Eu. Specific examples of the color conversion material which is excited by the ultraviolet light emitted from the GaN-based semiconductor light-emitting element to emit blue light include blue light-emitting fluorescent particles, and, more specifically, BaMgAl$_{10}$O$_{17}$:Eu, BaMg$_2$Al$_{16}$O$_{27}$:Eu, Sr$_2$P$_2$O$_7$:Eu, Sr$_5$(PO$_4$)$_3$Cl:Eu, (Sr,Ca,Ba,Mg)$_5$(PO$_4$)$_3$Cl:Eu, CaWO$_4$, and CaWO$_4$:Pb. Specific examples of the color conversion material which is excited by the ultraviolet light emitted from the GaN-based semiconductor light-emitting element to emit yellow light include yellow light-emitting fluorescent particles, and, more specifically, YAG-based fluorescent particles. These color conversion materials may be used alone or as a mixture of two or more. When a mixture of two or more color conversion materials is used, light of a color other than yellow, green, and red can be emitted from the color conversion material mixture. Specifically, a structure may be employed in which cyan light is emitted. In such a case, a mixture of green light-emitting fluorescent particles and blue light-emitting fluorescent particles may be used.

The color conversion material is not limited to fluorescent particles. Other examples of the color conversion material include luminescent particles composed of an indirect transition-type silicon material having a quantum well structure, such as a two-dimensional quantum well structure, a one-dimensional quantum well structure (quantum wire), or a zero-dimensional quantum well structure (quantum dot), in which the carrier wave function is localized so that carriers can be efficiently converted into light as in the direct transition-type material, thus using a quantum effect. It has been reported that rare earth atoms added to a semiconductor material sharply emit light by intra-shell transition, and luminescent particles using such a technique can also be used.

Examples of the image display apparatuses including the preferred embodiments and structures described above according to the first embodiment or the second embodiment (hereinafter may be generically referred to as the "image display apparatus") include image display apparatuses having the structures described below. Unless otherwise specified, the number of GaN-based semiconductor light-emitting elements constituting an image display apparatus or a light-emitting element panel may be determined on the basis of the specifications of the image display apparatus. Furthermore, a light valve may be further provided on the basis of the specifications of the image display apparatus.

(1) Image Display Apparatus Having a First Structure

A passive matrix-type or active matrix-type, direct-view-type image display apparatus including ($\alpha$) a light-emitting element panel having GaN-based semiconductor light-emitting elements arranged in a two-dimensional matrix, in which the emission state of each of the GaN-based semiconductor light-emitting elements is directly visually observed by controlling the emission/non-emission state of each GaN-based semiconductor light-emitting element to display an image.

(2) Image Display Apparatus Having a Second Structure

A passive matrix-type or active matrix-type, projection-type image display apparatus including ($\alpha$) a light-emitting element panel having GaN-based semiconductor light-emitting elements arranged in a two-dimensional matrix, in which the emission/non-emission state of each GaN-based semiconductor light-emitting element is controlled to display an image by projection on a screen.

(3) Image Display Apparatus Having a Third Structure

A color image display apparatus (direct-view-type or projection-type) including ($\alpha$) a red light-emitting element panel having red light-emitting semiconductor light-emitting elements (e.g., AlGaInP-based semiconductor light-emitting elements or GaN-based semiconductor light-emitting elements; hereinafter the same) arranged in a two-dimensional matrix; ($\beta$) a green light-emitting element panel having green light-emitting GaN-based semiconductor light-emitting elements arranged in a two-dimensional matrix; ($\gamma$) a blue light-emitting element panel having blue light-emitting GaN-based semiconductor light-emitting elements arranged in a two-dimensional matrix; and ($\delta$) a device which collects the light emitted from the red light-emitting element panel, the green light-emitting element panel, and the blue light-emitting element panel in an optical path (e.g., a dichroic prism; hereinafter the same), in which the emission/non-emission state of each of the red light-emitting semiconductor light-emitting elements, the green light-emitting GaN-based semiconductor light-emitting elements, and the blue light-emitting GaN-based semiconductor light-emitting elements is controlled.

(4) Image Display Apparatus Having a Fourth Structure

An image display apparatus (direct-view-type or projection-type) including ($\alpha$) a GaN-based semiconductor light-emitting element and ($\beta$) a light transmission controller [e.g., a liquid crystal display device, a digital micromirror device (DMD), or a liquid crystal on silicon (LCOS) device; hereinafter the same] which is a light valve for controlling transmission/non-transmission of light emitted from the GaN-based semiconductor light-emitting element, in which transmission/non-transmission of light emitted from the GaN-based semiconductor light-emitting element is controlled by the light transmission controller to display an image. The number of GaN-based semiconductor light-emitting elements may be determined on the basis of the specifications of the image display apparatus, and may be one or two or more. Furthermore, examples of a device (light-guiding member) that guides light emitted from the GaN-based semiconductor light-emitting element to the light transmission controller include an optical guide member, a microlens array, a mirror, a reflector plate, and a condensing lens.

(5) Image Display Apparatus Having a Fifth Structure

An image display apparatus (direct-view-type or projection-type) including ($\alpha$) a light-emitting element panel having GaN-based semiconductor light-emitting elements arranged in a two-dimensional matrix and ($\beta$) a light transmission controller (light valve) which controls transmission/non-transmission of light emitted from the GaN-based semiconductor light-emitting elements, in which transmission/non-transmission of light emitted from the GaN-based semiconductor light-emitting elements is controlled by the light transmission controller to display an image.

(6) Image Display Apparatus Having a Sixth Structure

A color image display apparatus (direct-view-type or projection-type) including ($\alpha$) a red light-emitting element panel having red light-emitting semiconductor light-emitting elements arranged in a two-dimensional matrix, and a red light transmission controller (light valve) which controls transmission/non-transmission of light emitted from the red light-emitting element panel; ($\beta$) a green light-emitting element panel having green light-emitting GaN-based semiconductor light-emitting elements arranged in a two-dimensional matrix, and a green light transmission controller (light valve) which controls transmission/non-transmission of light emitted from the green light-emitting element panel; ($\gamma$) a blue light-emitting element panel having blue light-emitting GaN-based semiconductor light-emitting elements arranged in a two-dimensional matrix, and a blue light transmission controller (light valve) which controls transmission/non-transmission of light emitted from the blue light-emitting element panel; and ($\delta$) a device which collects the light transmitted through the red light transmission controller, the green light transmission controller, and the blue light transmission controller in an optical path, in which the transmission/non-transmission of light emitted from each of the light-emitting element panels is controlled by the corresponding light transmission controller to display an image.

(7) Image Display Apparatus Having a Seventh Structure

A field-sequential color image display apparatus (direct-view-type or projection-type) including ($\alpha$) a red light-emitting semiconductor light-emitting element; ($\beta$) a green light-emitting GaN-based semiconductor light-emitting element; ($\gamma$) a blue light-emitting GaN-based semiconductor light-emitting element; ($\delta$) a device which collects the light emitted from the red light-emitting semiconductor light-emitting element, the green light-emitting GaN-based semiconductor light-emitting element, and the blue light-emitting GaN-based semiconductor light-emitting element in an optical path; and ($\in$) a light transmission controller (light valve) which controls transmission/non-transmission of light emitted from the device which collects the light in the optical path, in which the transmission/non-transmission of light emitted from each of the light-emitting elements is controlled by the light transmission controller to display an image.

(8) Image Display Apparatus Having an Eighth Structure

A field-sequential color image display apparatus (direct-view-type or projection-type) including (α) a red light-emitting element panel having red light-emitting semiconductor light-emitting elements arranged in a two-dimensional matrix; (β) a green light-emitting element panel having green light-emitting GaN-based semiconductor light-emitting elements arranged in a two-dimensional matrix; (γ) a blue light-emitting element panel having blue light-emitting GaN-based semiconductor light-emitting elements arranged in a two-dimensional matrix; (δ) a device which collects the light emitted from the red light-emitting element panel, the green light-emitting element panel, and the blue light-emitting element panel in an optical path; and (∈) a light transmission controller (light valve) which controls transmission/non-transmission of light emitted from the device which collects the light in the optical path, in which the transmission/non-transmission of light emitted from each of the light-emitting element panels is controlled by the light transmission controller to display an image.

(9) Image Display Apparatus Having a Ninth Structure

A passive matrix-type or active matrix-type, direct-view-type color image display apparatus including a first light-emitting element, a second light-emitting element, and a third light-emitting element, in which the emission state of each of the light-emitting elements is directly visually observed by controlling the emission/non-emission state of each light-emitting element to display an image.

(10) Image Display Apparatus Having a Tenth Structure

A passive matrix-type or active matrix-type, projection-type color image display apparatus including a first light-emitting element, a second light-emitting element, and a third light-emitting element, in which the emission/non-emission state of each light-emitting element is controlled to display an image by projection on a screen.

(11) Image Display Apparatus Having an Eleventh Structure

A field-sequential color image display apparatus (direct-view-type or projection-type) including light-emitting element units arranged in a two-dimensional matrix, and a light transmission controller (light valve) which controls transmission/non-transmission of light emitted from the light-emitting element units, in which the emission/non-emission state of each of a first light-emitting element, a second light-emitting element, and a third light-emitting element in each light-emitting element unit is controlled by time sharing, and the transmission/non-transmission of light emitted from the first light-emitting element, the second light-emitting element, and the third light-emitting element is controlled by the light transmission controller to display an image.

In the method of manufacturing the GaN-based semiconductor light-emitting element according to the first embodiment or the second embodiment, preferably, the relationship $T_{MAX} < 1,350 - 0.75\lambda$ is satisfied, and more preferably, the relationship $T_{MAX} < 1,250 - 0.75\lambda$ is satisfied in order to prevent the occurrence of thermal damage to the active layer, wherein $T_{MAX}$ (° C.) is the maximum growth temperature in the crystal growth of each of the undoped GaN-based compound semiconductor layers in the laminate unit or on and in the third GaN-based compound semiconductor layer, and λ is the light emission wavelength of the active layer. Examples of the method for forming the various layers composed of a GaN-based compound include metal-organic chemical vapor deposition (MOCVD), MBE, and hydride vapor deposition in which a halogen contributes to transportation or reaction.

In MOCVD, as the organogallium source gas, trimethylgallium (TMG) gas or triethylgallium (TEG) gas may be used, and as the nitrogen source gas, ammonia gas or hydrazine gas may be used. In the formation of a GaN-based compound semiconductor layer of n-conductivity type, for example, silicon (Si) may be added as an n-type impurity (n-type dopant). In the formation of a GaN-based compound semiconductor layer of p-conductivity type, for example, magnesium (Mg) may be added as a p-type impurity (p-type dopant). Furthermore, when the GaN-based compound semiconductor layer includes aluminum (Al) or indium (In) as a constituent atom, trimethylaluminum (TMA) gas may be used as an Al source and trimethylindium (TMI) gas may be used as an In source. Furthermore, monosilane gas ($SiH_4$ gas) may be used as an Si source, and cyclopentadienylmagnesium gas, methylcyclopentadienylmagnesium, or bis(cyclopentadienyl)magnesium ($Cp_2Mg$) may be used as a Mg source. Furthermore, besides Si, examples of the n-type impurity (n-type dopant) include Ge, Se, Sn, C, and Ti. Besides Mg, examples of the p-type impurity (p-type dopant) include Zn, Cd, Be, Ca, Ba, and O.

The second electrode electrically connected to the second GaN-based compound semiconductor layer of p-conductivity type (or the second electrode disposed on the contact layer) preferably has a single-layer structure or a multilayer structure including at least one metal selected from the group consisting of palladium (Pd), platinum (Pt), nickel (Ni), aluminum (Al), titanium (Ti), gold (Au), and silver (Ag). Alternatively, a transparent conductive material such as indium tin oxide (ITO) may be used. In particular, silver (Ag), Ag/Ni, or Ag/Ni/Pt that can reflect light with high efficiency is preferably used. On the other hand, the first electrode electrically connected to the first GaN-based compound semiconductor layer of n-conductivity type preferably has a single-layer structure or a multilayer structure including at least one metal selected from the group consisting of gold (Au), silver (Ag), palladium (Pd), aluminum (Al), titanium (Ti), tungsten (W), copper (Cu), zinc (Zn), tin (Sn), and indium (In). Examples thereof include Ti/Au, Ti/Al, and Ti/Pt/Au. The first electrode and the second electrode may be formed by physical vapor deposition (PVD), such as vacuum deposition or sputtering. The first electrode is electrically connected to the first GaN-based compound semiconductor layer, and the first electrode may be disposed on the first GaN-based compound semiconductor layer or may be connected to the first GaN-based compound semiconductor layer via a conductive material layer. Similarly, the second electrode is electrically connected to the second GaN-based compound semiconductor layer, and the second electrode may be disposed on the second GaN-based compound semiconductor layer or may be connected to the second GaN-based compound semiconductor layer via a conductive material layer.

A pad electrode may be provided on each of the first electrode and the second electrode in order to achieve electrical connection to an external electrode or circuit. The pad electrode preferably has a single-layer structure or a multilayer structure including at least one metal selected from the group consisting of titanium (Ti), aluminum (Al), platinum (Pt), gold (Au), and nickel (Ni). The pad electrode may have a multilayer structure, such as Ti/Pt/Au or Ti/Au.

The quantity of light emission (luminance) of the GaN-based semiconductor light-emitting element can be controlled by controlling the pulse width of the driving current, the pulse density of the driving current, or by combination of both, and in addition to this, by the peak current value of the driving current. The reason for this is that a change in the peak current value of the driving current only slightly affects the light emission wavelength of the GaN-based semiconductor light-emitting element.

Specifically, an example will be described in which, in a GaN-based semiconductor light-emitting element, $I_0$ represents the peak current value of the driving current for a certain light emission wavelength $\lambda_0$, $P_0$ represents the pulse width of the driving current, and $T_{OP}$ represents one-operation period of the GaN-based semiconductor light-emitting element or the like or one-operation period in the method of driving the GaN-based semiconductor light-emitting element according to the first embodiment or the second embodiment. In such a case, (1) by controlling (adjusting) the peak current value $I_0$ of the driving current, the quantity of light emission (luminance) from the GaN-based semiconductor light-emitting element can be controlled; and (2) by controlling the pulse width $P_0$ of the driving current (pulse width control of driving current), the quantity of light emission (brightness or luminance) from the a GaN-based semiconductor light-emitting element can be controlled; and/or (3) by controlling the number of pulses (pulse density) with the pulse width $P_0$ in the one-operation period $T_{OP}$ of the GaN-based semiconductor light-emitting element (pulse density control of driving current), the quantity of light emission (brightness or luminance) from the GaN-based semiconductor light-emitting element can be controlled.

The above-described control of the quantity of light emission from the GaN-based semiconductor light-emitting element can be achieved by a driving circuit for the GaN-based semiconductor light-emitting element, the driving circuit including (a) a pulsed driving current supply unit which supplies pulsed driving current to the GaN-based semiconductor light-emitting element, (b) a pulsed driving current setting unit which sets the pulse width and pulse density of the driving current, and (c) a unit which sets the peak current value.

In each of the GaN-based semiconductor light-emitting element, the light-emitting element assembly, the light-emitting apparatus, the method of manufacturing the GaN-based semiconductor light-emitting element, the method of driving the GaN-based semiconductor light-emitting element, and the image display apparatus including the preferred embodiments or structures according to the first embodiment or the second embodiment, the GaN-based semiconductor light-emitting element may have a face-up structure (i.e., a structure in which light generated by the active layer is emitted from the second GaN-based compound semiconductor layer) or a flip-chip structure (i.e., a structure in which light generated by the active layer is emitted from the first GaN-based compound semiconductor layer). Furthermore, the GaN-based semiconductor light-emitting element may be designed to be, for example, a shell-shaped element or a surface-mount-type element.

Specific examples of the GaN-based semiconductor light-emitting element include a light-emitting diode (LED) and a semiconductor laser (LD). The structure and configuration of the GaN-based semiconductor light-emitting element are not particularly limited as long as the multilayer structure thereof has a light-emitting diode structure or a laser structure. Furthermore, besides the above-described light-emitting apparatuses including GaN-based semiconductor light-emitting elements and color conversion materials and image display apparatuses (direct-view-type or projection-type), the GaN-based semiconductor light-emitting element according to the first embodiment or the second embodiment can be applied to planar light-source devices (backlights); liquid crystal display device assemblies including color liquid crystal display device assemblies; light sources for variable color illumination; displays; lamp fittings and lights in vehicles, such as automobiles, electric trains, ships, and aircrafts (e.g., headlights, taillights, high mounted stop lights, small lights, turn signal lamps, fog lights, interior lamps, meter-panel lights, light sources provided in various buttons, destination lamps, emergency lights, and emergency exit guide lights); various lamp fittings and lights in buildings (e.g., outdoor lights, interior lights, lighting equipment, emergency lights, and emergency exit guide lights); street lights; various indicating lamp fittings of traffic signals, advertising displays, machines, and apparatuses; lightings and lighting parts in tunnels, underground passages, and the like; special illuminations in various testing apparatuses such as biological microscopes; sterilizers using light; deodorizing sterilizers combined with photocatalysts; exposure devices for photographs and semiconductor lithography; and devices for modulating light to transmit information through spaces, optical fibers, or waveguides.

When a GaN-based semiconductor light-emitting element according to the first embodiment or the second embodiment is applied to a planar light-source device, as described above, the light source includes a first light-emitting element which emits blue light, a second light-emitting element which emits green Slight, and a third light-emitting element which emits red light, and the GaN-based semiconductor light-emitting element according to the first embodiment or the second embodiment can constitute at least one (one type) of the first light-emitting element, the second light-emitting element, and the third light-emitting element. The present application is not limited thereto, The light source in the planar light-source device may be constituted by one or two or more light-emitting apparatuses according to any embodiment. The number of each of the first light-emitting element, the second light-emitting element, and the third light-emitting element may be one or two or more. The planar light-source device may be one of two types of planar light-source devices (backlights): a direct-type planar light-source device, for example, disclosed in Japanese Unexamined Utility Model Registration Application Publication No. 63-187120 or Japanese Unexamined Patent Application Publication No. 2002-277870, and an edge light type (also referred to as "side light type") planar light-source device, for example, disclosed in Japanese Unexamined Patent Application Publication No. 2002-131552. The number of GaN-based semiconductor light-emitting elements is essentially arbitrary, and may be determined on the basis of the specifications of the planar light-source device. The first light-emitting element, the second light-emitting element, and the third light-emitting element are arranged so as to face a liquid crystal display device, and a diffuser plate, an optical functional sheet group including a diffuser sheet, a prism sheet, and a polarization conversion sheet, and a reflection sheet are placed between the liquid crystal display device and each of the first light-emitting element, the second light-emitting element, and the third light-emitting element.

The GaN-based semiconductor light-emitting element according to the first embodiment or the second embodiment of the present application includes a laminated structure including at least one laminate unit in which a GaN-based compound semiconductor layer of p-conductivity type and an undoped GaN-based compound semiconductor layer are stacked, or includes a third GaN-based compound semiconductor layer on which at least one undoped GaN-based compound semiconductor layer is disposed at a side closer to the second GaN-based compound semiconductor layer. Consequently, it is possible to achieve higher light emission efficiency in the GaN-based semiconductor light-emitting element.

Additional features and advantages are described herein, and will be apparent from the following Detailed Description and the figures.

BRIEF DESCRIPTION OF THE FIGURES

FIG. 1A is a schematic partial cross-sectional view of a GaN-based semiconductor light-emitting element in Example 1, and FIG. 1B shows a structure including a first GaN-based compound semiconductor layer, an active layer, a laminated structure (a third GaN-based compound semiconductor layer), a second GaN-based compound semiconductor layer, etc. of the GaN-based semiconductor light-emitting element in Example 1;

FIG. 2 is a conceptual diagram showing a GaN-based semiconductor light-emitting element in the process of evaluating the properties of the GaN-based semiconductor light-emitting element;

FIG. 3 shows a structure of a GaN-based semiconductor light-emitting element in Example 2, including a first GaN-based compound semiconductor layer, an active layer, a laminated structure (a third GaN-based compound semiconductor layer), a second GaN-based compound semiconductor layer, and the like.

DETAILED DESCRIPTION

Figure 4A:
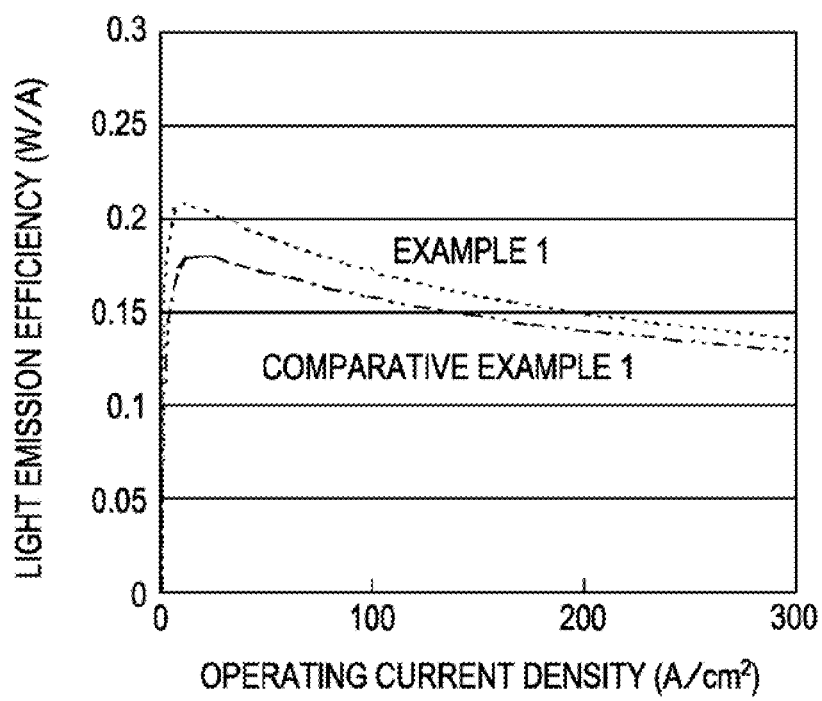
FIG. 4A is a graph showing the relationship between the operating current density (ampere/cm$^2$) and the light emission efficiency (watt/ampere) in each of Example 1 and Comparative Example 1.

The present application will be described based on examples with reference to the drawings according to an embodiment.

Example 1

Example 1 relates to GaN-based semiconductor light-emitting elements according to the first embodiment and the second embodiment, and the methods of driving the GaN-based semiconductor light-emitting elements according to the first embodiment and the second embodiment. FIG. 1A is a schematic partial cross-sectional view of a GaN-based semiconductor light-emitting element in Example 1, and FIG. 1B shows a structure including a first GaN-based compound semiconductor layer, an active layer, a laminated structure (a third GaN-based compound semiconductor layer), a second GaN-based compound semiconductor layer, and the like.

A GaN-based semiconductor light-emitting element (more specifically, light-emitting diode) 1 in Example 1 includes (A) a first GaN-based compound semiconductor layer 21 of n-conductivity type, (B) an active layer 23, (C) a second GaN-based compound semiconductor layer 22 of p-conductivity type, (D) a first electrode 31 electrically connected to the first GaN-based compound semiconductor layer 21, and (E) a second electrode 32 electrically connected to the second GaN-based compound semiconductor layer 22.

The GaN-based semiconductor light-emitting element 1 further includes, between the active layer 23 and the second GaN-based compound semiconductor layer 22, disposed in that order from the active layer side, (F) an impurity diffusion-preventing layer 24 composed of an undoped GaN-based compound semiconductor, the impurity diffusion-preventing layer 24 preventing a p-type impurity from diffusing into the active layer 23, and (G) a laminated structure 40 according to the first embodiment, or (G) a third GaN-based compound semiconductor layer 50 of p-conductivity type according to the second embodiment.

According to the first embodiment, the laminated structure 40 includes at least one laminate unit 41 in which a GaN-based compound semiconductor layer 42 of p-conductivity type and an undoped GaN-based compound semiconductor layer 43 are stacked in that order from the active layer side. Specifically, the laminated structure 40 includes two laminate units 41 in Example 1.

According to the second embodiment, at least one undoped GaN-based compound semiconductor layer 53 is disposed on a side, closer to the second GaN-based compound semiconductor layer 22, of the third GaN-based compound semiconductor layer 50. In Example 1, two undoped GaN-based compound semiconductor layers 53 are provided.

In Example 1, the GaN-based compound semiconductor layer 42 of p-conductivity type and the undoped GaN-based compound semiconductor layer 43 constituting the laminate unit 41 have the same composition, i.e., GaN. Meanwhile, the third GaN-based compound semiconductor layer 50 of p-conductivity type and the undoped GaN-based compound semiconductor layer 53 disposed on the third GaN-based compound semiconductor layer 50 have the same composition, i.e., GaN. The p-type impurity concentration of the GaN-based compound semiconductor layer 42 of p-conductivity type constituting the laminate unit 41 or the p-type impurity concentration of the third GaN-based compound semiconductor layer 50 is $1\times10^{18}/cm^3$ to $4\times10^{20}/cm^3$, and specifically $5\times10^{19}/cm^3$.

Furthermore, the thickness of the GaN-based compound semiconductor layer 42 of p-conductivity type constituting the laminate unit 41 is 5 nm, the thickness of the undoped GaN-based compound semiconductor layer 43 constituting the laminate unit 41 (or the thickness of the undoped GaN-based compound semiconductor layer 53 disposed on the third GaN-based compound semiconductor layer 50) is 13 nm, and the thickness of the laminated structure 40 (or the thickness of the third GaN-based compound semiconductor layer 50) is 36 nm (=18 nm×2). Furthermore, the area of the active layer 23 is $4\times10^{-10}$ $m^2$ and the thickness of the GaN-based semiconductor light-emitting element 1 is $5\times10^{-6}$ m. In the drawing, reference numeral 10 represents a light-emitting element-forming substrate, and reference numeral 11 represents an underlying layer including a buffer layer and an undoped GaN layer disposed thereon.

In the GaN-based semiconductor light-emitting element 1 in Example 1, a current with a current density (operating current density) of 50 amperes/$cm^2$ or more, preferably 100 amperes/$cm^2$ or more, and more preferably 200 amperes/$cm^2$ or more is applied to the active layer 23.

A method of manufacturing a GaN-based semiconductor light-emitting element in Example 1 will be described below.

[Step-100]

First, a sapphire substrate whose principal surface is the C plane is used as the light-emitting element-forming substrate 10. The light-emitting element-forming substrate 10 is subjected to cleaning at a substrate temperature of 1,050° C. for 10 minutes in a carrier gas composed of hydrogen, and then the substrate temperature is decreased to 500° C., A buffer layer composed of low-temperature GaN with a thickness of 30 nm is formed by crystal growth on the light-emitting element-forming substrate 10 by means of MOCVD in which trimethylgallium (TMG) gas as a gallium source is supplied while ammonia gas as a nitrogen source is being supplied, and then the supply of TMG gas is halted. After the substrate temperature is increased to 1,020° C., the supply of TMG gas is restarted. Thus, an undoped GaN layer with a thickness of 1 μM is formed by crystal growth on the buffer layer. Thereby, an underlying layer 11 is obtained. Subsequently, supply of monosilane gas ($SiH_4$ gas) as a silicon source is started. Thus, a first GaN-based compound semiconductor layer 21 of n-conductivity type composed of Si-doped GaN (GaN:Si) with a thickness of 3 μm is formed by crystal growth on the undoped GaN layer constituting the underlying layer 11. The doping concentration is about $5\times10^{18}/cm^3$.

[Step-110]

Then, the supply of TMG gas and $SiH_4$ gas is halted, the carrier gas is switched from hydrogen gas to nitrogen gas, and the substrate temperature is decreased to 750° C. Triethylgallium (TEG) gas is used as a Ga source and trimethylindium (TMI) gas is used as an In source. By switching the valve, these gases are supplied. Thereby, an active layer 23 having a multiple quantum well structure including well layers composed INGaN and barrier layers composed of GaN is formed. The substrate temperature may be fluctuated during the crystal growth. The compositional proportion of In in the well layer is, for example, 0.23, which corresponds to a light emission wavelength λ of 520 mm. The compositional proportion of In in the well layer can be determined according to the desired light emission wavelength. Here, the number of well layers is five, and the number of barrier layers is four.

[Step-120]

After the formation of the active layer 23 having the multiple quantum well structure is completed, an impurity diffusion-preventing layer 24 composed of undoped GaN with a thickness of 5 nm is grown while increasing the substrate temperature to 800° C.

[Step-130]

Subsequently, with the substrate temperature being maintained at 800° C., supply of bis(cyclopentadienyl)magnesium ($Cp_2Mg$) gas as a Mg source is started. Thus, a GaN-based compound semiconductor layer 42 of p-conductivity type (specifically, Mg-doped GaN layer 42) is grown with a thickness of 5 nm. Next, in the state in which the supply of $Cp_2Mg$ gas is halted, an undoped GaN-based compound semiconductor layer 43 (specifically, undoped GaN layer 43) is grown with a thickness of 13 nm. In such a manner, the Mg-doped GaN layer 42 with a thickness of 5 nm and the undoped GaN layer 43 with a thickness of 13 nm are grown twice repeatedly. The doping concentration of Mg is about $5 \times 10^{19}/cm^3$. Thereby, a laminated structure 40 including at least one laminate unit 41 in which the GaN-based compound semiconductor layer 42 of p-conductivity type and the undoped GaN-based compound semiconductor layer 43 are stacked in that order from the active layer side can be obtained. Alternatively, a third GaN-based compound semiconductor layer 50 having at least one undoped GaN-based compound semiconductor layer 53 (undoped GaN layer 53) on the side closer to the second GaN-based compound semiconductor layer 22 can be obtained.

[Step-140]

Then, the supply of TEG gas and $Cp_2Mg$ gas is halted, the carrier gas is switched from nitrogen to hydrogen, and the substrate temperature is increased to 850° C. By starting supply of TMG gas and $Cp_2Mg$ gas, a second GaN-based compound semiconductor layer 22 composed of Mg-doped GaN (GaN:Mg) with a thickness of 100 nm is formed by crystal growth. The doping concentration is about $5 \times 10^{19}/cm^3$. Then, a contact layer (not shown) composed of InGaN is formed by crystal growth. The supply of TMG gas and $Cp_2Mg$ gas is stopped, and the substrate temperature is decreased. The supply of ammonia gas is stopped at the substrate temperature of 600° C., and the substrate temperature is decreased to room temperature to complete the crystal growth.

With respect to the substrate temperature $T_{MAX}$ after the growth of the active layer 23, the relationship $T_{MAX} < 1,350 - 0.75\lambda$ (° C.) is satisfied, and preferably, the relationship $T_{MAX} < 1,250 - 0.75\lambda$ (° C.) is satisfied. By using such a substrate temperature $T_{MAX}$ after the growth of the active layer 23, as described in Japanese Unexamined Patent Application Publication No. 2002-319702, the active layer 23 can be prevented from being thermally degraded.

[Step-150]

After the crystal growth is completed, annealing treatment is performed at 800° C. in a nitrogen gas atmosphere for ten minutes to activate the p-type impurity (p-type dopant).

[Step-160]

Subsequently, as in the ordinary LED wafer process and chip formation process, a protective film (not shown) is formed, a second electrode 32 and a first electrode 31 are formed by photolithography, etching, and metal vapor deposition, and chips are formed by dicing, followed by resin molding and packaging. Thus, a GaN-based semiconductor light-emitting element 1 in Example 1 (e.g., any of various types of light-emitting diodes, such as shell-shaped light-emitting diodes and surface-mount-type light-emitting diodes) can be fabricated.

Figure 26:
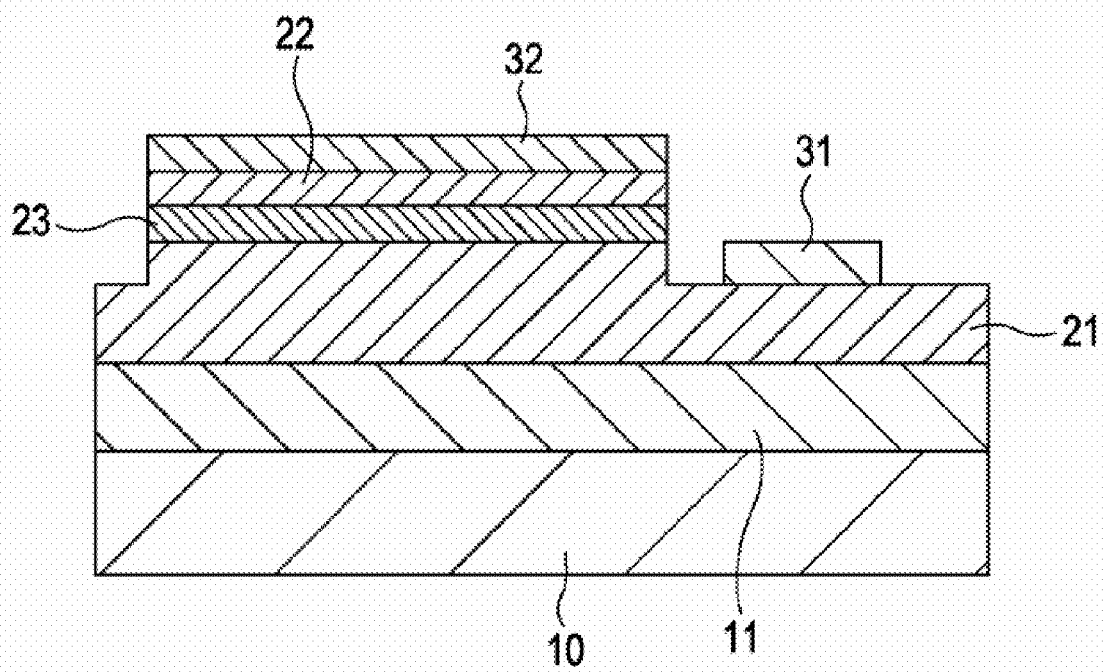
FIG. 26 is a schematic partial sectional-view of a GaN-based semiconductor light-emitting element of Comparative Example 1.

In Comparative Example 1, a GaN-based semiconductor light-emitting element is fabricated in which a second GaN-based compound semiconductor layer 22 is directly formed on an impurity diffusion-preventing layer 24 without forming a laminated structure 40 (or a third GaN-based compound semiconductor layer 50 including an undoped GaN-based compound semiconductor layer 53) (refer to FIG. 26).

With respect to the GaN-based semiconductor light-emitting element in each of Example 1 or Example 2, which will be described below, and Comparative Example 1, for evaluation purposes, using lithography and etching, the first GaN-based compound semiconductor layer 21 was partially exposed, a second electrode 32 composed of Ag/Ni was formed on the second GaN-based compound semiconductor layer 22, and a first electrode 31 composed of Ti/Al was formed on the first GaN-based compound semiconductor layer 21. Probe needles were brought into contact with the first electrode and the second electrode. A driving current was applied to the light-emitting element, and light emitted from the back surface of the light-emitting element-forming substrate 10 was detected. FIG. 2 is a conceptual diagram showing the evaluation process, in which the laminated structure 40, etc. are omitted.

FIG. 4A is a graph showing the relationship between the operating current density (ampere/$cm^2$) and the light emission efficiency (watt/ampere) in each of Example 1 and Comparative Example 1. As is evident from the graph, Example 1 has a light emission efficiency at the same operating current density that is certainly increased compared with Comparative Example 1. The increase in the light emission efficiency can be confirmed over the entire range of operating current densities from a common LED operating current density (30 amperes/$cm^2$) to a high operating current density (300 amperes/$cm^2$). The light emission wavelength is 520 nm in each of Example 1 and Comparative Example 1, or Example 2 described below.

As described above, by forming the laminated structure 40 having the undoped GaN-based compound semiconductor layer 43 (or the third GaN-based compound semiconductor layer 50 including the undoped GaN-based compound semiconductor layer 53) between the active layer 23 and the second GaN-based compound semiconductor layer 22 as in Example 1, it is assumed that the hole concentration in the active layer increases, and high light emission efficiency can be achieved in the range from the low operating current density to the high operating current density.

Example 2

Example 2 relates to a modification of the GaN-based semiconductor light-emitting element in Example 1, and relates to the methods of manufacturing the GaN-based semiconductor light-emitting elements according to the first embodiment and the second embodiment.

FIG. 3 shows a structure including a first GaN-based compound semiconductor layer, an active layer, a laminated structure (a third GaN-based compound semiconductor layer), a second GaN-based compound semiconductor layer, etc. In a GaN-based semiconductor light-emitting element 1 in Example 2, an undoped GaN-based compound semiconductor layer 143 constituting a laminate unit 141 includes a GaN-based compound semiconductor layer, the composition of which contains indium, (specifically, an InGaN layer), or an undoped GaN-based compound semiconductor layer 153 disposed on a third GaN-based compound semiconductor layer 150 includes a GaN-based compound semiconductor layer, the composition of which contains indium, (specifically, an InGaN layer).

Alternatively, the undoped GaN-based compound semiconductor layer 143 constituting the laminate unit 141 has a three-layer structure including a first layer 143A having the same composition as the GaN-based compound semiconductor layer 42 of p-conductivity type constituting the laminate unit 141, a second layer 143B having the composition which is the same as the first layer 143A and which further contains indium, and a third layer 143C having the same composition as the first layer 143A. Specifically, the undoped GaN-based compound semiconductor layer 143 constituting the laminate unit 141 has a three-layer structure including the first layer 143A composed of undoped GaN, the second layer 143B composed of undoped $In_xGa_{(1-x)}N$ (wherein $0<x\leqq0.3$), and the third layer 143C composed of undoped GaN. Furthermore, the active layer 23 includes an $In_yGa_{(1-y)}N$ layer, and $x\leqq y$.

Meanwhile, the undoped GaN-based compound semiconductor layer 153 disposed on the third GaN-based compound semiconductor layer 150 has a three-layer structure including a first layer 153A having the same composition as the third GaN-based compound semiconductor layer 150 of p-conductivity type, a second layer 153B having the composition which is the same as the first layer 153A and which further contains indium, and a third layer 153C having the same composition as the first layer 153A. Specifically, the undoped GaN-based compound semiconductor layer 153 disposed on the third GaN-based compound semiconductor layer 150 has a three-layer structure including the first layer 153A composed of undoped GaN, the second layer 153B composed of undoped $In_xGa_{(1-x)}N$ (wherein $0<x\leqq0.3$), and the third layer 153C composed of undoped GaN. Furthermore, the active layer 23 includes an $In_yGa_{(1-y)}N$ layer, and $x\leqq y$.

More specifically, in Example 2, $x=0.23$, and $y=0.20$. Additionally, the difference in the In content can be achieved by forming the GaN-based compound semiconductor layer (second layer 143B), the composition of which contains indium, in the undoped GaN-based compound semiconductor layer 143 constituting the laminate unit 141 at a higher temperature than the temperature at which the GaN-based compound semiconductor layer, the composition of which contains indium, (specifically, the well layer) in the active layer 23 is formed. Alternatively, the difference in the In content can be achieved by forming the GaN-based compound semiconductor layer (second layer 153B), the composition of which contains indium, in the undoped GaN-based compound semiconductor layer 153 disposed on the third GaN-based compound semiconductor layer 150 at a higher temperature than the temperature at which the GaN-based compound semiconductor layer, the composition of which contains indium, (specifically, the well layer) in the active layer 23 is formed. When the relationship $x\leqq y$ is satisfied, the bandgap of the second layer 143B or 153B increases, and as a result, the light generated in the active layer 23 is less easily absorbed by the second layer 143B or 153B.

A method of manufacturing a GaN-based semiconductor light-emitting element in Example 2 will be described below. The resulting GaN-based semiconductor light-emitting element 1 as a whole has substantially the same structure as that shown in FIG. 1A.

[Step-200]

First, an underlying layer 11 and a first GaN-based compound semiconductor layer 21 are formed on a light-emitting element-forming substrate 10 as in [Step-100] of Example 1. Furthermore, an active layer 23 and an impurity diffusion-preventing layer 24 are formed as in [Step-110] to [Step-120] of Example 1.

[Step-210]

Next, by starting supply of $Cp_2Mg$ gas as a Mg source, a GaN-based compound semiconductor layer 42 of p-conductivity type (specifically, Mg-doped GaN layer 42) or a third GaN-based compound semiconductor layer 150 is grown with a thickness of 5 nm. Next, in the state in which the supply of $Cp_2Mg$ gas is halted, an undoped GaN-based compound semiconductor layer (a first layer 143A having the same composition as the GaN-based compound semiconductor layer 42 of p-conductivity type constituting the laminate unit 141 or a first layer 153A having the same composition as the third GaN-based compound semiconductor layer 150 of p-conductivity type) is grown with a thickness of 5 nm. Then, by starting supply of trimethylindium (TMI) gas as an In source, an InGaN layer (a second layer 143B having the composition which is the same as the first layer 143A and which further contains indium, or a second layer 153B having the composition which is the same as the first layer 153A and which further contains indium) is grown with a thickness of 3 nm. Next, in the state in which the supply of TMI gas is halted, a GaN layer 143C (a third layer 143C having the same composition as the first layer 143A or a third layer 153C having the same composition as the first layer 153A) is grown with a thickness of 5 nm. Note that the substrate temperature during the growth of the first layer 143A or 153A, the second layer 143B or 153B, and the third layer is set at 760° C. This temperature is higher than 750° C. which is the substrate temperature during the growth of the active layer 23. As a result, the compositional proportion of In in the second layer 143B or 153B composed of InGaN is 0.2. The doping concentration of Mg is about $5\times10^{19}/cm^3$.

In such a manner, at a higher temperature (specifically, 760° C. in Example 2) than the temperature (specifically 750° C. in Example 2) at which the GaN-based compound semiconductor layer, the composition of which contains indium, in the active layer 23 is formed, the GaN-based compound semiconductor layer, the composition of which contains indium, (second layer 143B) in the undoped GaN-based compound semiconductor layer 143 constituting the laminate unit 141 is formed, or the GaN-based compound semiconductor layer, the composition of which contains indium, (second layer 153B) in the undoped GaN-based compound semiconductor layer 153 disposed on the third GaN-based compound semiconductor layer 150 is formed.

The Mg-doped GaN layer 42 with a thickness of 5 nm and the undoped GaN-based compound semiconductor layer 143 with a thickness of 13 nm are grown twice repeatedly. Thereby, a laminated structure 140 including at least one laminate unit 141 in which the GaN-based compound semiconductor layer 42 of p-conductivity type and the undoped GaN-based compound semiconductor layer 143 are stacked in that order from the active layer side can be obtained. Alternatively, a third GaN-based compound semiconductor layer 150 having at least one undoped GaN-based compound semiconductor layer 153 (undoped GaN layer 153) on the side closer to the second GaN-based compound semiconductor layer 22 can be obtained.

[Step-220]

Subsequently, by carrying out the same steps as [Step-140] to [Step-160] of Example 1, a GaN-based semiconductor light-emitting element 1 in Example 2 (e.g., any of various types of light-emitting diodes, such as shell-shaped light-emitting diodes and surface-mount-type light-emitting diodes) can be fabricated.

Figure 4B:
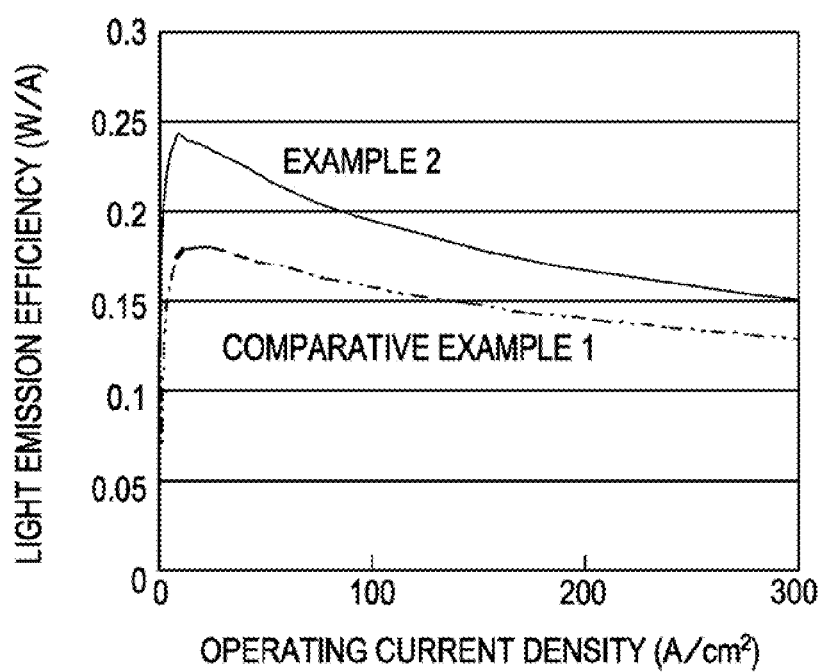
FIG. 4B is a graph showing the relationship between the operating current density (ampere/cm$^2$) and the light emission efficiency (watt/ampere) in each of Example 2 and Comparative Example 1.

FIG. 4B is a graph showing the relationship between the operating current density (ampere/$cm^2$) and the light emission efficiency (watt/ampere) in each of Example 2 and Comparative Example 1. As is evident from the graph, Example 2 has a light emission efficiency at the same operating current density that is further increased compared with Example 1 and Comparative Example 1. The increase in the light emission efficiency can be confirmed over the entire range of operating current densities from a common LED operating current density (30 amperes/cm$^2$) to a high operating current density (300 amperes/cm$^2$).

In Example 2, the undoped GaN-based compound semiconductor layer 143 constituting the laminate unit 141 includes the GaN-based compound semiconductor layer, the composition of which contains indium, (second layer 143B) is disposed, or the undoped GaN-based compound semiconductor layer 153 disposed on the third GaN-based compound semiconductor layer 150 includes the GaN-based compound semiconductor layer, the composition of which contains indium, (second layer 153B). Such a second layer 143B or 153B has a narrower bandgap than the first layer 143A or 153A and the third layer 143C or 153C because of its composition containing indium, and thus a high hole concentration can be maintained. As a result, the hole concentration in the active layer can be further increased. Consequently, in the GaN-based semiconductor light-emitting element 1 of Example 2, a higher light emission efficiency can be achieved at the same operating current density compared with Example 1.

Figure 5:
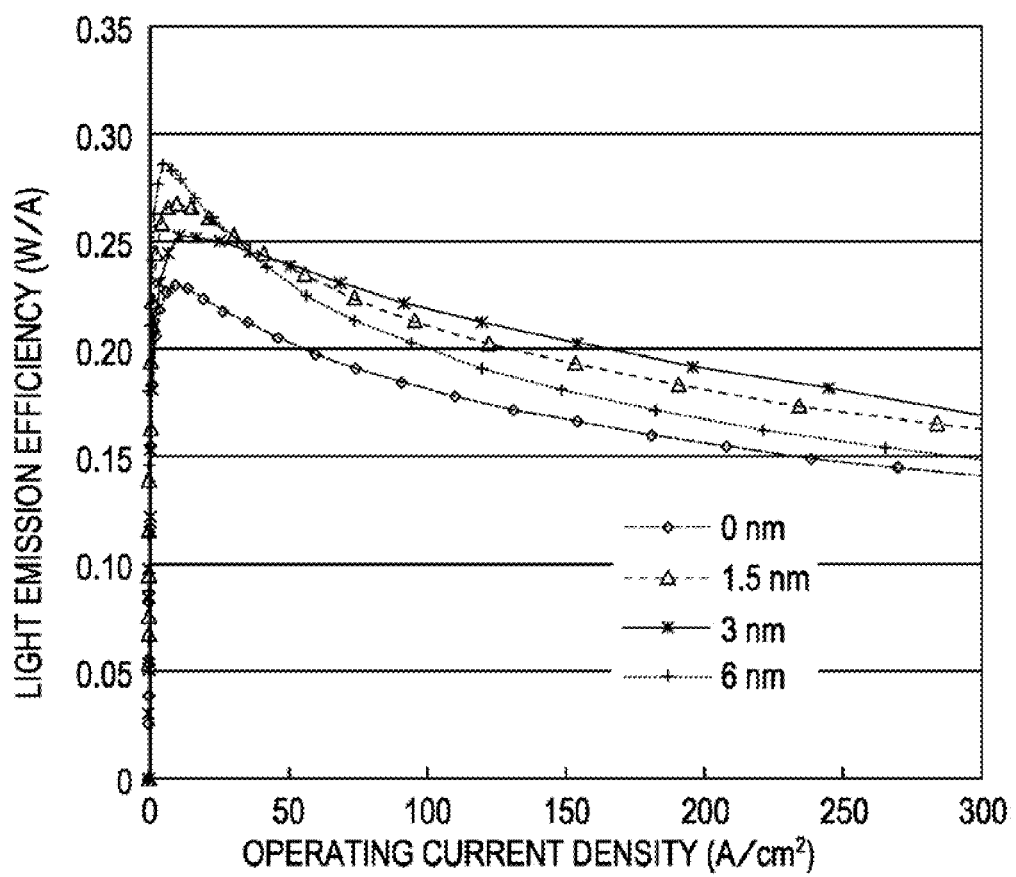
FIG. 5 is a graph showing the results when the light emission efficiency was measured with respect to GaN-based semiconductor light-emitting elements of Example 2 including the second layer, constituting the laminated structure, with a thickness of 1.5 nm, 3 nm, and 6 nm, respectively, and the light emission efficiency was measured with respect to a GaN-based semiconductor light-emitting element in which the thickness of the second layer, constituting the laminated structure, was set at 0 nm.

In Example 2, the light emission efficiency was measured with respect to GaN-based semiconductor light-emitting elements including the second layer 143B or 153B with a thickness of 1.5 nm, 3 nm, and 6 nm, respectively. The light emission efficiency was also measured with respect to a GaN-based semiconductor light-emitting element in which the thickness of the second layer 143B or 153B was set at 0 nm (this GaN-based semiconductor light-emitting element having substantially the same structure as that of the GaN-based semiconductor light-emitting element described in Example 1). The measurement results are shown in the graph of FIG. 5. In comparison with the case where the thickness of the second layer 143B or 153B is 0 nm (the curve depicted by hollow diamonds in the graph), each of the case where the thickness of the second layer 143B or 153B is set at 1.5 nm (the curve depicted by hollow triangles), the case where the thickness of the second layer 143B or 153B is set at 3 nm (the curve depicted by cross marks), and the case where the thickness of the second layer 143B or 153B is set at 6 nm (the curve depicted by plus marks) has increased light emission efficiency. On the basis of the results shown in FIG. 5, it is believed that the optimum thickness of the second layer 143B or 153B is 1 nm to 5 nm.

Example 3

Example 3 relates to light-emitting element assemblies according to the first embodiment and the second embodiment and image display apparatuses according to the first embodiment and the second embodiment.

Figure 6:
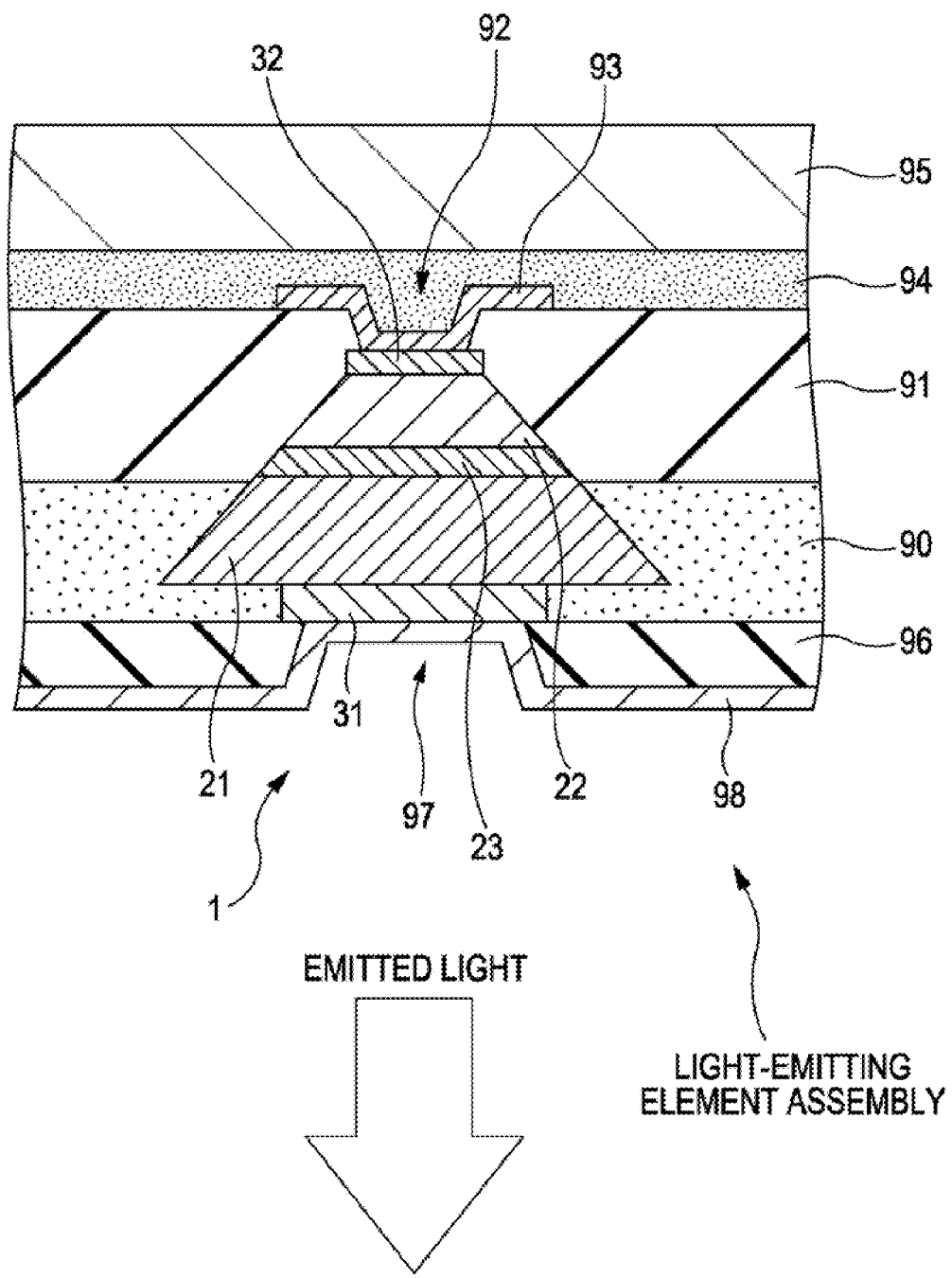
FIG. 6 is a schematic partial cross-sectional view of a light-emitting element assembly in Example 3.
Figure 7A:
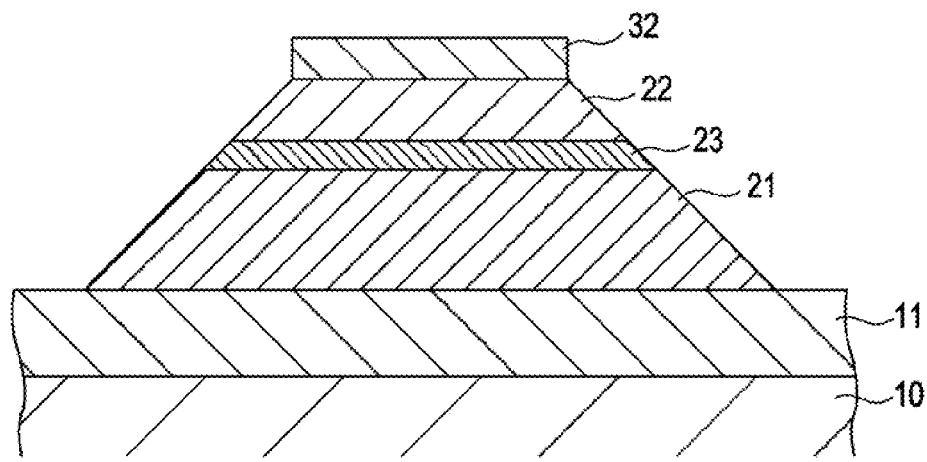
FIGS. 7A and 7B are conceptual diagrams, each showing a cross-section of a GaN-based semiconductor light-emitting element, and showing a step in a method of manufacturing a light-emitting element assembly in Example 3.
Figure 7B:
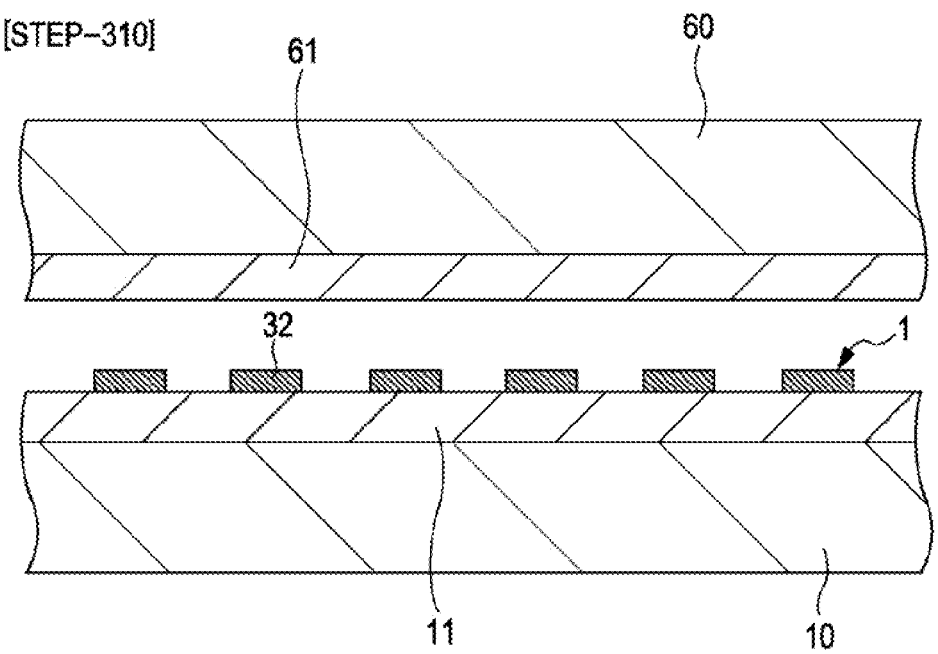

FIG. 6 is a schematic partial cross-sectional view of a light-emitting element assembly in Example 3. As shown in FIG. 6, the light-emitting element assembly includes a supporting member and a GaN-based semiconductor light-emitting element of Example 1 or Example 2 described above disposed on the supporting member. In FIG. 6, in terms of positional relationship, the GaN-based semiconductor light-emitting element and the supporting member are vertically reversed. Furthermore, an image display apparatus of Example 3 includes a GaN-based semiconductor light-emitting element of Example 1 or Example 2, or a light-emitting element assembly of Example 3 in order to display an image.

A method of manufacturing a light-emitting element assembly of Example 3 will be described with reference to FIGS. 7A, 7B, 8A, 8B, 9A, 9B, 10A, 10B, 11A, and 11B.

[Step-300]

First, the same steps as [Step-100] to [Step-150] of Example 1 are carried out, and the same step as [Step-160] of Example 1 is carried out up to the formation of a second electrode 32 by photolithography, etching, and metal vapor deposition, Alternatively, the same steps as [Step-200] to [Step-220] of Example 2 are carried out (up to the formation of a second electrode 32 by photolithography, etching, and metal vapor deposition in [Step-220]). Thereby, a GaN-based semiconductor light-emitting element having a trapezoidal cross-section shown in FIG. 7A can be obtained.

[Step-310]

Next, GaN-based semiconductor light-emitting elements 1 are temporarily fixed onto a temporary fixing substrate 60 with second electrodes 32 therebetween. Specifically, the temporary fixing substrate 60 composed of a glass substrate having an adhesion layer 61 on the surface thereof is prepared, the adhesion layer 61 being composed of an uncured adhesive. The GaN-based semiconductor light-emitting elements 1 and the adhesion layer 61 are bonded together, and the adhesion layer 61 is cured. Thus, the GaN-based semiconductor light-emitting elements 1 can be temporarily fixed onto the temporary fixing substrate 60 (refer to FIGS. 7B and 8A).

[Step-320]

Figure 8A:
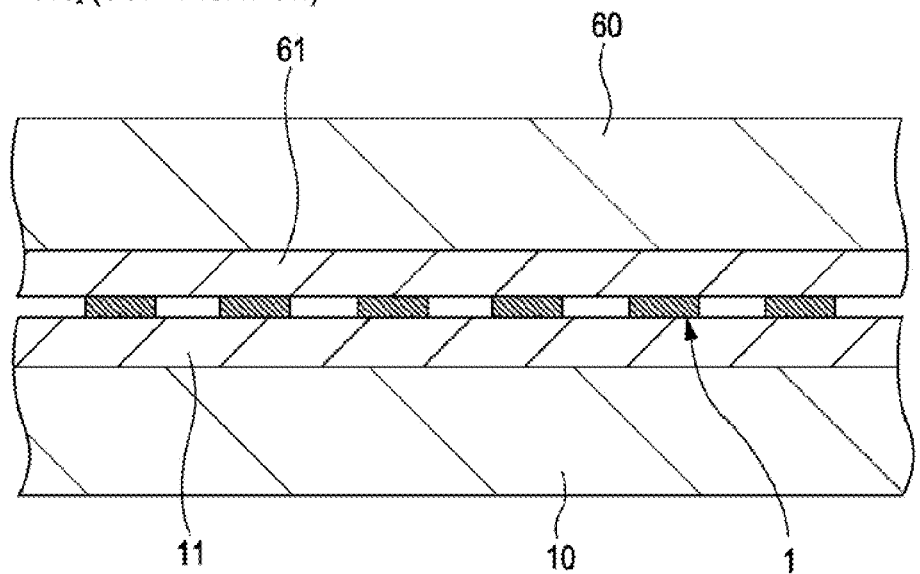
FIGS. 8A and 8B are conceptual diagrams, each showing a cross-section of the GaN-based semiconductor light-emitting element, etc. and showing a step, subsequent to the step shown in FIG. 7B, in the method of manufacturing the light-emitting element assembly in Example 3.
Figure 8B:
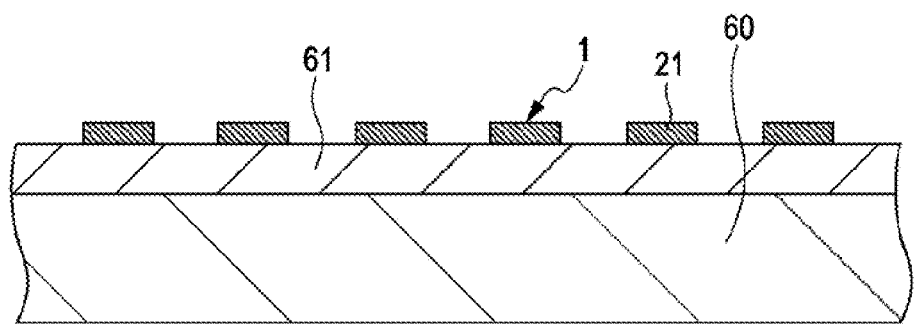

Then, the GaN-based semiconductor light-emitting elements 1 are detached from the light-emitting element-forming substrate 10 (refer to FIG. 8B). Specifically, the thickness of the light-emitting element-forming substrate 10 is decreased by lapping from the back surface. Next, the light-emitting element-forming substrate 10 and the underlying layer 11 are subjected to wet etching. Thereby, the light-emitting element-forming substrate 10 and the underlying layer 11 are removed to expose the first GaN-based compound semiconductor layer 21 of each GaN-based semiconductor light-emitting element 1.

Examples of the material constituting the temporary fixing substrate 60 include, besides the glass substrate, a metal plate, an alloy plate, a ceramic plate, and a plastic plate. Examples of the method for temporarily fixing the GaN-based semiconductor light-emitting elements to the temporary fixing substrate 60 include, besides the method in which an adhesive is used, a metal bonding method, a semiconductor bonding method, and a metal-semiconductor bonding method. Examples of the method for removing the light-emitting element-forming substrate 10, etc. from the GaN-based semiconductor light-emitting elements include, besides etching, laser ablation and a heating method.

[Step-330]

Next, a first electrode 31 is formed on the bottom surface of the exposed first GaN-based compound semiconductor layer 21. Specifically, using lithography, a resist layer is formed on the entire surface and an opening is formed in the resist layer at a portion on the bottom surface of the first GaN-based compound semiconductor layer 21 on which the first electrode 31 is to be formed. Next, the first electrode 31 composed of a multilayered film including, for example, Au/Pt/Ti/Au/AuGe/Pd stacked in that order is formed on the entire surface by a PVD method, such as vacuum deposition or sputtering, and then the resist layer and the multilayered film on the resist layer are removed.

[Step-340]

A transfer substrate 70 having a slightly adhesive layer 71 composed of silicone rubber thereon and a mounting substrate 80 composed of a glass substrate having an alignment mark (not shown) composed of a metal thin film or the like formed at a predetermined position in advance and having an adhesive layer 81 composed of an uncured photosensitive resin on a surface thereof are prepared.

The adhesive layer 81 may basically be composed of any material as long as the material exhibits adhesion properties by a certain method, for example, a material which exhibits adhesion properties by irradiation of energy ray, such as light (particularly, ultraviolet light or the like), radiation (e.g., X-ray), or an electron beam; or a material which exhibits adhesion properties by application of heat, pressure, or the like. Examples of the material which can easily form an adhesive layer and which exhibits adhesion properties include resin-based adhesives, in particular, photosensitive adhesives, thermosetting adhesives, and thermoplastic adhesives. For example, when a photosensitive adhesive is used, by irradiating the adhesive layer with light or ultraviolet light or by heating the adhesive layer, adhesion properties can be exhibited. When a thermosetting adhesive is used, by heating the adhesive layer by means of irradiation of light, adhesion properties can be exhibited. When a thermoplastic adhesive is used, part of the adhesive layer is selectively melted by selectively heating by means of irradiation of light or the like, and thus flowability can be imparted thereto. As another example, a pressure-sensitive adhesive layer (composed of an acrylic resin or the like) may be used.

Figure 9A:
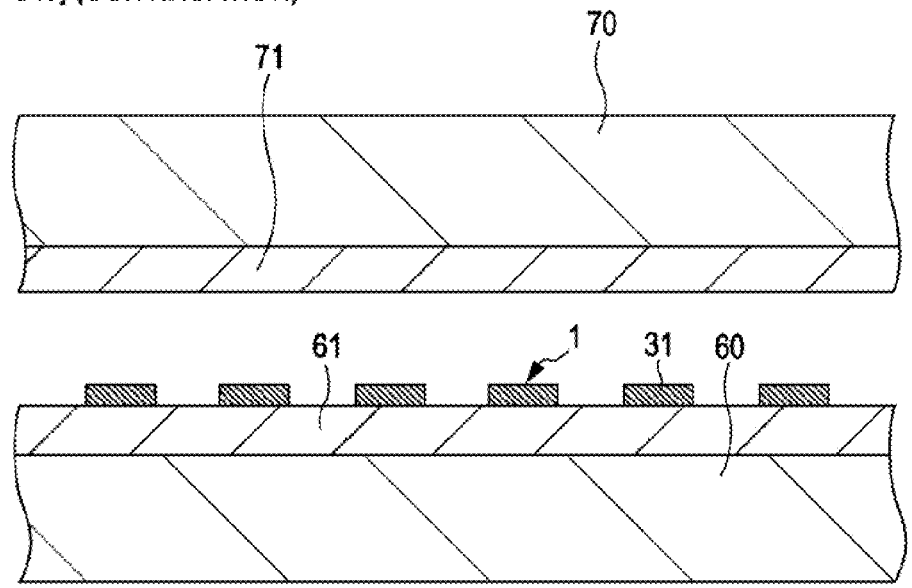
FIGS. 9A and 9B are conceptual diagrams, each showing a cross-section of the GaN-based semiconductor light-emitting element, and showing a step, subsequent to the step shown in FIG. 8B, in the method of manufacturing the light-emitting element assembly in Example 3.
Figure 9B:
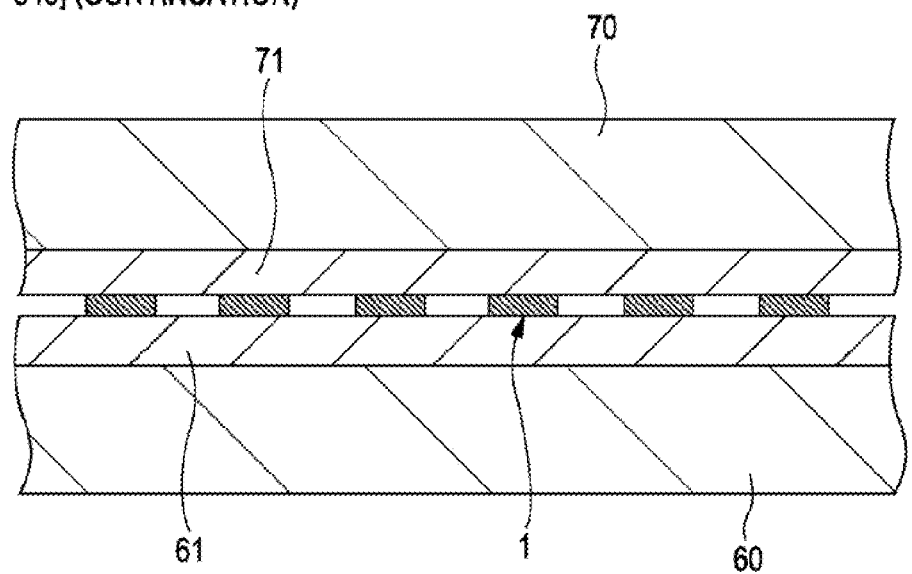
Figure 10A:
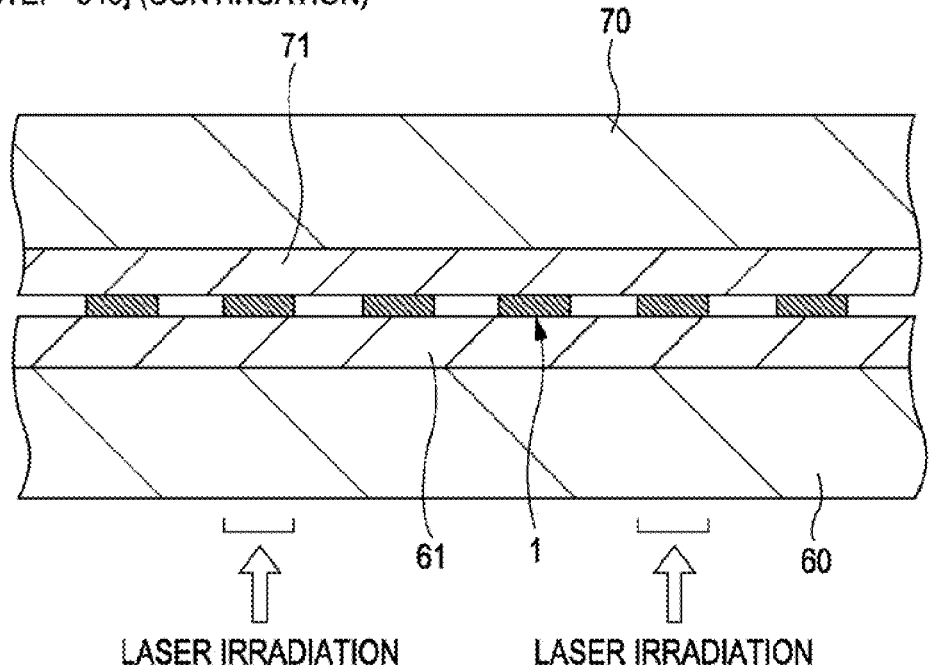
FIGS. 10A and 10B are conceptual diagrams, each showing a cross-section of the GaN-based semiconductor light-emitting element, etc. and showing a step, subsequent to the step shown in FIG. 9B, in the method of manufacturing the light-emitting element assembly in Example 3.
Figure 10B:
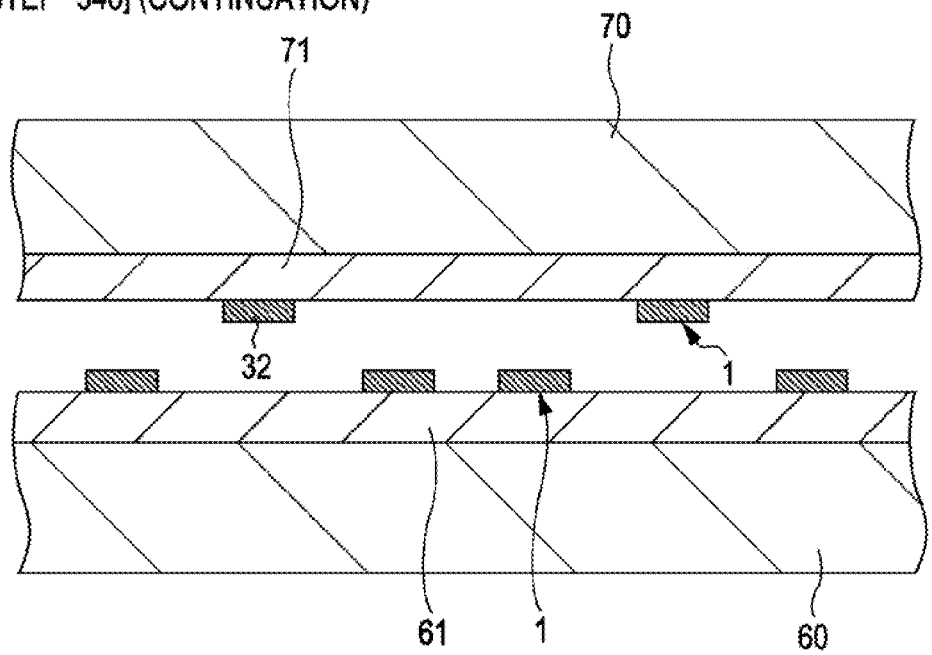

Next, the slightly adhesive layer 71 is pressed to the GaN-based semiconductor light-emitting elements 1 remaining in an array (in a two-dimensional matrix) on the temporary fixing substrate 60 (refer to FIGS. 9A and 9B). Examples of the material that constitutes the transfer substrate 70 include a glass plate, a metal plate, an alloy plate, a ceramic plate, a semiconductor substrate, and a plastic plate. The transfer substrate 70 is held by a positioning apparatus (not shown). The positional relationship between the transfer substrate 70 and the temporary fixing substrate 60 can be controlled by the operation of the positioning apparatus. Next, for example, excimer laser is applied from the back surface side of the temporary fixing substrate 60 to the GaN-based semiconductor light-emitting element 1 to be mounted (refer to FIG. 10A). Thus, laser ablation is caused so that the GaN-based semiconductor light-emitting element 1 irradiated with excimer laser is detached from the temporary fixing substrate 60. Then, the transfer substrate 70 is separated from the GaN-based semiconductor light-emitting elements 1 so that the GaN-based semiconductor light-emitting element 1 detached from the temporary fixing substrate 60 adheres to the slightly adhesive layer 71 (refer to FIG. 10B).

Figure 11A:
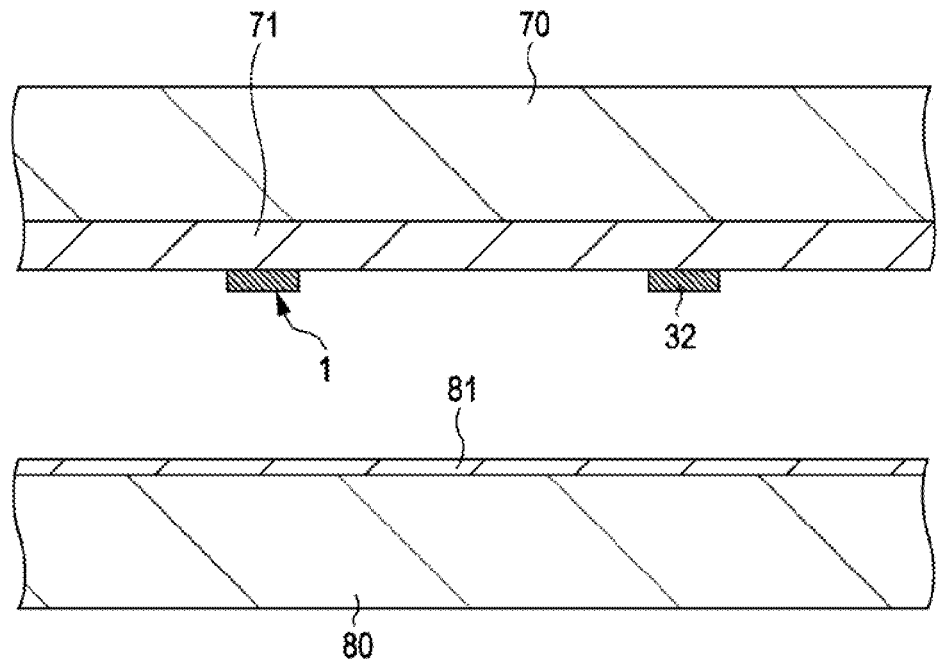
FIGS. 11A and 11B are conceptual diagrams, each showing a cross-section of the GaN-based semiconductor light-emitting element, etc. and showing a step, subsequent to the step shown in FIG. 10B, in the method of manufacturing the light-emitting element assembly in Example 3.
Figure 11B:
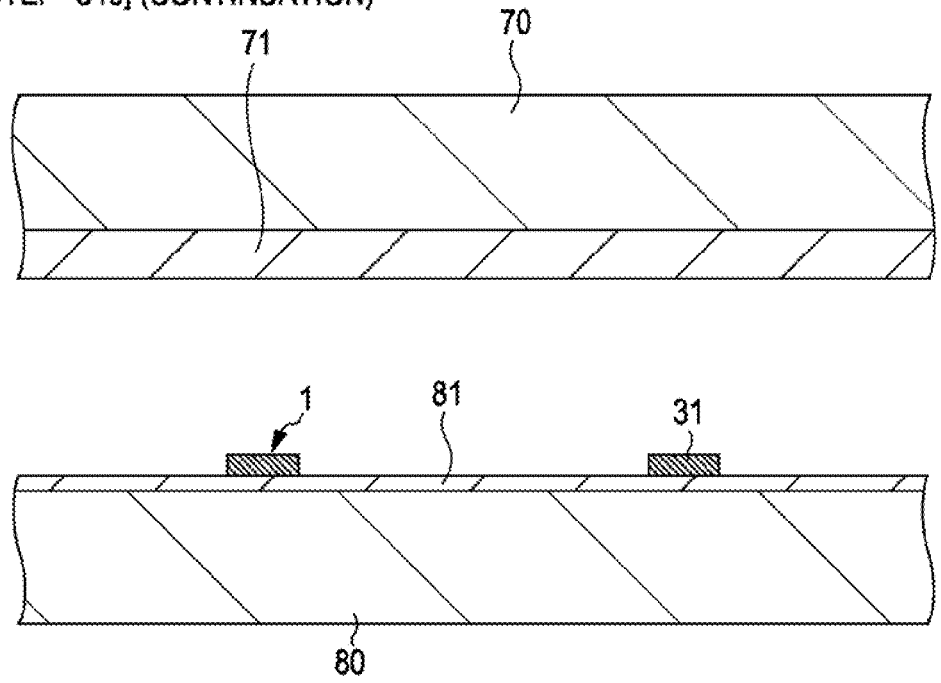

Next, the GaN-based semiconductor light-emitting element 1 is placed on (moved or transferred onto) the adhesive layer 81 (refer to FIGS. 11A and 11B). Specifically, the GaN-based semiconductor light-emitting element 1 is transferred from the transfer substrate 70 onto the adhesive layer 81 on the mounting substrate 80 on the basis of the alignment mark disposed on the mounting substrate 80. The GaN-based semiconductor light-emitting element 1 only weakly adheres to the slightly adhesive layer 71. Therefore, when the transfer substrate 70 is moved in a direction away from the mounting substrate 80 with the GaN-based semiconductor light-emitting element 1 being in contact with (pressed to) the adhesive layer 81, the GaN-based semiconductor light-emitting element 1 remains on the adhesive layer 81. Furthermore, by embedding the GaN-based semiconductor light-emitting element 1 deeply in the adhesive layer 81 using a roller or the like, the GaN-based semiconductor light-emitting element (light-emitting diode) can be mounted on the mounting substrate 80.

The method using the transfer substrate 70 as described above is referred to as a "step-transfer method" for convenience sake. By repeating the step-transfer method a desired number of times, a desired number of GaN-based semiconductor light-emitting elements 1 adhere to the slightly adhesive layer 71 in a two-dimensional matrix and are transferred onto the mounting substrate 80. Specifically, in Example 3, in one step-transfer process, 160×120 GaN-based semiconductor light-emitting elements 1, in a two-dimensional matrix, are allowed to adhere to the slightly adhesive layer 71 and transferred onto the mounting substrate 80. Consequently, by repeating the step-transfer method 108 times {(1,920×1,080)/(160×120)}, 1,920×1,080 GaN-based semiconductor light-emitting elements 1 can be transferred onto the mounting substrate 80. By repeating the above process three times, the predetermined number of red light-emitting diodes, green light-emitting diodes, and blue light-emitting diodes can be mounted on the mounting substrate 80 at predetermined intervals or pitches.

Then, the adhesive layer 81 composed of a photosensitive resin, having the GaN-based semiconductor light-emitting elements 1 thereon, is irradiated with ultraviolet light to cure the photosensitive resin constituting the adhesive layer 81. Thereby, the GaN-based semiconductor light-emitting elements 1 are fixed to the adhesive layer 81. Next, each GaN-based semiconductor light-emitting element 1 is temporarily fixed to a second temporary fixing substrate through the corresponding first electrode 31. Specifically, a second temporary fixing substrate composed of a glass substrate having an adhesion layer 90 composed of an uncured adhesive on a surface thereof is prepared. The GaN-based semiconductor light-emitting element 1 and the adhesion layer 90 are bonded together, and the adhesion layer 90 is cured. Thus, the GaN-based semiconductor light-emitting element 1 can be temporarily fixed onto the second temporary fixing substrate. Then, the adhesive layer 81 and the mounting substrate 80 are removed from the GaN-based semiconductor light-emitting element 1 by an appropriate method. At this stage, the second electrode 32 of the GaN-based semiconductor light-emitting element 1 is exposed.

[Step-350]

Next, a second insulating layer 91 is formed over the entire surface, and an opening 92 is formed in the second insulating layer 91 above the second electrode 32 of the GaN-based semiconductor light-emitting element 1. A second line 93 is formed on the second electrode 32 so as to extend from the opening 92 onto the second insulating layer 91. Then, by bonding the second insulating layer 91 including the second line 93 and a supporting member 95 composed of a glass substrate to each other through an adhesion layer 94. Thereby, the GaN-based semiconductor light-emitting element 1 can be fixed to the supporting member 95. Next, for example, excimer laser is applied from the back surface side of the second temporary fixing substrate. Thus, laser ablation is caused so that the GaN-based semiconductor light-emitting element 1 irradiated with excimer laser is detached from the second temporary fixing substrate. At this stage, the first electrode 31 of the GaN-based semiconductor light-emitting element 1 is exposed. Next, a first insulating layer 96 is formed over the entire surface, and an opening 97 is formed in the first insulating layer 96 above the first electrode 31 of the GaN-based semiconductor light-emitting element 1. A first line 98 is formed on the first electrode so as to extend from the opening 97 onto the first insulating layer 96. FIG. 6 is a schematic partial cross-sectional view showing this state. Then, by connecting the first line and the second line to driving circuits by an appropriate method, a light-emitting element assembly can be obtained, or an image display apparatus (light-emitting diode display apparatus) can be completed. The GaN-based semiconductor light-emitting element 1 has a flip-chip structure, and light generated by the active layer 23 is emitted in the lower direction in FIG. 6.

Examples of the image display apparatus of Example 3 include image display apparatuses having the structures described below. Unless otherwise specified, the number of GaN-based semiconductor light-emitting elements constituting an image display apparatus or a light-emitting element panel may be determined on the basis of the specifications of the image display apparatus. Furthermore, the GaN-based semiconductor light-emitting element constituting an image display apparatus or a light-emitting element panel may be any one of the GaN-based semiconductor light-emitting elements described in Examples 1 and 2, or may be the light-emitting element assembly of Example 3. In the latter case, the GaN-based semiconductor light-emitting element 1 in the following description may be interpreted as a light-emitting element assembly.

(1A) Image Display Apparatus Having a First Structure—A

A passive matrix-type, direct-view-type image display apparatus including (α) a light-emitting element panel 200 having GaN-based semiconductor light-emitting elements 1 arranged in a two-dimensional matrix, in which the emission state of each of the GaN-based semiconductor light-emitting elements 1 is directly visually observed by controlling the emission/non-emission state of each GaN-based semiconductor light-emitting element 1 to display an image.

Figure 12A:
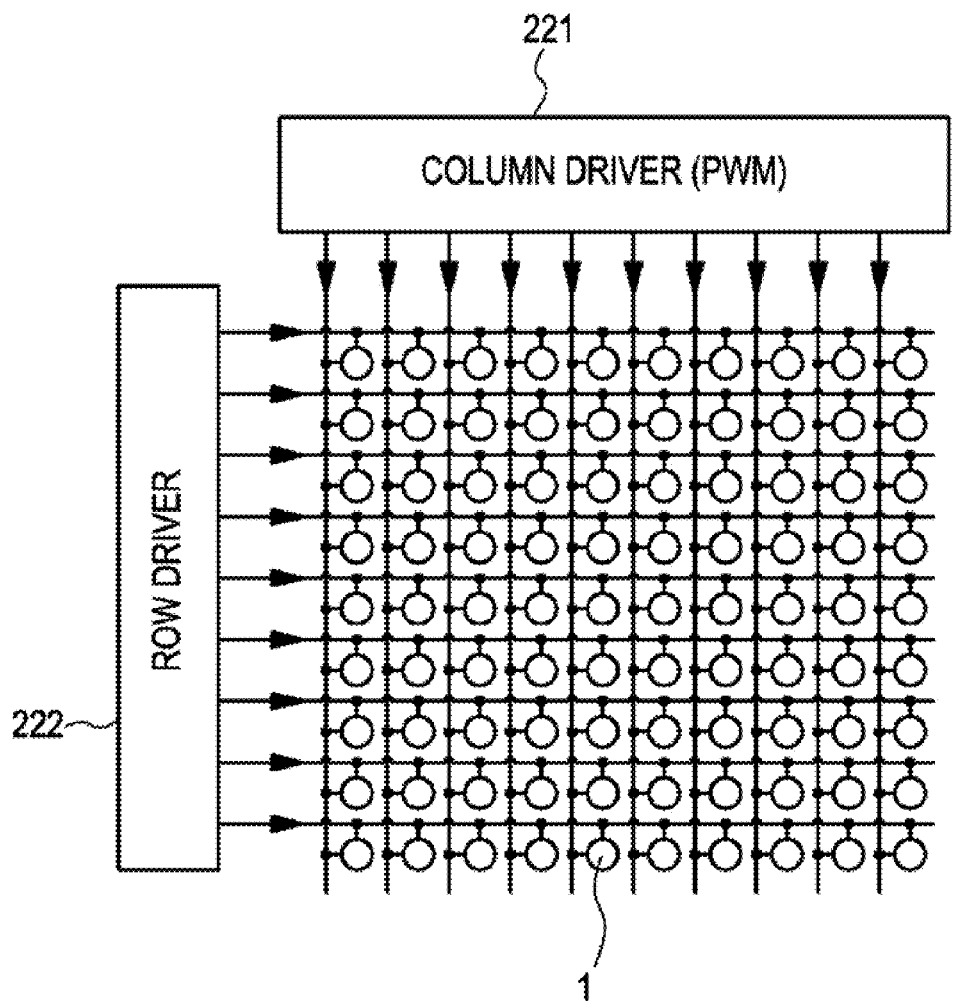
FIG. 12A shows a circuit diagram of a passive matrix-type, direct-view-type image display apparatus (image display apparatus having a first structure—A) in Example 6.
Figure 12B:
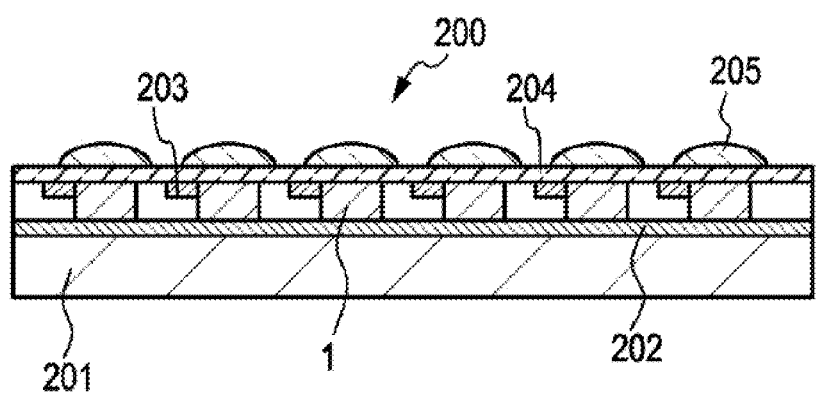
FIG. 12B is a schematic cross-sectional view showing a light-emitting element panel in which GaN-based semiconductor light-emitting elements are arranged in a two-dimensional matrix.

FIG. 12A shows a circuit diagram including a light-emitting element panel 200 constituting such a passive matrix-type, direct-view-type image display apparatus, and FIG. 12B is a schematic cross-sectional view showing the light-emitting element panel 200 in which GaN-based semiconductor light-emitting elements 1 are arranged in a two-dimensional matrix. One electrode (second electrode or first electrode) of each GaN-based semiconductor light-emitting element 1 is connected to a column driver 221, and the other electrode (first electrode or second electrode) is connected to a row driver 222. The emission/non-emission state of each GaN-based semiconductor light-emitting element 1 is controlled, for example, by the row driver 222, and a driving current for driving each GaN-based semiconductor light-emitting element 1 is supplied from the column driver 221. Selection and driving of the individual GaN-based semiconductor light-emitting elements 1 can be performed by common methods, and the description thereof will be omitted.

The light-emitting element panel 200 includes a support 201, for example, composed of a printed circuit board, (in some cases, corresponding to the supporting member 95); GaN-based semiconductor light-emitting elements 1 mounted on the support 201; X-direction lines 202 which are disposed on the support 201, electrically connected to one electrode (second electrode or first electrode) of the respective GaN-based semiconductor light-emitting elements 1, and connected to the column driver 221 or the row driver 222; Y-direction lines 203 which are electrically connected to the other electrode (first electrode or second electrode) of the respective GaN-based semiconductor light-emitting elements 1, and connected to the row driver 222 or the column driver 221; a transparent base member 204 which covers the GaN-based semiconductor light-emitting elements 1; and microlenses 205 provided on the transparent base member 204. However, it is to be understood that the light-emitting element panel 200 is not limited to the structure described above.

(1B) Image Display Apparatus Having the First Structure—B

An active matrix-type, direct-view-type image display apparatus including (α) a light-emitting element panel having GaN-based semiconductor light-emitting elements 1 arranged in a two-dimensional matrix, in which the emission state of each of the GaN-based semiconductor light-emitting elements 1 is directly visually observed by controlling the emission/non-emission state of each GaN-based semiconductor light-emitting element 1 to display an image.

Figure 13:
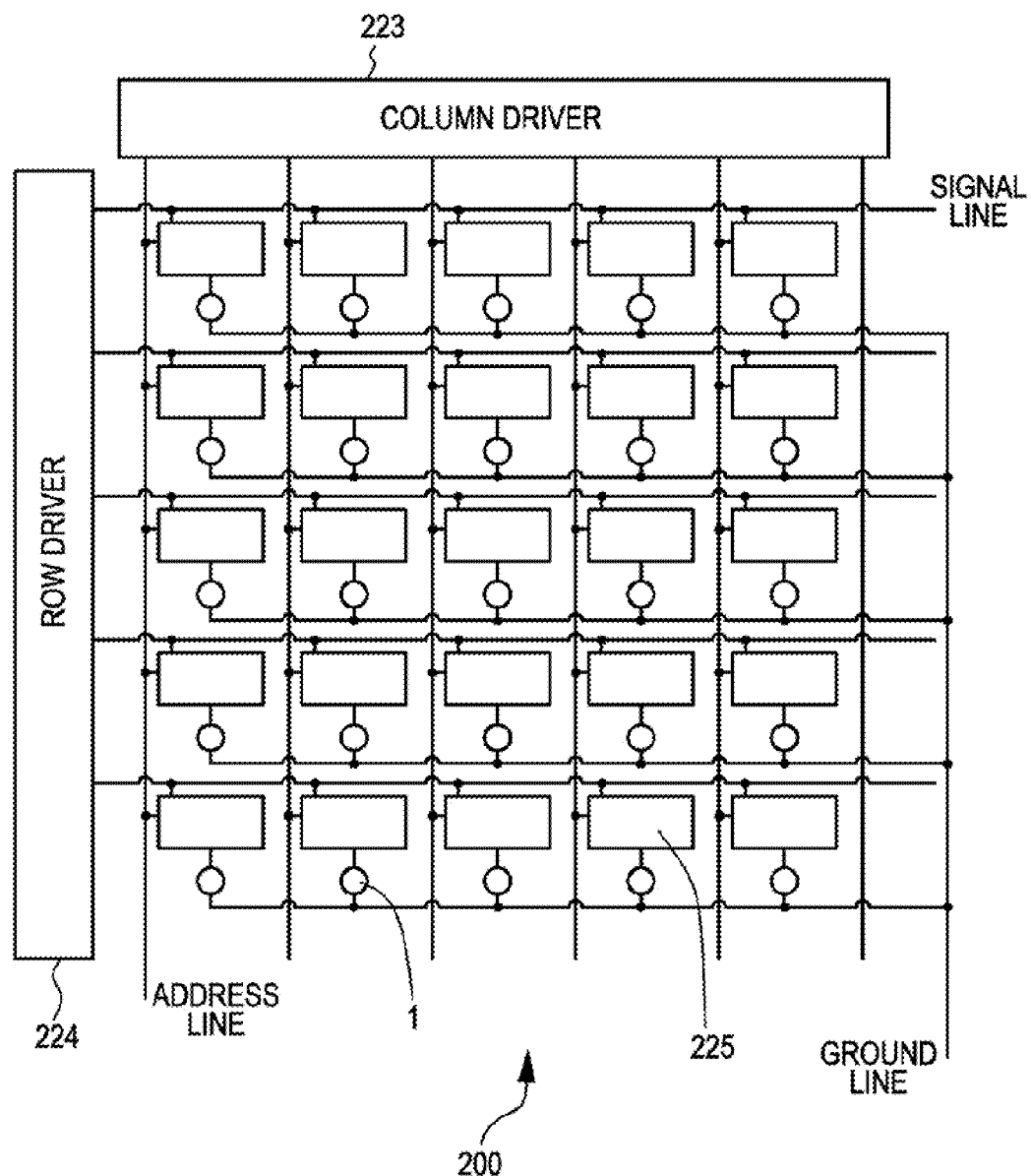
FIG. 13 is a circuit diagram of an active matrix-type, direct-view-type image display apparatus (image display apparatus having a first structure—B) in Example 6.

FIG. 13 shows a circuit diagram including a light-emitting element panel 200 constituting such an active matrix-type, direct-view-type image display apparatus. One electrode (second electrode or first electrode) of each GaN-based semiconductor light-emitting element 1 is connected to a driver 225, and the driver 225 is connected to a column driver 223 and a row driver 224. The other electrode (first electrode or second electrode) of each GaN-based semiconductor light-emitting element 1 is connected to a ground line. The emission/non-emission state of each GaN-based semiconductor light-emitting element 1 is controlled by selection of the driver 225, for example, by the row driver 224, and a luminance signal for driving each GaN-based semiconductor light-emitting element 1 is supplied from the column driver 223 to the corresponding driver 225. A predetermined voltage is supplied from a power supply (not shown) to each driver 225, and the driver 225 supplies a driving current (PDM-controlled or PWM-controlled) in response to the luminance signal to the corresponding GaN-based semiconductor light-emitting element 1. Selection and driving of the individual GaN-based semiconductor light-emitting elements 1 can be performed by common methods, and the description thereof will be omitted.

(2) Image Display Apparatus Having a Second Structure

A passive matrix-type or active matrix-type, projection-type image display apparatus including (α) a light-emitting element panel 200 having GaN-based semiconductor light-emitting elements 1 arranged in a two-dimensional matrix, in which the emission/non-emission state of each GaN-based semiconductor light-emitting element 1 is controlled to display an image by projection on a screen.

Figure 14:
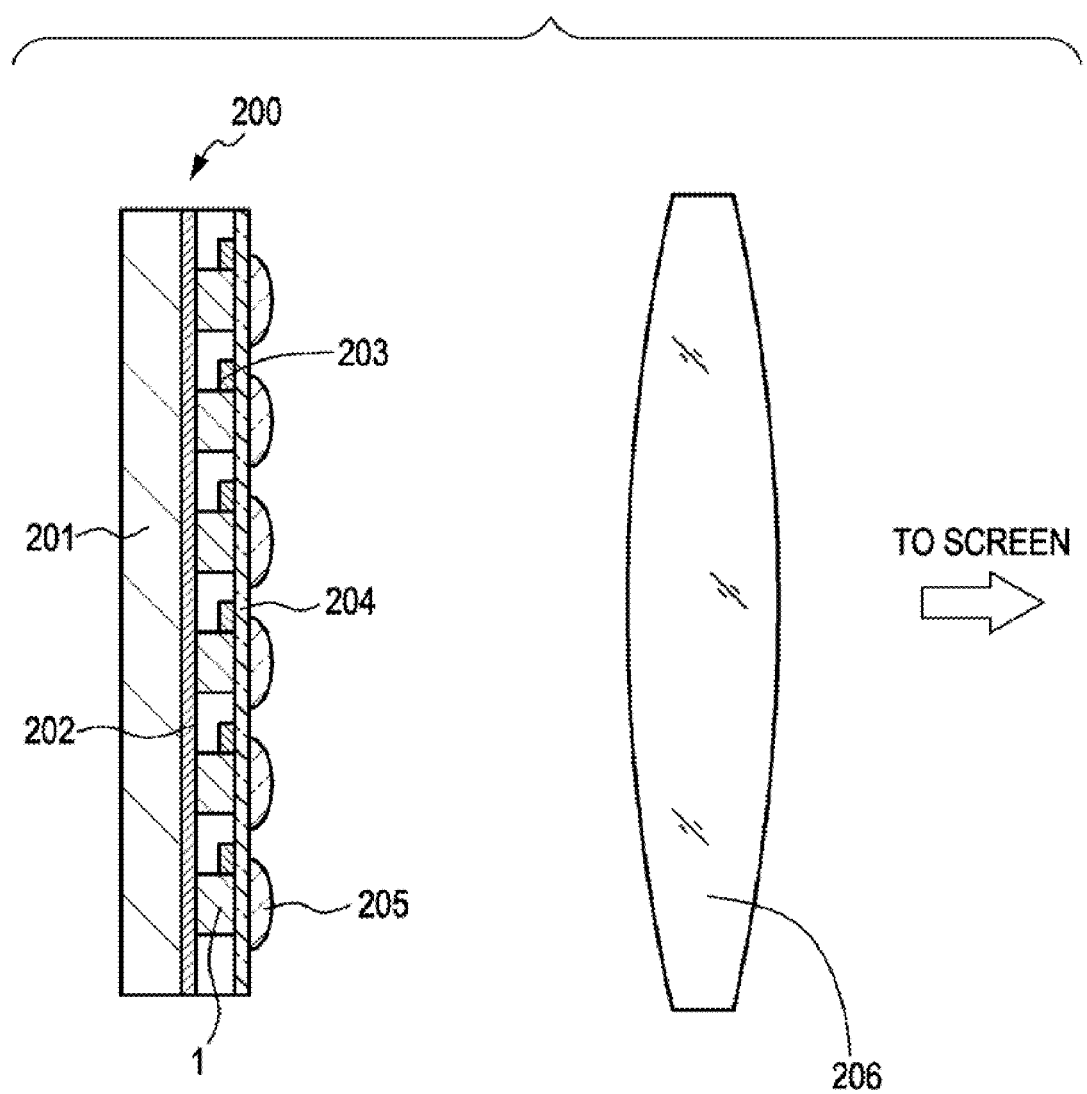
FIG. 14 is a conceptual diagram showing a projection-type image display apparatus (image display apparatus having a second structure) including a light-emitting element panel having GaN-based semiconductor light-emitting elements arranged in a two-dimensional matrix.

The circuit diagram including a light-emitting element panel constituting such a passive matrix-type image display apparatus is similar to that shown in FIG. 12A, and the circuit diagram including a light-emitting element panel constituting an active matrix-type image display apparatus is similar to that shown in FIG. 13. Thus, the detailed description will be omitted. FIG. 14 is a conceptual diagram showing the light-emitting element panel 200 having GaN-based semiconductor light-emitting elements 1 arranged in a two-dimensional matrix, etc. Light emitted from the light-emitting element panel 200 passes through a projector lens 206 and is projected on a screen. The structure and configuration of the light-emitting element panel 200 are the same as the structure and configuration of the light-emitting element panel 200 described with reference to FIG. 12B. Thus, the detailed description thereof will be omitted.

(3) Image Display Apparatus Having a Third Structure

A color image display apparatus (direct-view-type or projection-type) including (α) a red light-emitting element panel 200R having red light-emitting semiconductor light-emitting elements R (e.g., AlGaInP-based semiconductor light-emitting elements or GaN-based semiconductor light-emitting elements 1R) arranged in a two-dimensional matrix; (β) a green light-emitting element panel 200G having green light-emitting GaN-based semiconductor light-emitting elements 1G arranged in a two-dimensional matrix; (γ) a blue light-emitting element panel 200B having blue light-emitting GaN-based semiconductor light-emitting elements 1B arranged in a two-dimensional matrix; and (δ) a device which collects the light emitted from the red light-emitting element panel 200R, the green light-emitting element panel 200G, and the blue light-emitting element panel 200B in an optical path (e.g., a dichroic prism 207), in which the emission/non-emission state of each of the red light-emitting semiconductor light-emitting elements R, the green light-emitting GaN-based semiconductor light-emitting elements 1G, and the blue light-emitting GaN-based semiconductor light-emitting elements 1B is controlled.

Figure 15:
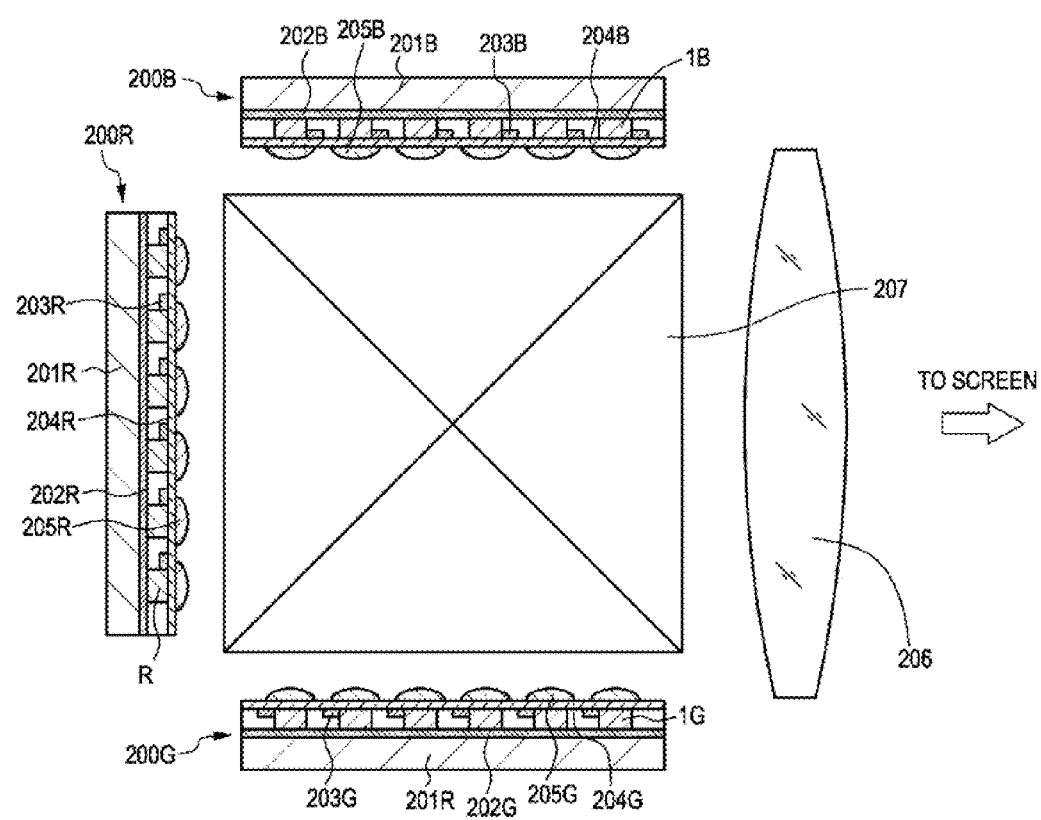
FIG. 15 is a conceptual diagram showing a projection-type color image display apparatus (image display apparatus having a third structure) including a red light-emitting element panel, a green light-emitting element panel, and a blue light-emitting element panel.

The circuit diagram including a light-emitting element panel constituting such a passive matrix-type image display apparatus is similar to that shown in FIG. 12A, and the circuit diagram including a light-emitting element panel constituting an active matrix-type image display apparatus is similar to that shown in FIG. 13. Thus, the detailed description will be omitted. FIG. 15 is a conceptual diagram showing the light-emitting element panels 200R, 200G, and 200B having GaN-based semiconductor light-emitting elements R, 1G, and 1B, respectively, arranged in a two-dimensional matrix, etc. Light emitted from each of the light-emitting element panel 200R, 200G, and 200B enters the dichroic prism 207, and the optical paths of the individual light beams are integrated into an optical path. The resulting light is directly visually observed in the case of a direct-view-type image display apparatus, or the resulting light passes through a projector lens 206 and is projected on a screen in the case of a projection-type image display apparatus. The structure and configuration of each of the light-emitting element panels 200R, 200G, and 200B are the same as the structure and configuration of the light-emitting element panel 200 described with reference to FIG. 12B. Thus, the detailed description thereof will be omitted.

In such an image display apparatus, desirably, the GaN-based semiconductor light-emitting elements 1 described in Example: 1 or 2 are used as the semiconductor light-emitting elements R, 1G, and 1B constituting the light-emitting element panels 200R, 200G, and 200B, respectively. In some cases, AlInGaP-based compound semiconductor light-emitting diodes may be used, for example, as the semiconductor light-emitting elements R constituting the light-emitting element panel 200R, and the GaN-based semiconductor light-emitting elements 1 described in Example 1 or 2 may be used as the GaN-based semiconductor light-emitting elements 1G and 1B constituting the light-emitting element panels 200G and 200B, respectively.

(4) Image Display Apparatus Having a Fourth Structure

An image display apparatus (direct-view-type or projection-type) including (α) a GaN-based semiconductor light-emitting element 1 and (β) a light transmission controller (e.g., a liquid crystal display device 208 having a high-temperature polysilicon-type thin-film transistor; hereinafter the same) which is a light valve for controlling transmission/non-transmission of light emitted from the GaN-based semiconductor light-emitting element 1, in which transmission/non-transmission of light emitted from the GaN-based semiconductor light-emitting element 1 is controlled by the liquid crystal display device 208 which is the light transmission controller to display an image.

Figure 16:
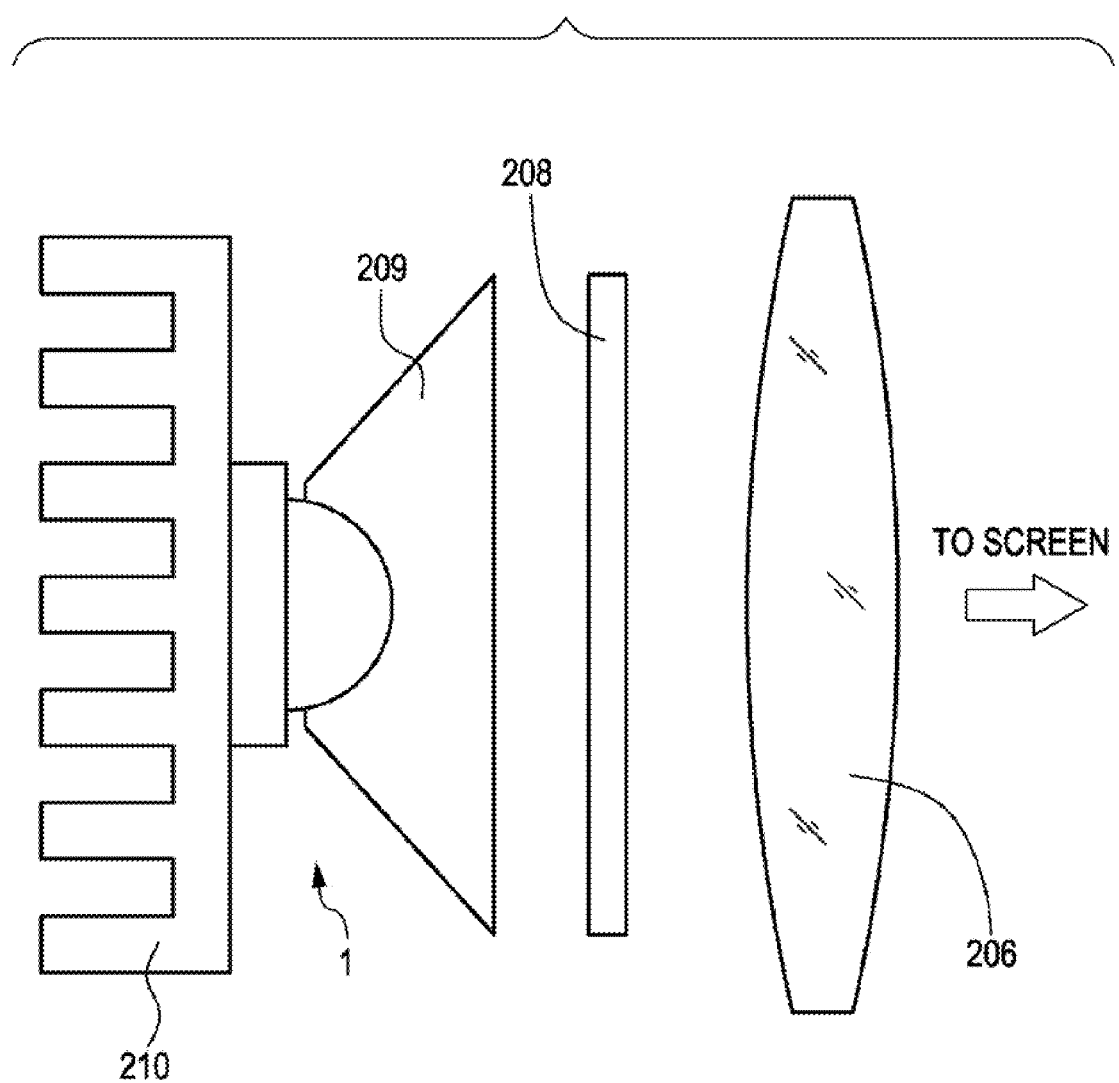
FIG. 16 is a conceptual diagram showing a projection-type image display apparatus (image display apparatus having a fourth structure) including a GaN-based semiconductor light-emitting element and a light transmission controller.

The number of GaN-based semiconductor light-emitting elements may be determined on the basis of the specifications of the image display apparatus, and may be one or two or more. FIG. 16 is a conceptual diagram showing an example of an image display apparatus. In this example, the number of GaN-based semiconductor light-emitting elements 1 is one, and the GaN-based semiconductor light-emitting element 1 is fixed to a heat sink 210. Light emitted from the GaN-based semiconductor light-emitting element 1 is guided by a light-guiding member 209 including an optical guide member composed of a light-transmissive material, such as a silicone resin, an epoxy resin, or a polycarbonate resin, and a reflector, such as a mirror, and is allowed to be incident on the liquid crystal display device 208, Light emitted from the liquid crystal display device 208 is directly visually observed in the case of a direct-view-type image display apparatus, or light emitted from the liquid crystal display device 208 passes through a projector lens 206 and is projected on a screen in the case of a projection-type image display apparatus. As the GaN-based semiconductor light-emitting element 1, any of the GaN-based semiconductor light-emitting elements described in Examples 1 and 2 can be used.

Figure 17:
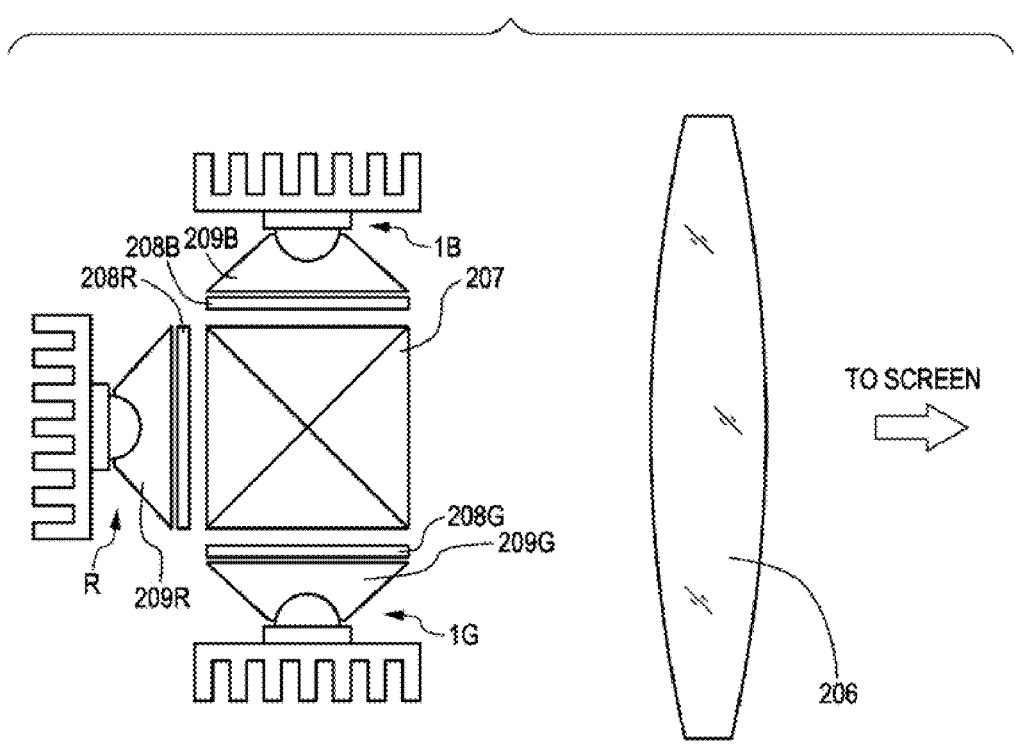
FIG. 17 is a conceptual diagram showing a projection-type color image display apparatus (image display apparatus having a fourth structure) including three sets of a GaN-based semiconductor light-emitting element and three sets of a light transmission controller.

By designing an image display apparatus which includes a red light-emitting semiconductor light-emitting element R (e.g., an AlGaInP-based semiconductor light-emitting element or a GaN-based semiconductor light-emitting element 1R), and a light transmission controller (e.g., a liquid crystal display device 208R) which is a light valve for controlling transmission/non-transmission of light emitted from the red light-emitting semiconductor light-emitting element R; a green light-emitting GaN-based semiconductor light-emitting element 1G, and a light transmission controller (e.g., a liquid crystal display device 208G) which is a light valve for controlling transmission/non-transmission of light emitted from the green light-emitting GaN-based semiconductor light-emitting element 1G; a blue light-emitting GaN-based semiconductor light-emitting element 1B, and a light transmission controller (e.g., a liquid crystal display device 208B) which is a light valve for controlling transmission/non-transmission of light emitted from the blue light-emitting GaN-based semiconductor light-emitting element 1B; light-guiding members 209R, 209G, and 209B which guide light emitted from the GaN-based semiconductor light-emitting elements R, 1G, and 1B, respectively; and a device which collects light in an optical path, a direct-view-type or projection-type color image display apparatus can be obtained. FIG. 17 is a conceptual diagram showing an example of a projection-type color image display apparatus.

In such an image display apparatus, desirably, the GaN-based semiconductor light-emitting elements described in Example 1 or Example 2 are used as the semiconductor light-emitting elements R, 1G, and 1B. In some cases, an AlInGaP-based compound semiconductor light-emitting diode may be used, for example, as the semiconductor light-emitting element R, and the GaN-based semiconductor light-emitting elements described in Example 1 or 2 may be used as the semiconductor light-emitting elements 1G and 1B.

(5) Image Display Apparatus Having a Fifth Structure

An image display apparatus (direct-view-type or projection-type) including (α) a light-emitting element panel 200 having GaN-based semiconductor light-emitting elements arranged in a two-dimensional matrix and (β) a light transmission controller (liquid crystal display device 208) which controls transmission/non-transmission of light emitted from the GaN-based semiconductor light-emitting elements 1, in which transmission/non-transmission of light emitted from the GaN-based semiconductor light-emitting elements 1 is controlled by the light transmission controller (liquid crystal display device 208) to display an image.

Figure 18:
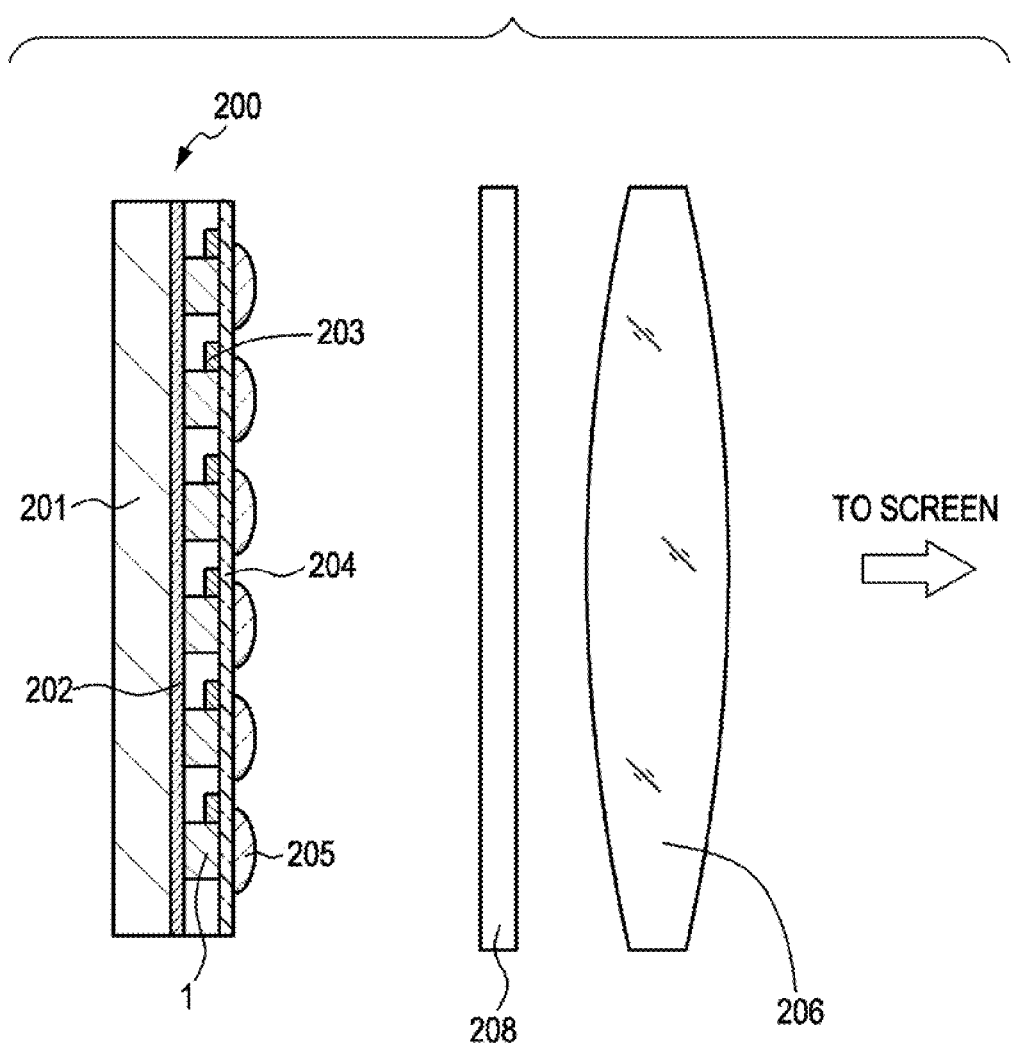
FIG. 18 is a conceptual diagram showing a projection-type image display apparatus (image display apparatus having a fifth structure) including a light-emitting element panel and a light transmission controller.

FIG. 18 is a conceptual diagram showing the light-emitting element panel 200, etc. The structure and configuration of the light-emitting element panel 200 are the same as the structure and configuration of the light-emitting element panel 200 described with reference to FIG. 12B. Thus, the detailed description thereof will be omitted. Since transmission/non-transmission and brightness of light emitted from the light-emitting element panel 200 are controlled by the operation of the liquid crystal display device 208, GaN-based semiconductor light-emitting elements 1 constituting the light-emitting element panel 200 may be constantly turned on or may be turned on and off repeatedly in an appropriate cycle. Light emitted from the light-emitting element panel 200 enters the liquid crystal display device 208. Light emitted from the liquid crystal display device 208 is directly visually observed in the case of a direct-view-type image display apparatus, or light emitted from the liquid crystal display device 208 passes through a projector lens 206 and is projected on a screen in the case of a projection-type image display apparatus.

(6) Image Display Apparatus Having a Sixth Structure

A color image display apparatus (direct-view-type or projection-type) including (α) a red light-emitting element panel 200R having red light-emitting semiconductor light-emitting elements R (e.g., AlGaInP-based semiconductor light-emitting elements or GaN-based semiconductor light-emitting elements 1R) arranged in a two-dimensional matrix, and a red light transmission controller (liquid crystal display device 208R) which controls transmission/non-transmission of light emitted from the red light-emitting element panel 200R; (β) a green light-emitting element panel 200G having green light-emitting GaN-based semiconductor light-emitting elements 1G arranged in a two-dimensional matrix, and a green light transmission controller (liquid crystal display device 208G) which controls transmission/non-transmission of light emitted from the green light-emitting element panel 200G; (γ) a blue light-emitting element panel 200B having blue light-emitting GaN-based semiconductor light-emitting elements 1B arranged in a two-dimensional matrix, and a blue light transmission controller (liquid crystal display device 208B) which controls transmission/non-transmission of light emitted from the blue light-emitting element panel 200B; and (δ) a device (e.g., dichroic prism 207) which collects the light transmitted through the red light transmission controller 208R, the green light transmission controller 208G, and the blue light transmission controller 208G in an optical path, in which the transmission/non-transmission of light emitted from the light-emitting element panels 200R, 200G, and 200B is controlled by the corresponding light transmission controllers 208R, 208G, and 208B to display an image.

Figure 19:
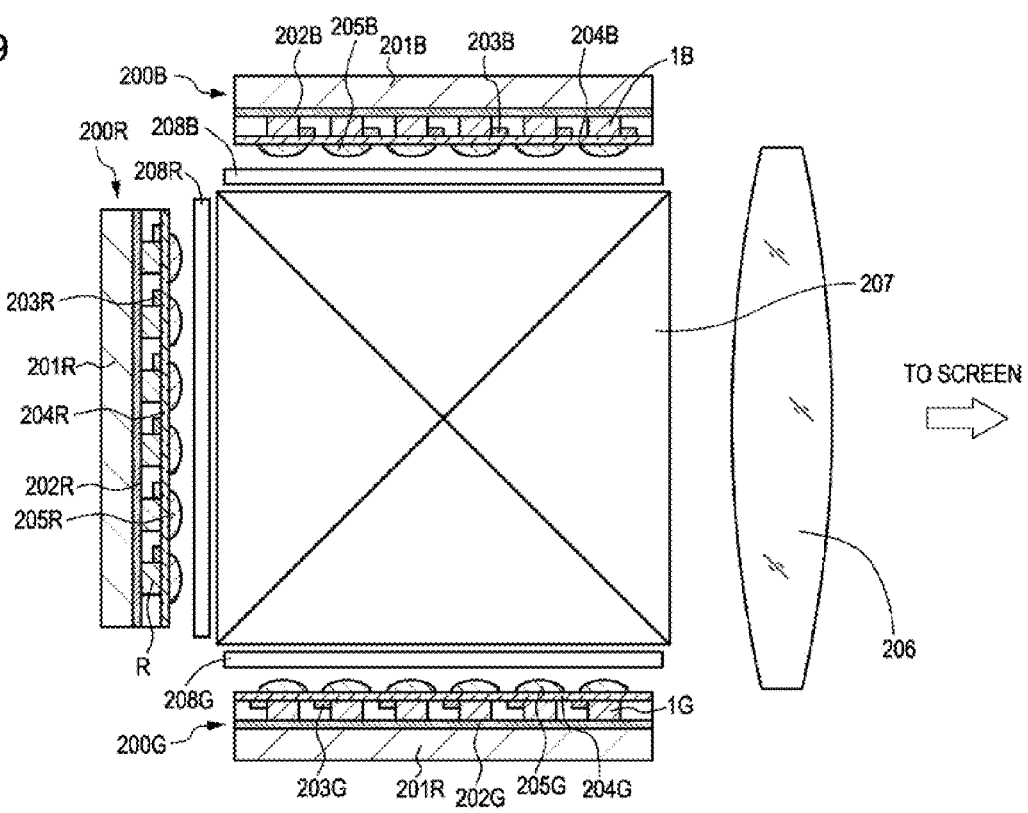
FIG. 19 is a conceptual diagram showing a projection-type color image display apparatus (image display apparatus having a sixth structure) including three sets of a GaN-based semiconductor light-emitting element and three sets of a light transmission controller.

FIG. 19 is a conceptual diagram showing the light-emitting element panels 200R, 200G, and 200B having GaN-based semiconductor light-emitting elements R, 1G, and 1B, respectively, arranged in a two-dimensional matrix, etc. Light emitted from the light-emitting element panel 200R, 200G, and 200B, the transmission/non-transmission of which are controlled by the light transmission controllers 208R, 208G, 208B, respectively, enters the dichroic prism 207. The optical paths of the individual light beams are integrated into an optical path. The resulting light is directly visually observed in the case of a direct-view-type image display apparatus, or the resulting light passes through a projector lens 206 and is projected on a screen in the case of a projection-type image display apparatus. The structure and configuration of each of the light-emitting element panels 200R, 200G, and 200B are the same as the structure and configuration of the light-emitting element panel 200 described with reference to FIG. 12B. Thus, the detailed description thereof will be omitted.

In such an image display apparatus, desirably, the GaN-based semiconductor light-emitting elements 1 described in Example 1 or 2 are used as the semiconductor light-emitting elements R, 1G, and 1B constituting the light-emitting element panels 200R, 200G, and 200B, respectively. In some cases, AlInGaP-based compound semiconductor light-emitting diodes may be used, for example, as the semiconductor light-emitting elements R constituting the light-emitting element panel 200R, and the GaN-based semiconductor light-emitting elements 1 described in Example 1 or Example 2 may be used as the GaN-based semiconductor light-emitting elements 1G and 1B constituting the light-emitting element panels 200G and 200B, respectively.

(7) Image Display Apparatus Having a Seventh Structure

A field-sequential color image display apparatus (direct-view-type or projection-type) including (α) a red light-emitting semiconductor light-emitting element R (e.g., AlGaInP-based semiconductor light-emitting element or GaN-based semiconductor light-emitting element 1R); (β) a green light-emitting GaN-based semiconductor light-emitting element 1G; (γ) a blue light-emitting GaN-based semiconductor light-emitting element 1B; (δ) a device (e.g., dichroic prism 207) which collects the light emitted from the red light-emitting semiconductor light-emitting element R, the green light-emitting GaN-based semiconductor light-emitting element 1G, and the blue light-emitting GaN-based semiconductor light-emitting element 1B in an optical path; and (∈) a light transmission controller (liquid crystal display device 208) which controls transmission/non-transmission of light emitted from the device (dichroic prism 207) which collects the light in the optical path, in which the transmission/non-transmission of light emitted from each of the light-emitting elements is controlled by the light transmission controller 208 to display an image.

Figure 20:
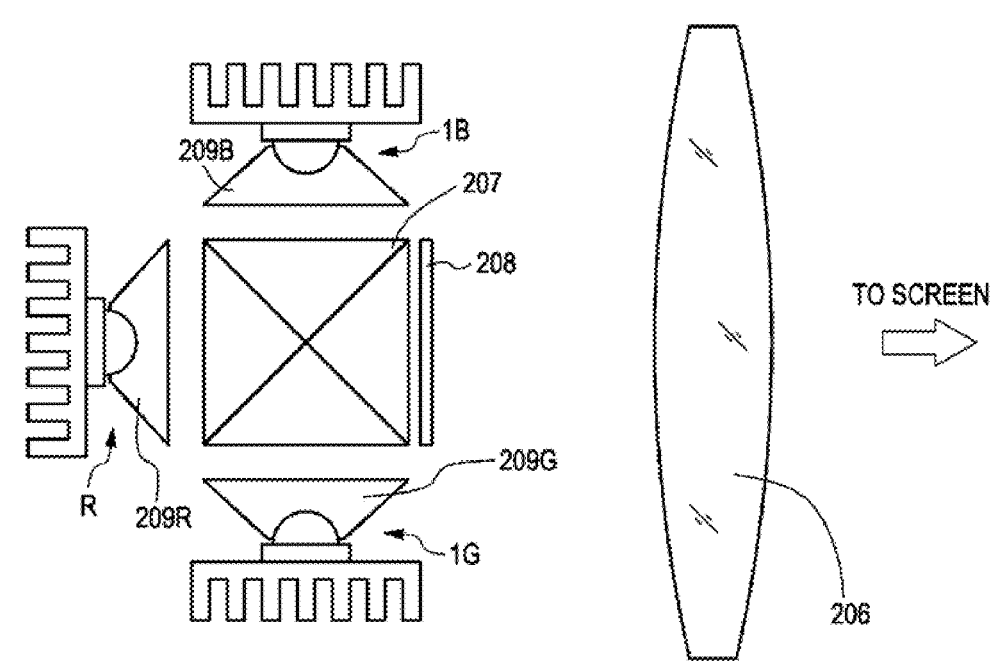
FIG. 20 is a conceptual diagram showing a projection-type color image display apparatus (image display apparatus having a seventh structure) including three sets of a GaN-based semiconductor light-emitting element and a light transmission controller.

FIG. 20 is a conceptual diagram showing the semiconductor light-emitting elements R, 1G, and 1B, etc. Light emitted from each of the semiconductor light-emitting elements R, 1G, and 1B enters the dichroic prism 207, and the optical paths of the individual light beams are integrated into an optical path. The resulting light is directly visually observed in the case of a direct-view-type image display apparatus, or the resulting light passes through a projector lens 206 and is projected on a screen in the case of a projection-type image display apparatus. In such an image display apparatus, desirably, the GaN-based semiconductor light-emitting elements 1 described in Example 1 or 2 are used as the semiconductor light-emitting elements R, 1G, and 1B. In some cases, an AlInGaP-based compound semiconductor light-emitting diode may be used, for example, as the semiconductor light-emitting element R, and the GaN-based semiconductor light-emitting elements 1 described in Example 1 or 2 may be used as the GaN-based semiconductor light-emitting elements 1G and 1B.

(8) Image Display Apparatus Having an Eighth Structure

A field-sequential color image display apparatus (direct-view-type or projection-type) including (α) a red light-emitting element panel 200R having red light-emitting semiconductor light-emitting elements R (e.g., AlGaInP-based semiconductor light-emitting elements or GaN-based semiconductor light-emitting elements 1R) arranged in a two-dimensional matrix; (β) a green light-emitting element panel 200G having green light-emitting GaN-based semiconductor light-emitting elements 1G arranged in a two-dimensional matrix; (γ) a blue light-emitting element panel 200B having blue light-emitting GaN-based semiconductor light-emitting elements 1B arranged in a two-dimensional matrix; (δ) a device (e.g., dichroic prism 207) which collects the light emitted from the red light-emitting element panel 200R, the green light-emitting element panel 200G, and the blue light-emitting element panel 200B in an optical path; and (∈) a light transmission controller (liquid crystal display device 208) which controls transmission/non-transmission of light emitted from the device (dichroic prism 207) which collects the light in the optical path, in which the transmission/non-transmission of light emitted from each of the light-emitting element panels 200R, 200G, and 200B is controlled by the light transmission controller 208 to display an image.

Figure 21:
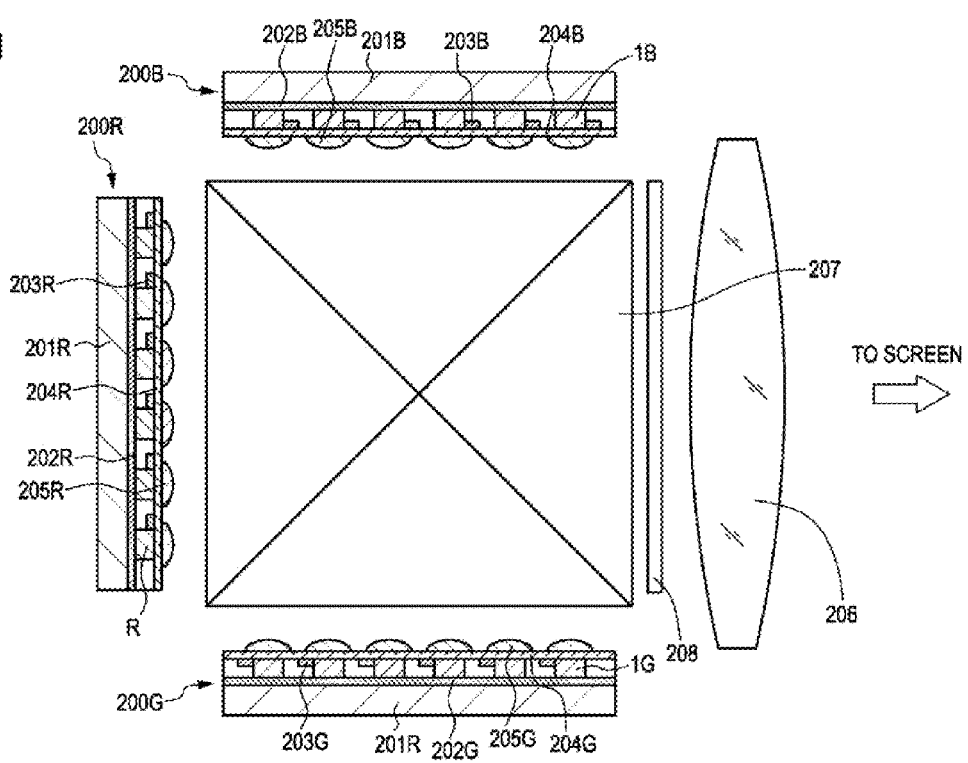
FIG. 21 is a conceptual diagram showing a projection-type color image display apparatus (image display apparatus having an eighth structure) including three sets of a light-emitting element panel and a light transmission controller.

FIG. 21 is a conceptual diagram showing the light-emitting element panels 200R, 200G, and 200B having GaN-based semiconductor light-emitting elements R, 1G, and, 1B, respectively, arranged in a two-dimensional matrix, etc. Light emitted from the light-emitting element panel 200R, 200G, and 200B enters the dichroic prism 207. The optical paths of the individual light beams are integrated into an optical path. The transmission/non-transmission of the light emitted from the dichroic prism 207 is controlled by the light transmission controller 208. The resulting light is directly visually observed in the case of a direct-view-type image display apparatus, or the resulting light passes through a projector lens 206 and is projected on a screen in the case of a projection-type image display apparatus. The structure and configuration of each of the light-emitting element panels 200R, 200G, and 200B are the same as the structure and configuration of the light-emitting element panel 200 described with reference to FIG. 12B. Thus, the detailed description thereof will be omitted.

In such an image display apparatus, desirably, the GaN-based semiconductor light-emitting elements 1 described in Example 1 or 2 are used as the semiconductor light-emitting elements R, 1G, and 1B constituting the light-emitting element panels 200R, 200G, and 200B, respectively. In some cases, AlInGaP-based compound semiconductor light-emitting diodes may be used, for example, as the semiconductor light-emitting elements R constituting the light-emitting element panel 200R, and the GaN-based semiconductor light-emitting elements 1 described in Example 1 or 2 may be used as the GaN-based semiconductor light-emitting elements 1G and 1B constituting the light-emitting element panels 200G and 200B, respectively.

Example 4

Example 4 also relates to image display apparatuses according to the first embodiment and the second embodiment. An image display apparatus of Example 4 includes light-emitting element units UN for displaying a color image arranged in a two-dimensional matrix, each light-emitting element unit UN including a blue light-emitting first light-emitting element, a green light-emitting second light-emitting element, and a red light-emitting third light-emitting element. As in Example 3, the GaN-based semiconductor light-emitting element (light-emitting diode) constituting at least one of the first light-emitting element, the second light-emitting element, and the third light-emitting element may have the same basic configuration and structure as those of the GaN-based semiconductor light-emitting element described in Example 1 or 2, or may be the light-emitting element assembly of Example 3. In the latter case, the GaN-based semiconductor light-emitting element 1 in the following description may be interpreted as a light-emitting element assembly. In such an image display apparatus, as any one of the first light-emitting element, the second light-emitting element, and the third light-emitting element, the GaN-based semiconductor light-emitting element 1 described in Example 1 or 2 is used. In some cases, the red light-emitting element may be constituted by an AlInGaP-based compound semiconductor light-emitting diode.

Examples of the image display apparatus of Example 4 include image display apparatuses having the structures described below. The number of light-emitting element units UN may be determined on the basis of the specifications of the image display apparatus.

(1) Image Display Apparatuses Having a Ninth Structure and a Tenth Structure

A passive matrix-type or active matrix-type, direct-view-type color image display apparatus including a first light-emitting element, a second light-emitting element, and a third light-emitting element, in which the emission state of each of the light-emitting elements is directly visually observed by controlling the emission/non-emission state of each light-emitting element to display an image, and a passive matrix-type or active matrix-type, projection-type color image display apparatus including a first light-emitting element, a second light-emitting element, and a third light-emitting element, in which the emission/non-emission state of each of the light-emitting elements is controlled to display an image by projection on a screen.

Figure 22:
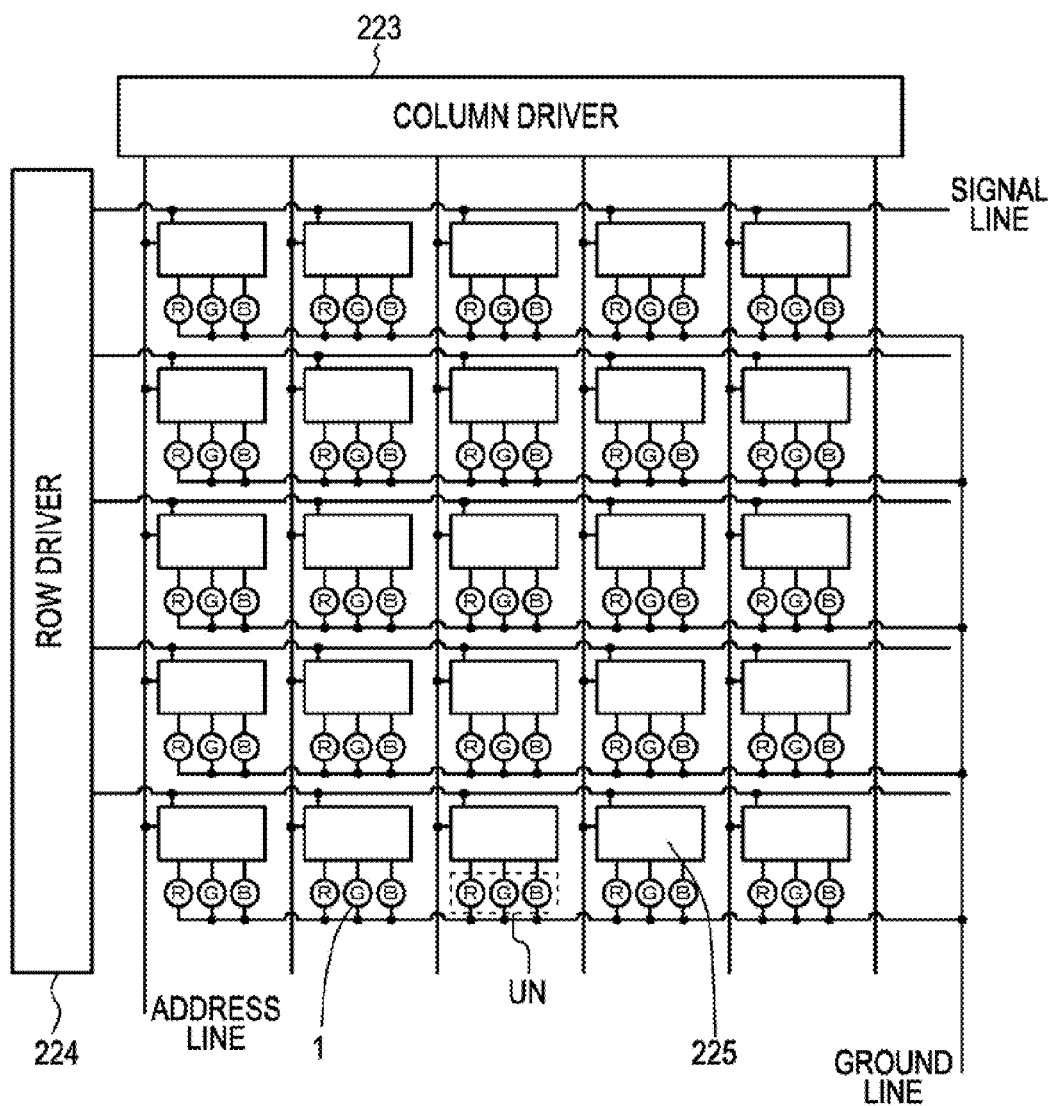
FIG. 22 is a circuit diagram of an active matrix-type, projection-type color image display apparatus (image display apparatus having a ninth or tenth structure) in Example 4.

FIG. 22 is a circuit diagram including a light-emitting element panel constituting such an active matrix-type, direct-view-type color image display apparatus. One electrode (second electrode or first electrode) of each GaN-based semiconductor light-emitting element 1 (in FIG. 22, a red light-emitting semiconductor light-emitting element being represented by "R", a green light-emitting GaN-based semiconductor light-emitting element being represented by "G", and a blue light-emitting GaN-based semiconductor light-emitting element being represented by "B") is connected to the corresponding driver 225, and each driver 225 is connected to a column driver 223 and a row driver 224. The other electrode (first electrode or second electrode) is connected to a ground line. The emission/non-emission state of each GaN-based semiconductor light-emitting element 1 is controlled, for example, by selection of the corresponding driver 225 by the row driver 224, and a luminance signal for driving each GaN-based semiconductor light-emitting element 1 is supplied from the column driver 223 to the corresponding driver 225. A predetermined voltage is supplied from a power supply (not shown) to each driver 225, and the driver 225 supplies a driving current (PDM-controlled or PWM-controlled) in response to the luminance signal to the corresponding GaN-based semiconductor light-emitting element 1. The red light-emitting semiconductor light-emitting element R, the green light-emitting GaN-based semiconductor light-emitting element G, and the blue light-emitting GaN-based semiconductor light-emitting element B are selected by the corresponding driver 225, and red light-emitting semiconductor light-emitting element R, the green light-emitting GaN-based semiconductor light-emitting element G, and the blue light-emitting GaN-based semiconductor light-emitting element B may be controlled by time sharing, or simultaneous light emission may be performed. Selection and driving of the individual GaN-based semiconductor light-emitting elements 1 can be performed by common methods, and the description thereof will be omitted. The resulting light is directly visually observed in the case of a direct-view-type image display apparatus, or the resulting light passes through a projector lens and is projected on a screen in the case of a projection-type image display apparatus.

(2) Image Display Apparatus Having an Eleventh Structure

A field-sequential color image display apparatus (direct-view-type or projection-type) including light-emitting element units arranged in a two-dimensional matrix, and a light transmission controller (e.g., liquid crystal display device) which controls transmission/non-transmission of light emitted from the light-emitting element units, in which the emission/non-emission state of each of a first light-emitting element, a second light-emitting element, and a third light-emitting element in each light-emitting element unit is controlled by time sharing, and the transmission/non-transmission of light emitted from the first light-emitting element, the second light-emitting element, and the third light-emitting element is controlled by the light transmission controller to display an image.

The conceptual diagram of such an image display apparatus is the same as that shown in FIG. 14. The resulting light is directly visually observed in the case of a direct-view-type image display apparatus, or the resulting light passes through a projector lens and is projected on a screen in the case of a projection-type image display apparatus.

Example 5

Example 5 relates to light-emitting apparatuses according to the first embodiment and the second embodiment. A light-emitting apparatus of Example 5 includes any of the GaN-based semiconductor light-emitting elements 1 described in Examples 1 and 2, and a color conversion material which is excited by emitted light from the GaN-based semiconductor light-emitting element 1 to emit light with a different wavelength from that of the emitted light from the GaN-based semiconductor light-emitting element 1. The color conversion material is, for example, applied onto a light-emitting portion of a GaN-based semiconductor light-emitting element 1. Alternatively, the color conversion material in the form of a film is attached to the GaN-based semiconductor light-emitting element 1. In the light-emitting apparatus of Example 5, examples of emitted light from the GaN-based semiconductor light-emitting element 1 include visible light, ultraviolet light, and a combination of visible light and ultraviolet light. The GaN-based semiconductor light-emitting element 1 may be replaced with the light-emitting element assembly of Example 3. In such a case, the GaN-based semiconductor light-emitting element 1 in the following description may be interpreted as a light-emitting element assembly.

In the light-emitting apparatus of Example 5, a structure may be employed in which the light emitted from the GaN-based semiconductor light-emitting element 1 is blue light, and the light emitted from the color conversion material is at least one type of light selected from the group consisting of yellow light, green light, and red light. Alternatively, a structure may be employed in which the light emitted from the GaN-based semiconductor light-emitting element 1 and the light emitted from the color conversion material (e.g., yellow; red and green; yellow and red; or green, yellow, and red) are mixed to emit white light. The structure of the light-emitting apparatus is not limited thereto, and the light-emitting apparatus can also be applied to variable color illumination and displays.

More specifically, in Example 5, emitted light from the GaN-based semiconductor light-emitting element 1 is blue light, emitted light from the color conversion material is yellow light, and the color conversion material is composed of YAG (yttrium-aluminum-garnet)-based fluorescent particles. The emitted light (blue) from the GaN-based semiconductor light-emitting element 1 and the emitted light (yellow) from the color conversion material are mixed to emit white light.

Alternatively, in Example 5, emitted light from the GaN-based semiconductor light-emitting element 1 is blue light, and emitted light from the color conversion material is composed of green light and red light. The emitted light (blue) from the GaN-based semiconductor light-emitting element 1 and the emitted light (green and red) from the color conversion material are mixed to emit white light. In this case, the green-light emitting color conversion material is composed of green light-emitting fluorescent particles, such as $SrGa_2S_4$:Eu, which are excited by blue light emitted from the GaN-based semiconductor light-emitting element 1. The red light-emitting color conversion material is composed of red light-emitting fluorescent particles, such as CaS:Eu, which are excited by blue light emitted from the GaN-based semiconductor light-emitting element 1.

Example 6

Example 6 is an example in which the GaN-based semiconductor light-emitting elements described in Example 1 or 2 are applied to a planar light-source device and a liquid crystal display device assembly (specifically, a color liquid crystal display device assembly). The planar light-source device of Example 6 applies light to a transmissive or semi-transmissive color liquid crystal display device from the back surface side. The color liquid crystal display device assembly of Example 6 includes a transmissive or semi-transmissive color liquid crystal display device and a planar light-source device which applies light to the color liquid crystal display device from the back surface side. GaN-based semiconductor light-emitting elements (light-emitting diodes) 1R, 1G, and 1B provided as light sources in the planar light-source device have the same basic configuration and structure as those of the GaN-based semiconductor light-emitting element described in Example 1 or 2. The GaN-based semiconductor light-emitting elements 1R, 1G, and 1B may be replaced with the light-emitting element assemblies of Example 3. In such a case, the GaN-based semiconductor light-emitting elements 1R, 1G, and 1B in the following description may be interpreted as light-emitting element assemblies.

Figure 23A:
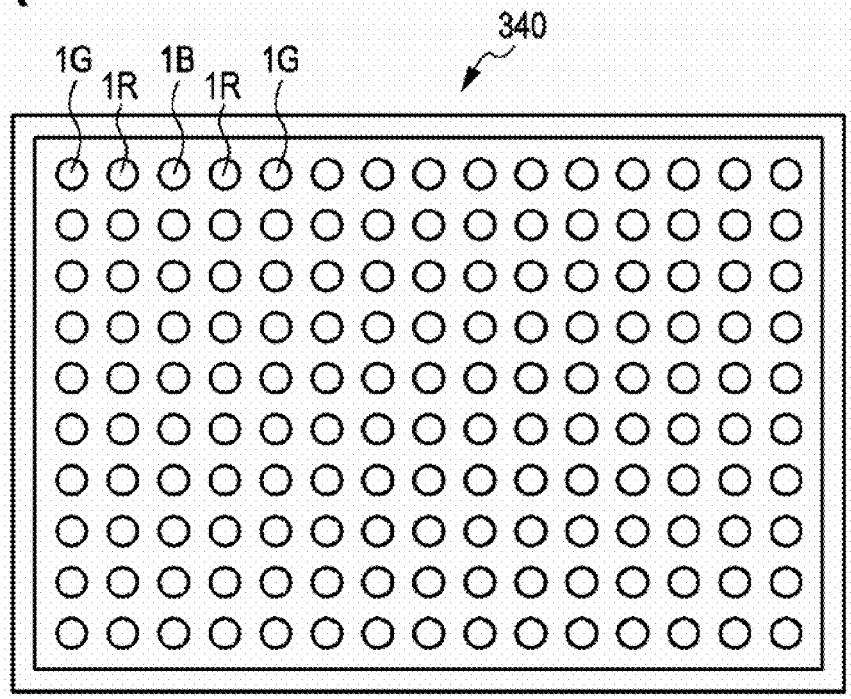
FIG. 23A is a schematic diagram showing the arrangement of light-emitting elements in a planar light-source device of Example 6.
Figure 23B:
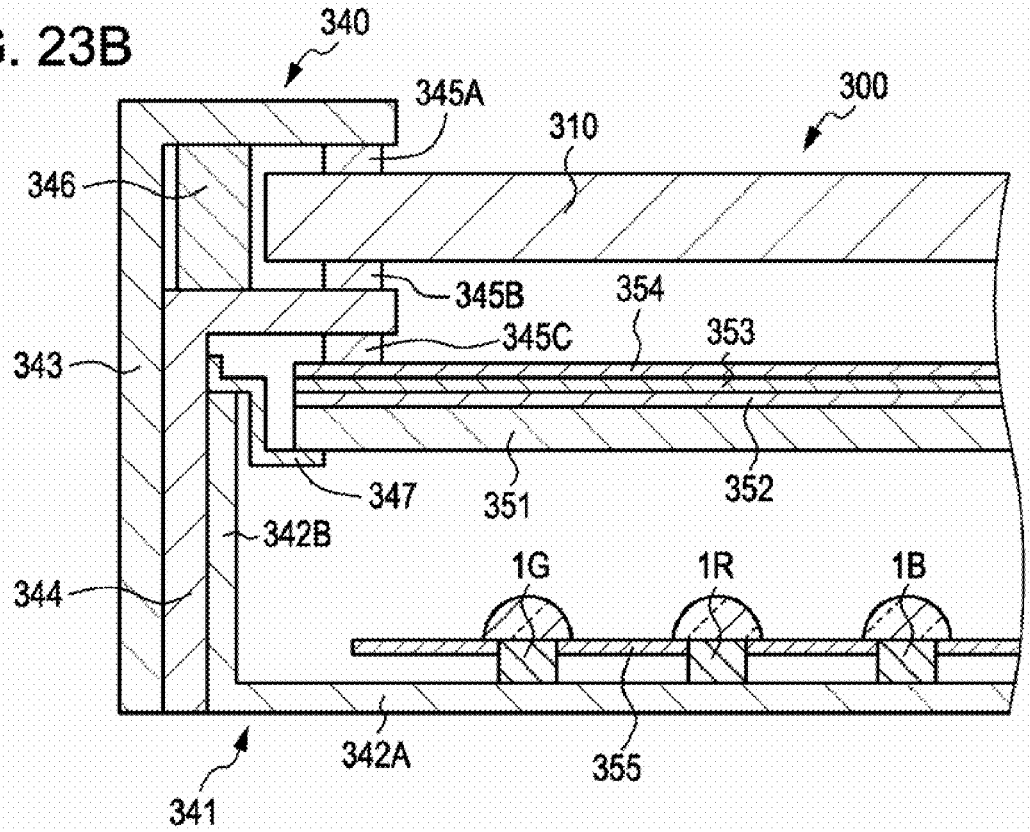
FIG. 23B is a schematic partial cross-sectional view of a planar light-source device and a color liquid crystal display device assembly.
Figure 24:
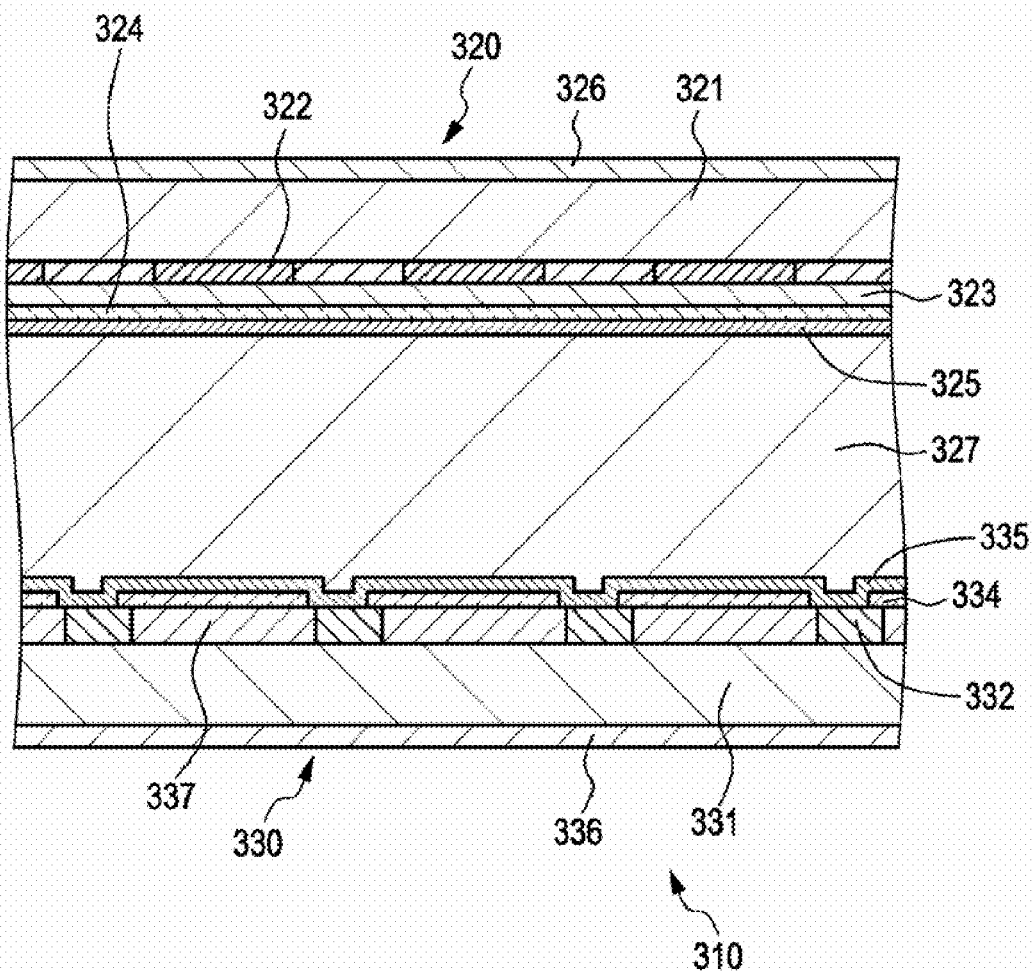
FIG. 24 is a schematic partial cross-sectional view of a color liquid crystal display device.

FIG. 23A schematically shows the arrangement of GaN-based semiconductor light-emitting elements (light-emitting diodes) 1R, 1G, and 1B in a planar light-source device of Example 6. FIG. 23B is a schematic partial cross-sectional view of a planar light-source device and a color liquid crystal display device assembly. FIG. 24 is a schematic partial cross-sectional view of a color liquid crystal display device.

Specifically, a color liquid crystal display device assembly 300 of Example 6 includes a transmissive color liquid crystal display device 310 including (a) a front panel 320 having a transparent first electrode 324, (b) a rear panel 330 having a transparent second electrode 334, and (c) a liquid crystal material 327 placed between the front panel 320 and the rear panel 330; and (d) a planar light-source device (direct-type backlight) 340 having semiconductor light-emitting elements 1R, 1G, and 1B as light sources. The planar light-source device (direct-type backlight) 340 is disposed so as to face the rear panel 330, and applies light from the rear panel side to the color liquid crystal display device 310.

The direct-type planar light-source device 340 includes a housing 341 having an outer frame 343 and an inner frame 344. The end of the transmissive color liquid crystal display device 310 is held so as to be sandwiched between the outer frame 343 and the inner frame 344 through spacers 345A and 345B, respectively. A guiding member 346 is disposed between the outer frame 343 and the inner frame 344 so that the color liquid crystal display device 310 sandwiched between the outer frame 343 and the inner frame 344 is prevented from deviating from the proper position. A diffuser plate 351 is fixed to the inner frame 344 through a spacer 345C and a bracket member 347 at the upper portion in the housing 341. An optical functional sheet group including a diffuser sheet 352, a prism sheet 353, and a polarization conversion sheet 354 is disposed on the diffuser plate 351.

A reflection sheet 355 is provided at the lower portion in the housing 341. The reflection sheet 355 is arranged so that the reflection surface thereof faces the diffuser plate 351, and is fixed to a bottom surface 342A of the housing 341 through a fixing member (not shown). The reflection sheet 355 can be composed of a high-reflection silver film, for example, having a structure in which a silver reflection film, a low-refractive-index film, and a high-refractive-index film are disposed in that order on a sheet substrate. The reflection sheet 355 reflects light emitted from a plurality of red light-emitting GaN-based semiconductor light-emitting elements 1R (or GAlGaInP-based semiconductor light-emitting elements), a plurality of green light-emitting GaN-based semiconductor light-emitting elements 1G, and a plurality of blue light-emitting GaN-based semiconductor light-emitting elements 1B, and light reflected by a side surface 342B of the housing 341. Thus, red light, green light, and blue light emitted from a plurality of semiconductor light-emitting elements 1R, 1G, and 1B are mixed, and white light with high color purity can be obtained as illuminating light. The illuminating light passes through the diffuser plate 351, and the optical functional sheet group including the diffuser sheet 352, the prism sheet 353, and the polarization conversion sheet 354, and is applied to the color liquid crystal display device 310 from the back surface side.

With respect to the arrangement of the light-emitting elements, for example, a plurality of light-emitting element rows are arranged in the horizontal direction to form a light-emitting element row array, each light-emitting element row including a predetermined number of red light-emitting GaN-based semiconductor light-emitting elements 1R (or AlGaInP-based semiconductor light-emitting elements), green light-emitting GaN-based semiconductor light-emitting elements 1G, and blue light-emitting GaN-based semiconductor light-emitting elements 1B, and a plurality of such light-emitting element row arrays are arranged in the vertical direction. The light-emitting element row is, for example, composed of two red light-emitting AlGaInP-based semiconductor light-emitting elements, two green light-emitting GaN-based semiconductor light-emitting elements, and one blue light-emitting GaN-based semiconductor light-emitting element, and a red light-emitting AlGaInP-based semiconductor light-emitting element, a green light-emitting GaN-based semiconductor light-emitting element, a blue light-emitting GaN-based semiconductor light-emitting element, a green light-emitting GaN-based semiconductor light-emitting element, and a red light-emitting AlGaInP-based semiconductor light-emitting element are arranged in that order.

As shown in FIG. 24, the front panel 320 constituting the color liquid crystal display device 310 includes a first substrate 321, for example, composed of a glass substrate, and a polarization film 326 disposed on the outer surface of the first substrate 321. A color filter 322 coated with an overcoat layer 323 composed of an acrylic resin or an epoxy resin is disposed on the inner surface of the first substrate 321, and a transparent first electrode (also referred to as a common electrode, for example, composed of ITO) 324 is disposed on the overcoat layer 323. An alignment layer 325 is disposed on the transparent first electrode 324. Meanwhile, the rear panel 330 includes a second substrate 331, for example composed of a glass substrate, switching elements (specifically, thin-film transistors, TFTs) 332 disposed on the inner surface of the second substrate 331, transparent second electrodes (also referred to as pixel electrodes, for example, composed of ITO) 334, the conduction/non-conduction of the second electrodes being controlled by the switching elements 332, and a polarization film 336 disposed on the outer surface of the second substrate 331. An alignment layer 335 is disposed over the entire surface including the transparent second electrodes 334. The front panel 320 and the rear panel 330 are bonded to each other at the outer peripheries thereof by a sealing member (not shown). The switching elements 332 are not limited to TFTs, and, for example, may be composed of MIM elements. In FIG. 24, reference numeral 337 represents an insulating layer disposed between the switching elements 332.

The various members constituting the transmissive color liquid crystal display device and the liquid crystal material can be composed of commonly used members and materials, and thus the detailed description thereof will be omitted.

Furthermore, by dividing the planar light-source device into a plurality of regions and by dynamically controlling each region independently, the dynamic range with respect to the luminance of the color liquid crystal display device can be further enlarged. That is, the planar light-source device is divided into a plurality of regions for each image display frame, and the brightness of the planar light-source device is changed according to an image signal in each region (for example, the luminance of each region of the planar light-source device is changed in proportion to the maximum luminance of the corresponding region of an image). In this case, in a bright region of an image, the corresponding region of the planar light-source device is brightened, while in a dark region of an image, the corresponding region of the planar light-source device is darkened, so that the contrast ratio of the color liquid crystal display device can be significantly improved. Furthermore, the average electrical power consumption can be decreased. In this technique, it is important to decrease color variations between the regions of the planar light source device. In GaN-based semiconductor light-emitting elements, variations easily occur in luminous colors during the manufacture. However, the GaN-based semiconductor light-emitting elements used in Example 6 are the same GaN-based semiconductor light-emitting elements as those described in Examples 1 and 2, and thus a planar light-source device with small variations in luminous colors between the regions can be achieved. Moreover, in addition to the control of the operating current density (or driving current) of the GaN-based semiconductor light-emitting element as the light source, the luminance (brightness) of the GaN-based semiconductor light-emitting element as the light source can be controlled by controlling the pulse width of the driving current and/or the pulse density of the driving current. Therefore, each of a plurality of divided regions can be independently, dynamically controlled more reliably and easily. Specifically, for example, the luminance of each region of the planar light-source device may be controlled by the peak current value of the driving current (operating current), and the luminance may be finely controlled by controlling the pulse width and/or pulse density of the driving current. Alternatively, conversely to this, the luminance of the entire planar light-source device may be controlled by controlling the pulse width and/or pulse density of the driving current, and the luminance may be finely controlled by the peak current value of the driving current (operating current).

Example 7

Figure 25:
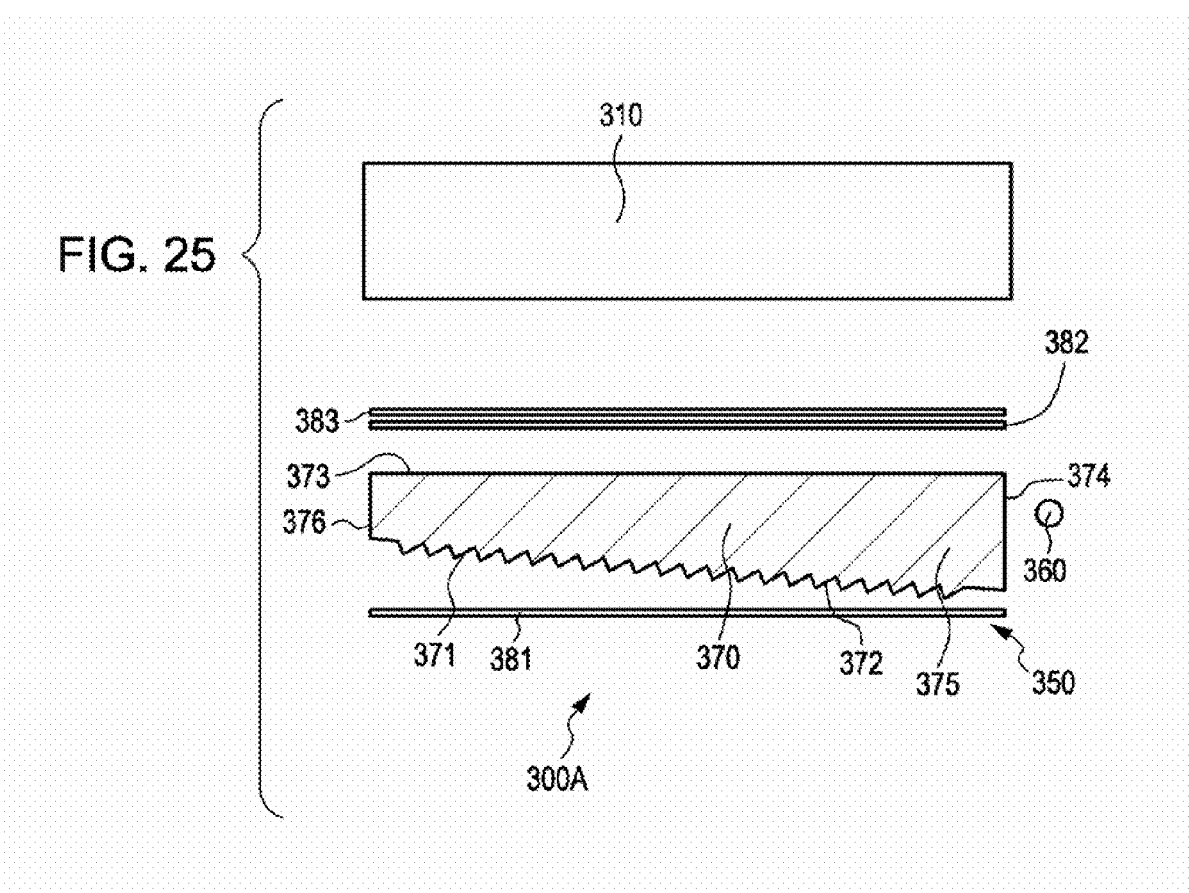
FIG. 25 is a conceptual diagram showing a color liquid crystal display device assembly of Example 7.

Example 7 is a modification of Example 6 Example 6 relates to a direct-type planar light-source device, while Example 7 relates to an edge light-type planar light-source device. FIG. 25 is a conceptual diagram showing a color liquid crystal display device assembly of Example 7. The schematic partial cross-sectional view of the color liquid crystal display device in Example 7 is the same as the schematic partial cross-sectional view shown in FIG. 24.

A color liquid crystal display device assembly 300A of Example 7 includes a transmissive color liquid crystal display device 310 including (a) a front panel 320 having a transparent first electrode 324, (b) a rear panel 330 having a transparent second electrode 334, and (c) a liquid crystal material 327 placed between the front panel 320 and the rear panel 330; and (d) a planar light-source device (edge light-type backlight) 350 which is composed of a light guide plate 370 and a light source 360 and which applies light from the rear panel side to the color liquid crystal display device 310. The light guide plate 370 is disposed so as to face the rear panel 330.

The light source 360 is, for example, composed of a red light-emitting AlGaInP-based semiconductor light-emitting element, a green light-emitting GaN-based semiconductor light-emitting element, and a blue light-emitting GaN-based semiconductor light-emitting element. These semiconductor light-emitting elements are not shown in FIG. 25. As the green light-emitting GaN-based semiconductor light-emitting element and the blue light-emitting GaN-based semiconductor light-emitting element, the same GaN-based semiconductor light-emitting elements as those described in Example 1 or 2 can be used. Furthermore, the front panel 320 and the rear panel 330 constituting the color liquid crystal display device 310 can have the same configurations and structures as the configurations and structures of the front panel 320 and the rear panel 336 of Example 6 described with reference to FIG. 24, and thus the detailed description thereof will be omitted.

The light guide plate 370, for example, composed of a polycarbonate resin, has a first surface (bottom surface) 371, a second surface (top surface) 373 opposite the first surface 371, a first side surface 374, a second side surface 375, a third side surface 376 opposite the first side surface 374, and a fourth side surface opposite the second side surface 375. More specifically, the light guide plate 370 as a whole has a wedge-like, truncated quadrangular pyramid shape. Two opposing side surfaces of the truncated quadrangular pyramid correspond to the first surface 371 and the second surface 373, and the bottom surface of the truncated quadrangular pyramid corresponds to the first side surface 374. The first surface 371 has an irregular portion 372. When the light guide plate 370 is cut along a phantom plane extending in the light-incident direction to the light guide plate 370 and perpendicular to the first surface 371, the cross-sectional shape of the continuously irregular portion is triangular. That is, the irregular portion 372 provided on the first surface 371 is prismatic. The second surface 373 of the light guide plate 370 may be a smooth surface (i.e., mirror surface), or may be provided with blast irregularities having a diffusion effect (i.e., a fine irregular surface). A reflection member 381 is arranged so as to face the first surface 371 of the light guide plate 370. The color liquid crystal display device 310 is arranged so as to face the second surface 373 of the light guide plate 370. Furthermore, a diffuser sheet 382 and a prism sheet 383 are arranged between the color liquid crystal display device 310 and the second surface 373 of the light guide plate 370. Light emitted from the light source 360 enters the light guide plate 370 from the first side surface 374 (e.g., surface corresponding to the bottom surface of the bottom surface of the truncated quadrangular pyramid), is scattered by collision with the irregular portion 372 on the first surface 371, is emitted from the first surface 371, is reflected by the reflection member 381, again enters the first surface 371, is emitted from the second surface 373, passes through the diffuser sheet 382 and the prism sheet 383, and then is applied to the color liquid crystal display device 310.

The present application has been described on the basis of the preferred Examples. However, the present application is not limited to these Examples. The configurations and structures of the GaN-based semiconductor light-emitting elements described in Examples, and the light-emitting element assemblies, light-emitting apparatuses, image display apparatuses, planar light-source devices, or the color liquid crystal display device assemblies having the GaN-based semiconductor light-emitting elements therein are merely exemplification, and the members, materials, and the like constituting these are merely exemplification. These can be altered appropriately. The order of deposition in a GaN-based semiconductor light-emitting element may be reversed. The direct-view-type image display apparatus may be designed to be an image display apparatus in which an image is projected on the human retina. The GaN-based semiconductor light-emitting element may constitute a semiconductor laser.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A GaN-based semiconductor light-emitting element comprising:
   a first GaN-based compound semiconductor layer of n-conductivity type;
   an active layer;
   a second GaN-based compound semiconductor layer of p-conductivity type;
   a first electrode electrically connected to the first GaN-based compound semiconductor layer;
   a second electrode electrically connected to the second GaN-based compound semiconductor layer;
   an impurity diffusion-preventing layer composed of an undoped GaN-based compound semiconductor, the impurity diffusion-preventing layer preventing a p-type impurity from diffusing into the active layer; and
   a laminated structure,
   wherein the impurity diffusion-preventing layer and the laminated structure are disposed, between the active layer and the second GaN-based compound semiconductor layer, in that order from the active layer side; and
   the laminated structure includes at least one laminate unit in which a GaN-based compound semiconductor layer of p-conductivity type and an undoped GaN-based compound semiconductor layer are stacked in that order from the active layer side.

2. The GaN-based semiconductor light-emitting element according to claim 1, wherein the GaN-based compound semiconductor layer of p-conductivity type and the undoped GaN-based compound semiconductor layer constituting the laminate unit have the same composition.

3. The GaN-based semiconductor light-emitting element according to claim 1, wherein the undoped GaN-based compound semiconductor layer constituting the laminate unit includes a GaN-based compound semiconductor layer, the composition of which contains indium.

4. The GaN-based semiconductor light-emitting element according to claim 3, wherein the undoped GaN-based compound semiconductor layer constituting the laminate unit has a three-layer structure including a first layer having the same composition as the GaN-based compound semiconductor layer of p-conductivity type constituting the laminate unit, a second layer having the composition which is the same as the first layer and which further contains indium, and a third layer having the same composition as the first layer.

5. The GaN-based semiconductor light-emitting element according to claim 4, wherein the undoped GaN-based compound semiconductor layer constituting the laminate unit has a three-layer structure including the first layer composed of undoped GaN, the second layer composed of undoped $In_xGa_{(1-x)}N$ (wherein $0<x\leqq0.3$), and the third layer composed of undoped GaN.

6. The GaN-based semiconductor light-emitting element according to claim 5, wherein the active layer includes an $In_yGa_{(1-y)}N$ layer, and $x\leqq y$.

7. The GaN-based semiconductor light-emitting element according to claim 1, wherein the laminated structure includes one to ten laminate units.

8. The GaN-based semiconductor light-emitting element according to claim 1, wherein the GaN-based compound semiconductor layer of p-conductivity type constituting the laminate unit has a p-type impurity concentration of $1\times10^{18}/cm^3$ to $4\times10^{20}/cm^3$.

9. The GaN-based semiconductor light-emitting element according to claim 1, wherein the thickness of the GaN-based compound semiconductor layer of p-conductivity type constituting the laminate unit is in the range of two-atomic-layer thickness to 50 nm, and the thickness of the undoped GaN-based compound semiconductor layer constituting the laminate unit is in the range of two-atomic-layer thickness to 50 nm.

10. The GaN-based semiconductor light-emitting element according to claim 1, wherein the thickness of the laminated structure is in the range of 5 nm to 200 nm.

11. The GaN-based semiconductor light-emitting element according to claim 1, wherein the density of a current applied to the active layer is 50 amperes/cm² or more.

12. The GaN-based semiconductor light-emitting element according to claim 1, wherein the area of the active layer is $1\times10^{-12}$ m² to $1\times10^{-8}$ m².

13. The GaN-based semiconductor light-emitting element according to claim 1, wherein the thickness of the GaN-based semiconductor light-emitting element is $1\times10^{-7}$ m to $1\times10^{-5}$ m.

14. A GaN-based semiconductor light-emitting element comprising:
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a third GaN-based compound semiconductor layer of p-conductivity type,
wherein the impurity diffusion-preventing layer and the third GaN-based compound semiconductor layer are disposed, between the active layer and the second GaN-based compound semiconductor layer, in that order from the active layer side; and
at least one undoped GaN-based compound semiconductor layer is disposed on a side, closer to the second GaN-based compound semiconductor layer, of the third GaN-based compound semiconductor layer.

15. The GaN-based semiconductor light-emitting element according to claim 14, wherein the third GaN-based compound semiconductor layer of p-conductivity type and the undoped GaN-based compound semiconductor layer disposed on the third GaN-based compound semiconductor layer have the same composition.

16. The GaN-based semiconductor light-emitting element according to claim 14, wherein the undoped GaN-based compound semiconductor layer disposed on the third GaN-based compound semiconductor layer includes a GaN-based compound semiconductor layer, the composition of which contains indium.

17. The GaN-based semiconductor light-emitting element according to claim 16, wherein the undoped GaN-based compound semiconductor layer disposed on the third GaN-based compound semiconductor layer has a three-layer structure including a first layer having the same composition as the third GaN-based compound semiconductor layer of p-conductivity type, a second layer having the composition which is the same as the first layer and which further contains indium, and a third layer having the same composition as the first layer.

18. The GaN-based semiconductor light-emitting element according to claim 17, wherein the undoped GaN-based compound semiconductor layer disposed on the third GaN-based compound semiconductor layer has a three-layer structure including the first layer composed of undoped GaN, the second layer composed of undoped $In_xGa_{(1-x)}N$ (wherein $0<x\leqq0.3$), and the third layer composed of undoped GaN.

19. The GaN-based semiconductor light-emitting element according to claim 18, wherein the active layer includes an $In_yGa_{(1-y)}N$ layer, and $x\leqq y$.

20. The GaN-based semiconductor light-emitting element according to claim 14, wherein one to ten undoped GaN-based compound semiconductor layers are disposed on the third GaN-based compound semiconductor layer.

21. The GaN-based semiconductor light-emitting element according to claim 14, wherein the third GaN-based compound semiconductor layer has a p-type impurity concentration of $1\times10^{18}/cm^3$ to $4\times10^{20}/cm^3$.

22. The GaN-based semiconductor light-emitting element according to claim 14, wherein the thickness of the undoped GaN-based compound semiconductor layer disposed on the third GaN-based compound semiconductor layer is in the range of two-atomic-layer thickness to 50 nm, and the thickness of the third GaN-based compound semiconductor layer is in the range of 5 nm to 200 nm.

23. The GaN-based semiconductor light-emitting element according to claim 14, wherein the density of a current applied to the active layer is 50 amperes/cm² or more.

24. The GaN-based semiconductor light-emitting element according to claim 14, wherein the area of the active layer is $1\times10^{-12}$ m² to $1\times10^{-8}$ m².

25. The GaN-based semiconductor light-emitting element according to claim 14, wherein the thickness of the GaN-based semiconductor light-emitting element is $1\times10^{-7}$ m to $1\times10^{-5}$ m.

26. A light-emitting element assembly comprising:
a GaN-based semiconductor light-emitting element disposed on a supporting member, wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a laminated structure,
wherein the impurity diffusion-preventing layer and the laminated structure are disposed, between the active layer and the second GaN-based compound semiconductor layer, in that order from the active layer side; and
the laminated structure includes at least one laminate unit in which a GaN-based compound semiconductor layer of p-conductivity type and an undoped GaN-based compound semiconductor layer are stacked in that order from the active layer side.

27. A light-emitting element assembly comprising:
a GaN-based semiconductor light-emitting element disposed on a supporting member,
wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a third GaN-based compound semiconductor layer of p-conductivity type,
wherein the impurity diffusion-preventing layer and the third GaN-based compound semiconductor layer are disposed, between the active layer and the second GaN-based compound semiconductor layer, in that order from the active layer side; and
at least one undoped GaN-based compound semiconductor layer is disposed on a side, closer to the second GaN-based compound semiconductor layer, of the third GaN-based compound semiconductor layer.

28. A light-emitting apparatus comprising:
a GaN-based semiconductor light-emitting element; and
a color conversion material which is excited by emitted light from the GaN-based semiconductor light-emitting element to emit light with a different wavelength from that of the emitted light,
wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a laminated structure,
wherein the impurity diffusion-preventing layer and the laminated structure are disposed, between the active layer and the second GaN-based compound semiconductor layer, in that order from the active layer side; and
the laminated structure includes at least one laminate unit in which a GaN-based compound semiconductor layer of p-conductivity type and an undoped GaN-based compound semiconductor layer are stacked in that order from the active layer side.

29. A light-emitting apparatus comprising:
a GaN-based semiconductor light-emitting element; and
a color conversion material which is excited by emitted light from the GaN-based semiconductor light-emitting element to emit light with a different wavelength from that of the emitted light,
wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a third GaN-based compound semiconductor layer of p-conductivity type,
wherein the impurity diffusion-preventing layer and the third GaN-based compound semiconductor layer are disposed, between the active layer and the second GaN-based compound semiconductor layer, in that order from the active layer side; and
at least one undoped GaN-based compound semiconductor layer is disposed on a side, closer to the second GaN-based compound semiconductor layer, of the third GaN-based compound semiconductor layer.

30. A method of manufacturing a GaN-based semiconductor light-emitting element which includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and a laminated structure, wherein the impurity diffusion-preventing layer and the laminated structure are disposed, between the active layer and the second GaN-based compound semiconductor layer, in that order from the active layer side, the laminated structure includes at least one laminate unit in which a GaN-based compound semiconductor layer of p-conductivity type and an undoped GaN-based compound semiconductor layer are stacked in that order from the active layer side, the undoped GaN-based compound semiconductor layer constituting the laminate unit includes a GaN-based compound semiconductor layer, the composition of which contains indium, and the active layer includes a GaN-based compound semiconductor layer, the composition of which contains indium, the method comprising:

sequentially forming the first GaN-based compound semiconductor layer, the active layer, the impurity diffusion-preventing layer, the laminated structure, and the second GaN-based compound semiconductor layer, wherein the GaN-based compound semiconductor layer, the composition of which contains indium, in the undoped GaN-based compound semiconductor layer constituting the laminate unit is formed at a higher temperature than the temperature at which the GaN-based compound semiconductor layer, the composition of which contains indium, in the active layer is formed.

31. A method of manufacturing a GaN-based semiconductor light-emitting element which includes a first GaN-based compound semiconductor layer of n-conductivity type;

an active layer;

a second GaN-based compound semiconductor layer of p-conductivity type;

a first electrode electrically connected to the first GaN-based compound semiconductor layer;

a second electrode electrically connected to the second GaN-based compound semiconductor layer;

an impurity diffusion-preventing layer composed of an undoped GaN-based compound semiconductor, the impurity diffusion-preventing layer preventing a p-type impurity from diffusing into the active layer; and a third GaN-based compound semiconductor layer of p-conductivity type, wherein the impurity diffusion-preventing layer and the third GaN-based compound semiconductor layer are disposed, between the active layer and the second GaN-based compound semiconductor layer, in that order from the active layer side, at least one undoped GaN-based compound semiconductor layer is disposed on a side, closer to the second GaN-based compound semiconductor layer, of the third GaN-based compound semiconductor layer, the undoped GaN-based compound semiconductor layer disposed on the third GaN-based compound semiconductor layer includes a GaN-based compound semiconductor layer, the composition of which contains indium, and the active layer includes a GaN-based compound semiconductor layer, the composition of which contains indium, the method comprising:

sequentially forming the first GaN-based compound semiconductor layer, the active layer, the impurity diffusion-preventing layer, the third GaN-based compound semiconductor layer, and the second GaN-based compound semiconductor layer, wherein the GaN-based compound semiconductor layer, the composition of which contains indium, in the undoped GaN-based compound semiconductor layer disposed on the third GaN-based compound semiconductor layer is formed at a higher temperature than the temperature at which the GaN-based compound semiconductor layer, the composition of which contains indium, in the active layer is formed.

32. A method of driving a GaN-based semiconductor light-emitting element which includes a first GaN-based compound semiconductor layer of n-conductivity type;

an active layer;

a second GaN-based compound semiconductor layer of p-conductivity type;

a first electrode electrically connected to the first GaN-based compound semiconductor layer;

a second electrode electrically connected to the second GaN-based compound semiconductor layer;

an impurity diffusion-preventing layer composed of an undoped GaN-based compound semiconductor, the impurity diffusion-preventing layer preventing a p-type impurity from diffusing into the active layer; and a laminated structure, wherein the impurity diffusion-preventing layer and the laminated structure are disposed, between the active layer and the second GaN-based compound semiconductor layer, in that order from the active layer side, and the laminated structure includes at least one laminate unit in which a GaN-based compound semiconductor layer of p-conductivity type and an undoped GaN-based compound semiconductor layer are stacked in that order from the active layer side, the method comprising:

applying a current with a current density of 50 amperes/$cm^2$ or more to the active layer.

33. A method of driving a GaN-based semiconductor light-emitting element which includes a first GaN-based compound semiconductor layer of n-conductivity type;

an active layer;

a second GaN-based compound semiconductor layer of p-conductivity type;

a first electrode electrically connected to the first GaN-based compound semiconductor layer;

a second electrode electrically connected to the second GaN-based compound semiconductor layer;

an impurity diffusion-preventing layer composed of an undoped GaN-based compound semiconductor, the impurity diffusion-preventing layer preventing a p-type impurity from diffusing into the active layer; and a third GaN-based compound semiconductor layer of p-conductivity type, wherein the impurity diffusion-preventing layer and the third GaN-based compound semiconductor layer are disposed, between the active layer and the second GaN-based compound semiconductor layer, in that order from the active layer side, and at least one undoped GaN-based compound semiconductor layer is disposed on a side, closer to the second GaN-based compound semiconductor layer, of the third GaN-based compound semiconductor layer, the method comprising:

applying a current with a current density of 50 amperes/$cm^2$ or more to the active layer.

34. An image display apparatus comprising a GaN-based semiconductor light-emitting element for displaying an image,
wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a laminated structure,
wherein the impurity diffusion-preventing layer and the laminated structure are disposed, between the active layer and the second GaN-based compound semiconductor layer, in that order from the active layer side, and
the laminated structure includes at least one laminate unit in which a GaN-based compound semiconductor layer of p-conductivity type and an undoped GaN-based compound semiconductor layer are stacked in that order from the active layer side.

35. An image display apparatus comprising a GaN-based semiconductor light-emitting element for displaying an image,
wherein the GaN-based semiconductor light-emitting element includes
a first GaN-based compound semiconductor layer of n-conductivity type;
an active layer;
a second GaN-based compound semiconductor layer of p-conductivity type;
a first electrode electrically connected to the first GaN-based compound semiconductor layer;
a second electrode electrically connected to the second GaN-based compound semiconductor layer;
an impurity diffusion-preventing layer composed of an undoped GaN-based compound semiconductor, the impurity diffusion-preventing layer preventing a p-type impurity from diffusing into the active layer; and
a third GaN-based compound semiconductor layer of p-conductivity type,
wherein the impurity diffusion-preventing layer and the third GaN-based compound semiconductor layer are disposed, between the active layer and the second GaN-based compound semiconductor layer, in that order from the active layer side,
at least one undoped GaN-based compound semiconductor layer is disposed on a side, closer to the second GaN-based compound semiconductor layer, of the third GaN-based compound semiconductor layer.

* * * * *